United States Patent
Jiang et al.

(10) Patent No.: US 10,473,271 B2
(45) Date of Patent: Nov. 12, 2019

(54) LED FILAMENT MODULE AND LED LIGHT BULB

(71) Applicant: ZHEJIANG SUPER LIGHTING ELECTRIC APPLIANCE CO., LTD., Zhejiang (CN)

(72) Inventors: Tao Jiang, Zhejiang (CN); Liqin Li, Zhejiang (CN); Heping Fei, Zhejiang (CN); Wentao Yao, Zhejiang (CN); Lvhui Zhou, Zhejiang (CN); Cheng Wang, Zhejiang (CN); Jin Wang, Zhejiang (CN)

(73) Assignee: ZHEJIANG SUPER LIGHTING ELECTRIC APPLIANCE CO., LTD., Zhejiang (CN)

(*) Notice: Subject to any disclaimer, the term of this patent is extended or adjusted under 35 U.S.C. 154(b) by 133 days.

(21) Appl. No.: 15/366,535

(22) Filed: Dec. 1, 2016

(65) Prior Publication Data

US 2017/0084809 A1    Mar. 23, 2017

Related U.S. Application Data

(63) Continuation-in-part of application No. 15/237,983, filed on Aug. 16, 2016.

(30) Foreign Application Priority Data

Aug. 17, 2015   (CN) .......................... 2015 1 0502630
Dec. 19, 2015   (CN) .......................... 2015 1 0966906
(Continued)

(51) Int. Cl.
*F21K 9/232*    (2016.01)
*F21V 3/02*    (2006.01)
(Continued)

(52) U.S. Cl.
CPC .............. *F21K 9/232* (2016.08); *F21K 9/238* (2016.08); *F21V 3/02* (2013.01); *H01L 25/0753* (2013.01);
(Continued)

(58) Field of Classification Search
CPC ....................................................... F21K 9/232
See application file for complete search history.

(56) References Cited

U.S. PATENT DOCUMENTS 8,455,895 B2    6/2013  Chai et al.
8,933,619 B1    1/2015  Ou
(Continued)

FOREIGN PATENT DOCUMENTS

CN    101834263    9/2010
CN    102364710    2/2012
(Continued)

*Primary Examiner* — Sean P Gramling
(74) *Attorney, Agent, or Firm* — Andrew M. Calderon; Roberts Mlotkowski Safran Cole & Calderon, P.C.

(57) ABSTRACT

An LED filament module and an LED light bulb are disclosed. The LED filament module includes one or more LED filaments, a first connecting portion, and a second connecting portion. The LED filaments are spaced from each other. Each of the LED filaments includes a first conductive electrode and a second conductive electrode opposite to the first conductive electrode. The first connecting portion is connected with the first conductive electrodes. The second connecting portion is connected with the second conductive electrodes. The LED filament module has a first type. The LED filaments, the first connecting portion, and the second connecting portion of the first type are in a three dimensional form. One or two between the first connecting portion and the second connecting portion of the first type has a torus shape.

42 Claims, 40 Drawing Sheets

(30) Foreign Application Priority Data

| Jan. 22, 2016 | (CN) | 2016 1 0041667 |
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |

(51) Int. Cl.

| F21K 9/238 | (2016.01) |
| H01L 25/075 | (2006.01) |
| H01L 33/62 | (2010.01) |
| H01L 33/50 | (2010.01) |
| H01L 33/56 | (2010.01) |
| F21Y 115/10 | (2016.01) |
| F21V 3/06 | (2018.01) |
| F21K 9/90 | (2016.01) |
| F21V 19/00 | (2006.01) |
| F21Y 103/33 | (2016.01) |
| F21Y 103/37 | (2016.01) |
| F21Y 107/00 | (2016.01) |
| H01L 33/54 | (2010.01) |

(52) U.S. Cl.

CPC .......... *H01L 33/502* (2013.01); *H01L 33/56* (2013.01); *H01L 33/62* (2013.01); *F21K 9/90* (2013.01); *F21V 3/061* (2018.02); *F21V 3/062* (2018.02); *F21V 19/003* (2013.01); *F21Y 2103/33* (2016.08); *F21Y 2103/37* (2016.08); *F21Y 2107/00* (2016.08); *F21Y 2115/10* (2016.08); *H01L 33/50* (2013.01); *H01L 33/54* (2013.01); *H01L 2224/45014* (2013.01); *H01L 2224/48137* (2013.01)

(56) References Cited

U.S. PATENT DOCUMENTS

| 9,016,900 | B2 | 4/2015 | Takeuchi et al. |
| D761,216 | S | 7/2016 | Jiang |
| 9,447,929 | B2 | 9/2016 | Jiang |
| D768,891 | S | 10/2016 | Jiang et al. |
| 9,761,765 | B2 | 9/2017 | Basin et al. |
| 9,982,854 | B2 | 5/2018 | Ma et al. |
| 2013/0058080 | A1* | 3/2013 | Ge .............. F21V 3/00 362/231 |
| 2013/0235592 | A1 | 9/2013 | Takeuchi et al. |
| 2013/0293098 | A1 | 11/2013 | Li et al. |
| 2014/0268779 | A1 | 9/2014 | Sorensen et al. |
| 2014/0369036 | A1 | 12/2014 | Feng |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0091147 | A1 | 3/2016 | Jiang et al. |
| 2016/0091156 | A1 | 3/2016 | Li et al. |
| 2016/0091179 | A1 | 3/2016 | Jiang et al. |
| 2016/0102813 | A1 | 4/2016 | Ye et al. |
| 2016/0178135 | A1 | 6/2016 | Xu et al. |
| 2016/0178137 | A1 | 6/2016 | Jiang |
| 2016/0178138 | A1 | 6/2016 | Jiang |
| 2016/0198535 | A1 | 7/2016 | Ye et al. |
| 2016/0212809 | A1 | 7/2016 | Xiong et al. |
| 2016/0215936 | A1 | 7/2016 | Jiang |
| 2016/0215937 | A1 | 7/2016 | Jiang |
| 2016/0219658 | A1 | 7/2016 | Xiong et al. |
| 2016/0219666 | A1 | 7/2016 | Xiong et al. |
| 2016/0219672 | A1 | 7/2016 | Liu |
| 2016/0223180 | A1 | 8/2016 | Jiang |
| 2016/0223182 | A1 | 8/2016 | Jiang |
| 2016/0229621 | A1 | 8/2016 | Jiang |
| 2016/0255694 | A1 | 9/2016 | Jiang et al. |
| 2016/0255699 | A1 | 9/2016 | Ye et al. |
| 2016/0270163 | A1 | 9/2016 | Hu et al. |
| 2016/0270164 | A1 | 9/2016 | Xiong et al. |
| 2016/0270165 | A1 | 9/2016 | Xiong et al. |
| 2016/0270166 | A1 | 9/2016 | Xiong et al. |
| 2016/0270173 | A1 | 9/2016 | Xiong |
| 2016/0270184 | A1 | 9/2016 | Xiong et al. |
| 2016/0290566 | A1 | 10/2016 | Jiang et al. |
| 2016/0290567 | A1 | 10/2016 | Jiang et al. |
| 2016/0290568 | A1 | 10/2016 | Jiang et al. |
| 2016/0290569 | A1 | 10/2016 | Jiang et al. |
| 2016/0290570 | A1 | 10/2016 | Jiang et al. |
| 2016/0290598 | A1 | 10/2016 | Jiang |
| 2016/0290609 | A1 | 10/2016 | Jiang et al. |
| 2016/0295706 | A1 | 10/2016 | Jiang |
| 2016/0309550 | A1 | 10/2016 | Xiong et al. |
| 2016/0323948 | A1 | 11/2016 | Xiong et al. |
| 2016/0363267 | A1 | 12/2016 | Jiang et al. |
| 2017/0012177 | A1 | 1/2017 | Trottier |
| 2017/0051878 | A1 | 2/2017 | Jiang et al. |
| 2017/0130906 | A1 | 5/2017 | Jiang et al. |

FOREIGN PATENT DOCUMENTS

| CN | 202252991 | | 5/2012 |
| CN | 202252991 | U | 5/2012 |
| CN | 102751274 | | 10/2012 |
| CN | 102751274 | A | 10/2012 |
| CN | 103123949 | | 5/2013 |
| CN | 103123949 | A | 5/2013 |
| CN | 203240337 | U | 10/2013 |
| CN | 203367275 | | 12/2013 |
| CN | 203367275 | U | 12/2013 |
| CN | 203384716 | U | 1/2014 |
| CN | 203413396 | U | 1/2014 |
| CN | 103560128 | | 2/2014 |
| CN | 103560128 | A | 2/2014 |
| CN | 203453866 | U | 2/2014 |
| CN | 203585876 | U | 5/2014 |
| CN | 203628391 | | 6/2014 |
| CN | 203628391 | U | 6/2014 |
| CN | 103939758 | | 7/2014 |
| CN | 103939758 | A | 7/2014 |
| CN | 103956421 | A | 7/2014 |
| CN | 103972364 | | 8/2014 |
| CN | 103972364 | A | 8/2014 |
| CN | 103994349 | | 8/2014 |
| CN | 103994349 | A | 8/2014 |
| CN | 104319345 | | 1/2015 |
| CN | 104319345 | A | 1/2015 |
| CN | 204083941 | | 1/2015 |
| CN | 204083941 | U | 1/2015 |
| CN | 104456165 | | 3/2015 |
| CN | 104456165 | A | 3/2015 |
| CN | 204289439 | | 4/2015 |
| CN | 204289439 | U | 4/2015 |
| CN | 104600174 | | 5/2015 |
| CN | 104600174 | A | 5/2015 |
| CN | 204387765 | | 6/2015 |
| CN | 204387765 | U | 6/2015 |
| CN | 204678100 | | 9/2015 |
| CN | 105098032 | A | 11/2015 |
| CN | 105140381 | | 12/2015 |
| CN | 105140381 | A | 12/2015 |
| CN | 105161608 | | 12/2015 |
| CN | 105161608 | A | 12/2015 |
| CN | 105371243 | | 3/2016 |
| CN | 105371243 | A | 3/2016 |
| CN | 105609621 | | 5/2016 |
| CN | 105609621 | A | 5/2016 |
| CN | 206973307 | U | 2/2018 |
| CN | 207034659 | U | 2/2018 |
| CN | 108039402 | A | 5/2018 |
| CN | 105090782 | B | 7/2018 |
| EP | 2567145 | A1 | 3/2013 |
| EP | 2760057 | | 7/2014 |
| EP | 2760057 | A1 | 7/2014 |
| GB | 2547085 | A | 8/2017 |
| JP | 3075689 | | 2/2001 |

(56) References Cited

FOREIGN PATENT DOCUMENTS

| | | |
|---|---|---|
| JP | 3075689 U | 2/2001 |
| JP | 2013225587 A | 10/2013 |
| WO | 2011137662 | 11/2011 |
| WO | 2014167458 | 10/2014 |
| WO | 2014167458 A1 | 10/2014 |
| WO | 2017037010 | 3/2017 |
| WO | 2017037010 A1 | 3/2017 |

\* cited by examiner

LED FILAMENT MODULE AND LED LIGHT BULB

CROSS-REFERENCE TO RELATED APPLICATIONS

This application is a continuation-in-part (CIP) of application Ser. No. 15/237,983, filed on Aug. 16, 2016, and claiming the following Chinese Patent Applications No. CN 201510502630.3 filed on Aug. 17, 2015, CN 201510966906.3 filed on Dec. 19, 2015 CN 201610041667.5 filed on Jan. 22, 2016, CN 201610272153.0 filed on Apr. 4, 2016, CN 201610281600.9 filed on Apr. 29, 2016, CN 201610394610.3 field on Jun. 3, 2016, CN 201610586388.7 filed on Jul. 22, 2016, CN 201610544049.2 filed on Jul. 7, 2016 and CN 201610936171.4 filed on Nov. 1, 2016, the disclosures of which are incorporated herein in their entirety by reference.

TECHNICAL FIELD

The instant disclosure relates to illumination field, and more particularly, to an LED filament module, an LED light bulb, and a method for shaping the LED filament module.

RELATED ART

The LED has advantages of environmental protection, energy saving, high efficiency and long lifespan, and therefore it attracts widespread attention in recent years and gradually replaces traditional lighting lamps. However, due that the luminescence of the LED has directivity, current LED lamps is unable to provide with an illumination with a wide angle range like traditional lamps. Accordingly, how to design LED lamps with similar wide range for illumination to the traditional lamps challenges the industries.

U.S. patent application No. 20130058080A1 discloses an LED light bulb and an LED light-emitting strip capable of emitting 4π light. The LED light bulb comprises an LED light bulb shell, a core column with an exhaust tube and a bracket, at least one LED light emitting strip with LED chips therein emitting 4π light, a driver, and an electrical connector. The LED light bulb shell is vacuum sealed with the core column so as to form a vacuum sealed chamber. The vacuum sealed chamber is filled with a gas having a low coefficient of viscosity and a high coefficient of thermal conductivity. The bracket and the LED light emitting strips fixed on the bracket are housed in the vacuum sealed chamber. The LED light emitting strip is in turn electrically connected to the driver, the electrical connector, while the electrical connector is used to be electrically connected to an external power supply, so as to light the LED light emitting strips.

A kind of LED light bulbs includes several LED filaments inside. The LED filaments are around a stand. Two conductive electrodes of each of the LED filaments are respectively connected to a top side and a bottom side of the stand via two supporting arms in a spot soldering manner. Joints between each conductive electrode and each corresponding supporting arm have to be soldered one by one. It takes much time to assemble the LED filaments. Under strictly requirements of sizes and properties of materials, the joints may be faulty soldered. Assembling so many LED filaments into one LED light bulbs is a complex and difficult procedure, too. Additionally, the supporting arms fixed to the stand are connected to each other. There is a risk of an electrocorrosion regarding the supporting arms.

SUMMARY

To address the issues, the instant disclosure provides with embodiments of an LED filament module, an LED light bulb utilizing the LED filament module, and a method for shaping the LED filament module.

According to an embodiment, an LED filament module comprises a plurality of LED filaments, a first connecting portion, and a second connecting portion. The LED filaments are spaced from each other. Each of the LED filaments comprises a first conductive electrode and a second conductive electrode opposite to the first conductive electrode. The first connecting portion is connected with the first conductive electrodes. The second connecting portion is connected with the second conductive electrodes. The LED filament module has a first type. The LED filaments, the first connecting portion, and the second connecting portion of the first type are in a three dimensional form. At least one between the first connecting portion and the second connecting portion of the first type has a torus shape.

According to an embodiment, an LED light bulb comprises a bulb shell, a bulb base, at least one stem, an LED filament module, and two conductive supports. The bulb base is connected with the bulb shell. The stem is in the bulb shell and connected with the bulb base. The two conductive supports are electrically connected to and extend from the base. The LED filament module comprises a first connecting portion, a second connecting portion, and a plurality of LED filaments. The first connecting portion and the second connecting portion are connected with the conductive supports respectively. At least one of the first connecting portion and the second connecting portion has a shape surrounding the center axle of the bulb base. The two ends of each of the LED filaments connected with the first connecting portion and the second connecting portion respectively.

According to embodiments, the LED filament module is easy to be manufactured. The conductive electrodes of the LED filaments can be easily soldered with the first and the second connecting portion on a two-dimension plane in advance. Because the conductive electrodes are easier to be soldered with the first and the second connecting portion, the issue of faulty soldered joints gets improved. The assembling process of the LED light bulb including several LED filaments inside is simplified and, consequently, takes less time, since the LED filaments are integrated into one-piece LED filament module. Further, the supporting arms may be not electrically connected to each other, which avoid the risk of the electrocorrosion. The LED filament module in the LED light bulb may be easily formed a circuit loop to avoid short circuit in a circuit-arrangement manner or in a mechanic-arrangement manner. The LED light bulb with the LED filament module may meet the needs of omnidirectional illumination and partial emphasized illumination based upon the arrangement of the LED filaments.

DETAILED DESCRIPTION

Figure 1:
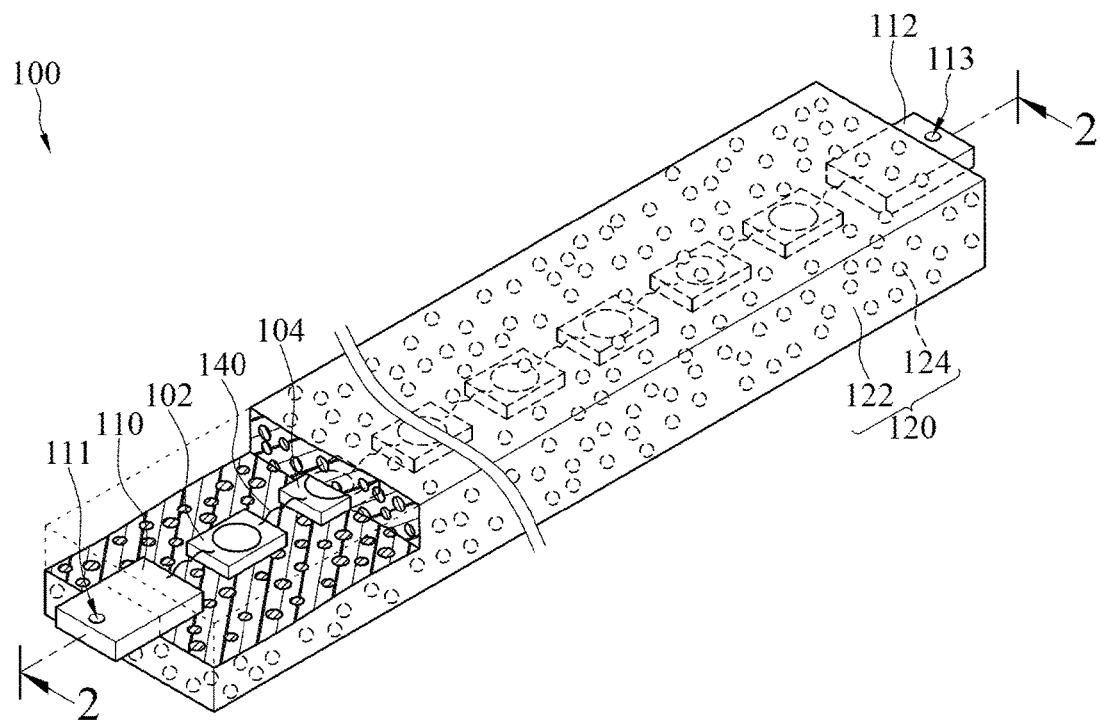
FIG. 1 illustrates a perspective view of an LED light bulb with partial sectional view according to a first embodiment of the LED filament.

The instant disclosure provides an LED filament and an LED light bulb to solve the abovementioned problems. The instant disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

The following description with reference to the accompanying drawings is provided to explain the exemplary embodiments of the disclosure. Note that in the case of no conflict, the embodiments of the present disclosure and the features of the embodiments may be arbitrarily combined with each other.

As indicated in the section of the cross-reference, the instant disclosure claims priority of several Chinese patent applications, and the disclosures of which are incorporated herein in their entirety by reference. When it comes to claim construction, the claims, specification, and prosecution history of the instant disclosure controls if any inconsistency between the instant disclosure and the incorporated disclosures exists.

Figure 2:
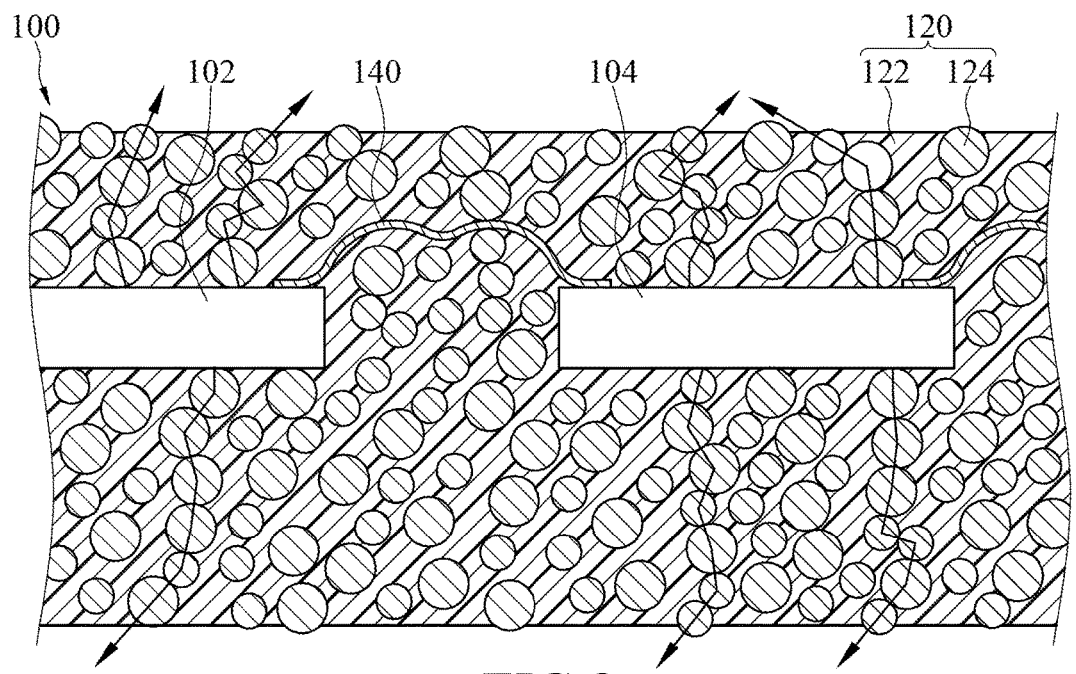
FIG. 2 illustrates a partial cross-sectional view at section 2-2 of FIG. 1.

Please refer to FIGS. 1 and 2. FIG. 1 illustrates a perspective view of an LED filament with partial sectional view according to a first embodiment of the present disclosure while FIG. 2 illustrates a partial cross-sectional view at section 2-2 of FIG. 1. According to the first embodiment, the LED filament 100 comprises a plurality of LED chips 102, 104, at least two conductive electrodes 110, 112, and a light conversion coating 120. The conductive electrodes 110, 112 are disposed corresponding to the plurality of LED chips 102, 104. The LED chips 102, 104 are electrically connected together. The conductive electrodes 110, 112 are electrically connected with the plurality of LED chips 102, 104. The light conversion coating 120 coats on at least two sides of the LED chips 102, 104 and the conductive electrodes 110, 112. The light conversion coating 120 exposes a portion of two of the conductive electrodes 110, 112. The light conversion coating 120 comprises an adhesive 122 and a plurality of phosphors 124.

LED filament 100 emits light while the conductive electrodes 110, 112 are applied with electrical power (electrical current sources or electrical voltage sources). In this embodiment, the light emitted from the LED filament 100 is substantially close to 360 degrees light like that from a point light source. An LED light bulb 10a, 10b, illustrated is in FIGS. 12A and 12B, utilizing the LED filament 100 is capable of emitting omnidirectional light, which will be described in detailed in the followings.

As illustrated in the FIG. 1, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. The outline of the LED chip 102, 104 may be, but not limited to, a strip shape. The number of the LED chips 102, 104 having strip shapes of the LED filament 100 could be less, and, correspondingly the number of the electrodes of the LED chips 102, 104 is less, which can improve the illuminating efficiency since the electrodes may shield the illumination of the LED chip, thereby affecting the illumination efficiency. In addition, the LED chips 102, 104 may be coated on their surfaces with a conductive and transparent layer of Indium Tim Oxide (ITO). The metal oxide layer contributes to uniform distribution of the current diffusion and to increase of illumination efficiency. Specifically, the aspect ratio of the LED chip may be 2:1 to 10:1; for example, but not limited to, 14×28 or 10×20. Further, the LED chips 102, 104 may be high power LED dies and are operated at low electrical current to provide sufficient illumination but less heat.

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 110, 112, in this embodiment, may be shown in FIG. 1. The LED chips 102, 104 are connected in series and the conductive electrodes 110, 112 are disposed on and electrically and respectively connected with the two ends of the series-connected LED chips 102, 104. However, the connections between the LED chips 102, 104 are not limited to that in FIG. 1. Alternatively, the connections may be that two adjacent LED chips 102, 104 are connected in parallel and then the parallel-connected pairs are connected in series.

Figure 3A:
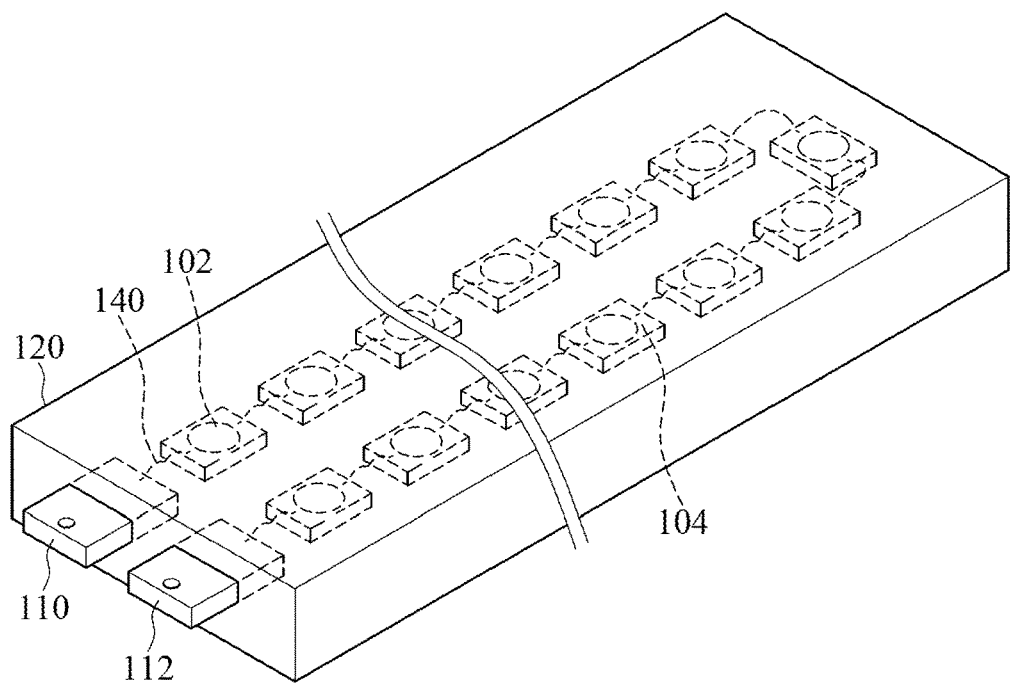
FIGS. 3A and 3B illustrate disposition of the metal electrodes and the plurality of LED chips according to other embodiments of the LED filament.
Figure 3B:
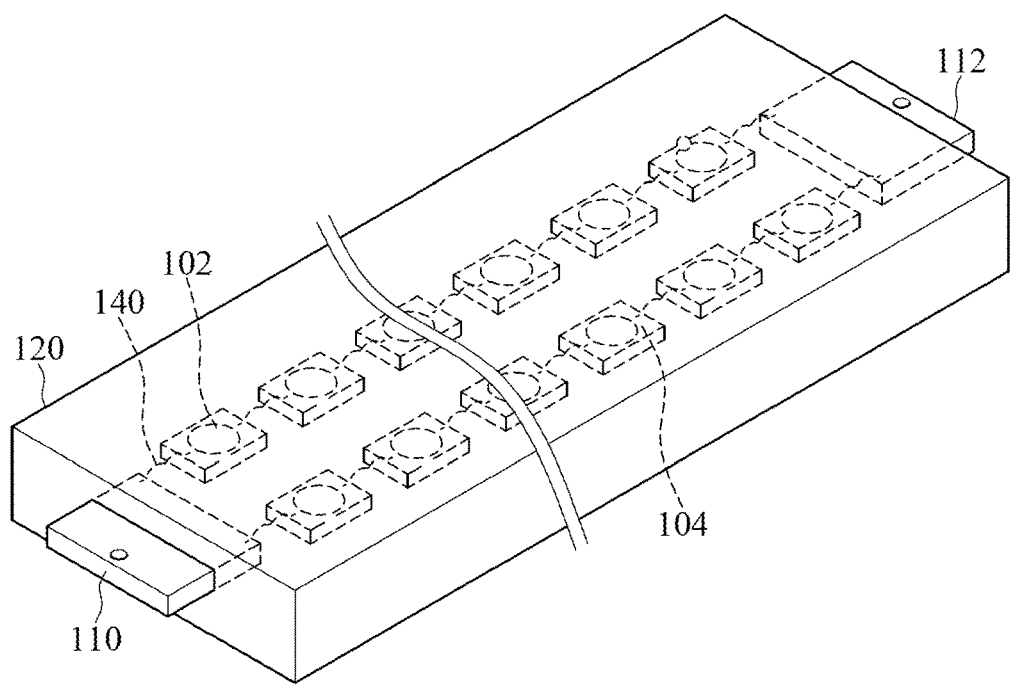

According to this embodiment, the conductive electrodes 110, 112 may be, but not limited to, metal electrodes. The conductive electrodes 110, 112 are disposed at two ends of the series-connected LED chips 102, 104 and a portion of each of the conductive electrodes 110, 112 are exposed out of the light conversion coating 120. The arrangement of the conductive electrodes 110, 112 is not limited to the aforementioned embodiment. Please refer to FIGS. 3A and 3B which illustrate disposition of metal electrodes and a plurality of LED chips according to other embodiments of the LED filament. In the embodiment of FIG. 3A, the LED chips 102, 104 are connected in series and the two ends of the series-connected LED chips 102, 104 are positioned at the same side of the LED filament 100 to form an U shape. Accordingly, the two conductive electrodes 110, 112 are positioned at the same side as the ends of the series-connected LED chips 102, 104. According to the embodiment of FIG. 3B, the LED chips 102, 104 are disposed along two parallel LED strips and the LED chips 102, 104 along the same LED strip are connected in series. Two conductive electrodes 110, 112 are disposed at two ends of the two parallel and series-connected LED chips 102, 104 and electrically connected to each of ends of the series-connected LED chips 102, 104. In this embodiment of FIG. 3B, there are, but not limited to, only two conductive electrodes 110, 112. For examples, the LED filament 100, in practices, may comprise four sub-electrodes. The four sub-electrodes are connected to four ends of the series-connected LED chips 102, 104, respectively. The sub-electrodes may be connected to anode and ground as desired. Alternatively, one of two conductive electrodes 110, 112 may be replaced with two sub-electrodes, depending upon the design needs.

Figure 12A:
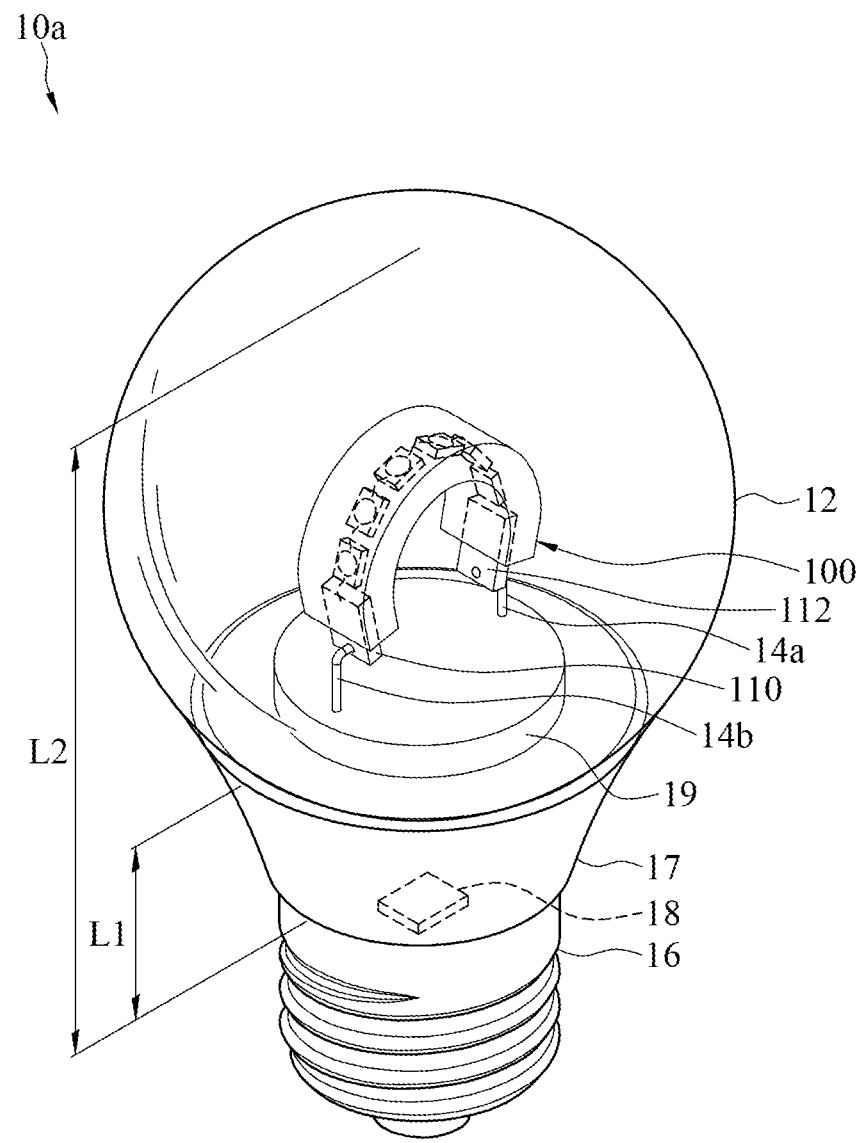
FIGS. 12A and 12B illustrate a perspective view of an LED light bulb according to a first and a second embodiments of the present disclosure.

Please further refer to FIG. 12A. The conductive electrodes 110, 112 has through holes 111, 113 (shown in FIG. 1) on the exposed portion for being connected with the conductive supports 14a, 14b of the LED light bulb 10a.

Please refer to FIGS. 1 and 2 again. According to this embodiment, the LED filament 100 further comprises conductive wires 140 for electrically connecting the adjacent LED chips 102, 104 and conductive electrodes 110, 112. The conductive wires 140 may be gold wires formed by a wire bond of the LED package process, like Q-type. According to FIG. 2, the conductive wires 140 are of M shape. The M shape here is not to describe that the shape of the conductive wires 140 exactly looks like letter M, but to describe a shape which prevents the wires from being tight and provides buffers when the conductive wires 140 or the LED filament 100 is stretched or bended. Specifically, the M shape may be any shape formed by a conductive wire 140 whose length is longer than the length of a wire which naturally arched between two adjacent LED chips 102, 104. The M shape includes any shape which could provide buffers while the conductive wires 104 are bended or stretched; for example, S shape.

The light conversion coating 120 comprises adhesive 122 and phosphors 124. The light conversion coating 120 may, in this embodiment, wrap or encapsulate the LED chips 102, 104 and the conductive electrodes 110, 112. In other words, in this embodiment, each of six sides of the LED chips 102, 104 is coated with the light conversion coating 120; preferably, but not limited to, is in direct contact with the light conversion coating 120. However, at least two sides of the LED chips 102, 104 may be coated with the light conversion coating 120. Preferably, the light conversion coating 120 may directly contact at least two sides of the LED chips 102, 104. The two directly-contacted sides may be the major surfaces which the LED chips emit light. Referring to FIG. 1, the major two surfaces may be the top and the bottom surfaces. In other words, the light conversion coating 120 may directly contact the top and the bottom surfaces of the LED chips 102, 104 (upper and lower surfaces of the LED chips 102, 104 shown in FIG. 2). Said contact between each of six sides of the LED chips 102, 104 and the light conversion coating 120 may be that the light conversion coating 120 directly or indirectly contacts at least a portion of each side of the LED chips 102, 104. Specifically, one or two sides of the LED chips 102, 104 may be in contact with the light conversion coating 120 through die bond glue. In some embodiments, the die bond glue may be mixed with phosphors to increase efficiency of light conversion. The die bond glue may be silica gel or silicone resin mixed with silver powder or heat dissipating powder to increase effect of heat dissipation thereof. The adhesive 122 may be silica gel. In addition, the silica gel may be partially or totally replaced with polyimide or resin materials (e.g., silicone resin) to improve the toughness of the light conversion coating 120 and to reduce possibility of cracking or embrittlement.

The phosphors 124 of the light conversion coating 120 absorb some form of radiation to emit light. For instance, the phosphors 124 absorb light with shorter wavelength and then emit light with longer wavelength. In one embodiment, the phosphors 124 absorb blue light and then emit yellow light. The blue light which is not absorbed by the phosphors 124 mixes with the yellow light to form white light. According to the embodiment where six sides of the LED chips 102, 104 are coated with the light conversion coating 120, the phosphors 124 absorb light with shorter wavelength out of each of the sides of the LED chips 102, 104 and emit light with longer wavelength. The mixed light (longer and shorter wavelength) is emitted from the outer surface of the light conversion coating 120 which surrounds the LED chips 102, 104 to form the main body of the LED filament 100. In other words, each of sides of the LED filament 100 emits the mixed light.

The light conversion coating 120 may expose a portion of two of the conductive electrodes 110, 112. Phosphors 124 is harder than the adhesive 122. The size of the phosphors 124 may be 1 to 30 um (micrometer) or 5 to 20 um. The size of the same phosphors 124 are generally the same. In FIG. 2, the reason why the cross-sectional sizes of the phosphors 124 are different is the positions of the cross-section for the phosphors 124 are different. The adhesive 122 may be transparent, for example, epoxy resin, modified resin or silica gel, and so on.

The composition ratio of the phosphors 124 to the adhesive 122 may be 1:1 to 99:1, or 1:1 to 50:1. The composition ratio may be volume ratio or weight ratio. Please refer to FIG. 2 again. The amount of the phosphors 124 is greater than the adhesive 122 to increase the density of the phosphors 124 and to increase direct contacts among phosphors 124. The arrow lines on FIG. 2 show thermal conduction paths from LED chips 102, 104 to the outer surfaces of the LED filament 100. The thermal conduction paths are formed by the adjacent and contacted phosphors. The more direct contacts among the phosphors 124, the more thermal conduction paths forms, the greater the heat dissipating effect the LED filament 100 has, and the less the light conversion coating becomes yellow. Additionally, the light conversion rate of the phosphors 124 may reach 30% to 70% and the total luminance efficiency of the LED light bulb 10a, 10b is increased. Further, the hardness of the LED filament 100 is increased, too. Accordingly, the LED filament 100 may stand alone without any embedded supporting component like rigid substrates. Furthermore, the surfaces of cured LED filament 100 are not flat due to the protrusion of some of the phosphors 124. In other words, the roughness of the surfaces and the total surface area are increased. The increased roughness of the surfaces improves the amount of light passing the surfaces. The increased surface area enhances the heat dissipating effect. As a result, the overall luminance efficiency of the LED light filament 100 is raised.

Next, LED chips 102, 104 may comprise LED dies which emit blue light. The phosphors 124 may be yellow phosphors (for example Garnet series phosphors, YAG phosphors), so that the LED filament 100 may emit white light. In practices, the composition ratio of phosphors 124 to the adhesive 122 may be adjusted to make the spectrum of the white light emitted from the LED filament 100 closer to that emitted from incandescent bulbs. Alternatively, the phosphors 124 may be powders which absorb blue light (light with shorter wavelength) and emit yellow green light (hereinafter referred to yellow green powders) or emit red light (hereinafter referred to red powders) (light with longer wavelength). The light conversion coating 120 may comprise less red powders and more yellow green powders, so that the CCT (corrected color temperature) of the light emitted from the LED filament 100 may close to 2,400 to 2,600 K (incandescent light).

As mention above, a desired deflection of the LED filament 100 may be achieved by the adjustment of the ratio of phosphors 124 to the adhesive 122. For instance, the Young's Modulus (Y) of the LED filament 100 may be between $0.1 \times 10^{10}$ to $0.3 \times 10^{10}$ Pa. If necessary, the Young's Modulus of the LED filament 100 may be between $0.15 \times 10^{10}$ to $0.25 \times 10^{10}$ Pa. Consequently, the LED filament 100 would not be easily broken and still possess adequate rigidity and deflection.

Figure 4:
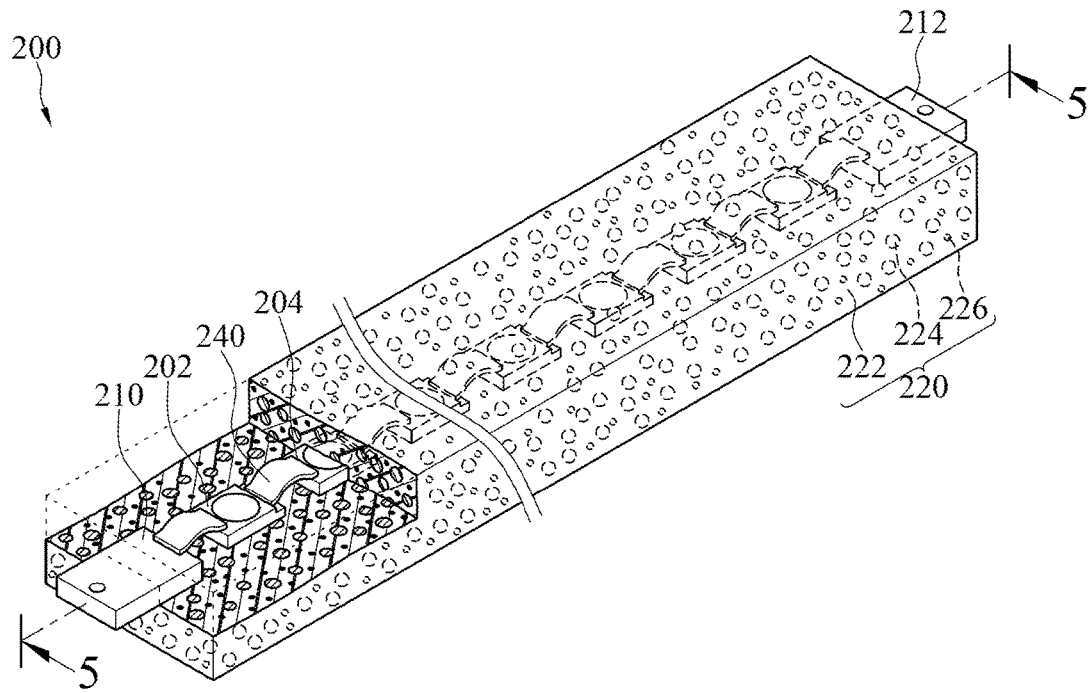
FIG. 4 illustrates a perspective view of an LED filament with partial sectional view according to a second embodiment of the present disclosure.
Figure 5:
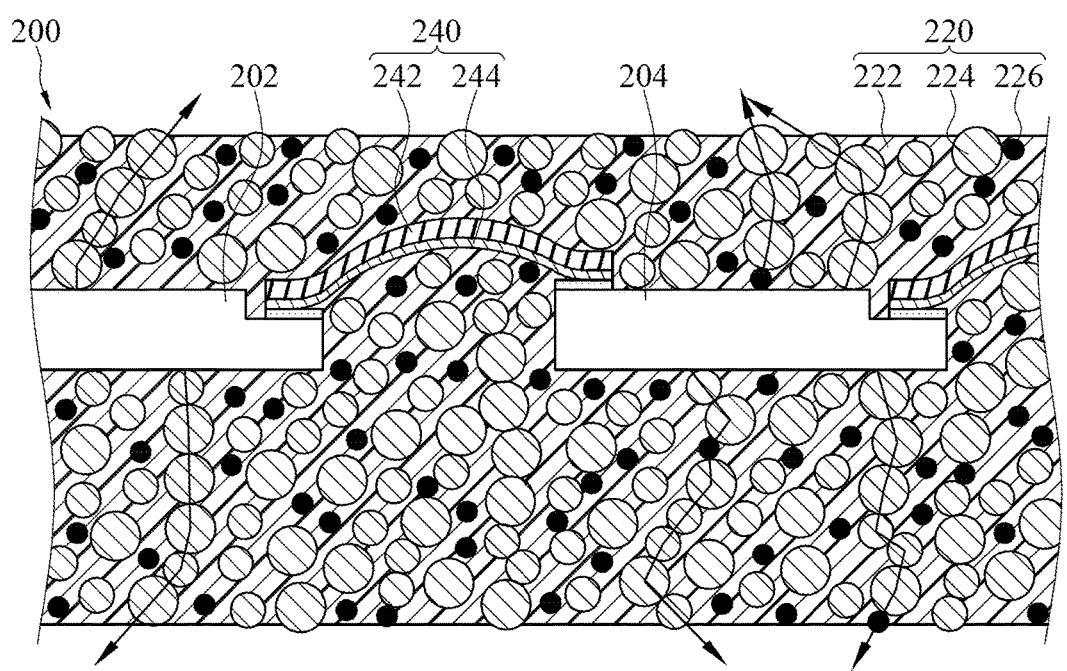
FIG. 5 illustrates a partial cross-sectional view at section 5-5 of FIG. 4.

Please refer to FIGS. 4 to 5. FIG. 4 illustrates a perspective view of an LED light bulb with partial sectional view according to a second embodiment of the LED filament and FIG. 5 illustrates a partial cross-sectional view at section 5-5 of FIG. 4.

According to the second embodiment of the LED filament 200, the LED filament 200 comprises a plurality of LED chips 202, 204, at least two conductive electrodes 210, 212, and a light conversion coating 220. The conductive electrodes 210, 212 are disposed corresponding to the plurality of LED chips 202, 204. The plurality of LED chips 202, 204 and the conductive electrodes 212, 214 are electrically connected therebetween. The light conversion coating 220 coats on at least two sides of the LED chips 202, 204 and the conductive electrodes 210, 212. The light conversion coating 220 exposes a portion of two of the conductive electrodes 210, 212. The light conversion coating 220 comprises an adhesive 222, a plurality of inorganic oxide nanoparticles 226 and a plurality of phosphors 224.

The size of the plurality of inorganic oxide nanoparticles 226 is around 10 to 300 nanometers (nm) or majorly is around 20 to 100 nm. The size of the plurality of inorganic oxide nanoparticles 226 is lesser than that of the phosphors 224. The plurality of the inorganic oxide nanoparticles 226 may be, but not limited to, aluminium oxides ($Al_2O_3$), silicon oxide ($SiO_2$), zirconium oxide (Zirconia, $ZrO_2$), titanic oxide ($TiO_2$), Calcium oxide (CaO), strontium oxide (SrO), and Barium oxide (BaO).

As shown in FIG. 5, the inorganic oxide nanoparticles 226 and the phosphors 224 are mixed with the adhesive 222. The unit prices and the hardnesses of the inorganic oxide nanoparticles 226 and the phosphors 224 are different. Therefore, a desired deflection, thermal conductivity, hardness, and cost of the LED filament 200 may be reached by adjustment of the ratio of the adhesive 222, phosphors 224 to the inorganic oxide nanoparticles 226 affects. In addition, due that the size of the inorganic oxide nanoparticles 226 is lesser than that of the phosphors 224, the inorganic oxide nanoparticles 226 may fill into the gaps among the phosphors 224. Hence, the contact area among the phosphors 224 and the inorganic oxide nanoparticles 226 is increased and thermal conduction paths are increased as shown by arrow lines on FIG. 5, too. Further, the inorganic oxide nanoparticles 226 may deflect or scatter light incident thereon. The light deflection and scattering make the light emitted from phosphors 224 mixed more uniformly and the characteristics of the LED filament 200 becomes even better. Furthermore, the impedance of the inorganic oxide nanoparticles 226 is high and no electrical leakage would happen through the inorganic oxide nanoparticles 226.

In some embodiments, the phosphors 224 are substantially uniformly distributed in the adhesive 222 (for instance, in silica gel, the polyimide or resin materials). Each of the phosphors 224 may be partially or totally wrapped by the adhesive 222 to improve the cracking or embrittlement of the light conversion coating 220. In the case that not each of the phosphors 224 is totally wrapped by the adhesive 222, the cracking or embrittlement of the light conversion coating 220 is still improved. In some embodiments, silica gel may be mixed with the polyimide or resin materials to form the light conversion coating 220.

The LED filament 200 further comprises a plurality of circuit film 240 (or call as transparent circuit film) for electrically and correspondingly connected among the plurality of LED chips and the conductive electrodes. Specifically, the plurality of circuit film 240 is electrically connecting the adjacent LED chips 202, 204 and conductive electrodes 210, 212. The light conversion coating 220 may encapsulate the plurality of circuit film 240.

Figure 6A:
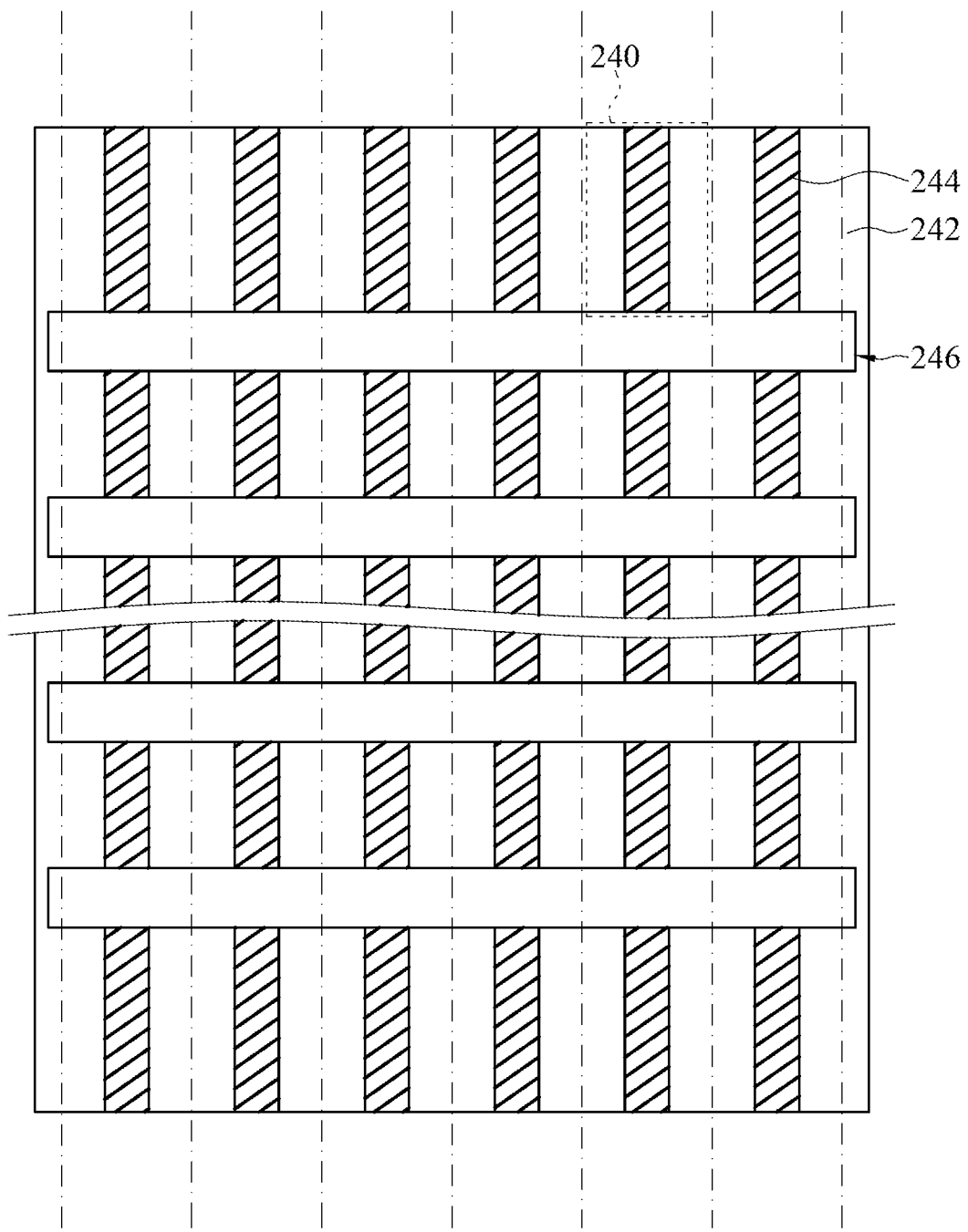
FIG. 6A illustrates a first embodiment of the uncut circuit film according to the second embodiment of the LED filament.

Please refer to FIG. 6A. FIG. 6A illustrates a first embodiment of the uncut circuit film according to the second embodiment of the LED filament 200. Each of the circuit films 240 comprises a first film 242 and a conductive circuit 244 disposed on the first film 242. The first film 242 in one embodiment may be, but not limited to, a thin film. In order to be easily understood the embodiments, the following description uses thin film as an example for the first film 242. However, the thin film 242 is not the only embodiment for the first film 242. The thin film 242 may be a transparent or translucent film. The transparent film may allow light emitted from the LED chips 202, 204 and/or phosphors 124 to pass. The conductive circuits 244 are electrically and correspondingly connected among the plurality of LED chips 202, 204 and the conductive electrodes 210, 212. In this embodiment, the conductive circuits 244 are of bar shape and substantially parallel to each other. However, the conductive circuits 244 may be in other shape or pattern. Please refer to FIG. 7A which illustrates a second embodiment of the uncut circuit film according to the second embodiment of the LED filament. Each of the circuit films 240a comprises a thin film 242a and a conductive circuit 244a disposed on the thin film 242a. The conductive circuits 244a are substantially parallel lines electrically connected with pads of adjacent LED chips 202, 204 as shown in FIG. 7B. Please refer to FIG. 8A which illustrates a third embodiment of the uncut circuit film according to the second embodiment of the LED filament. Each of the circuit films 240b comprises a thin film 242b and a conductive circuit 244b disposed on the thin film 242b. The conductive circuits 244b are crossover lines electrically connected with pads of adjacent LED chips 202b, 204b as shown in FIG. 8B. The width of the lines may be 10 micrometers (um) and the thickness of the lines may be 2 um. The pattern or shape of the conductive circuits 244, 244a, 244b are not limited to the above-mentioned embodiments, any pattern or shape which is capable of connecting pads of adjacent LED chips 202, 204 and conductive electrodes 210, 212 are feasible.

The thin film 242 may be, but not limited to, Polyimide film (PI film). Transmittance of the polyimide film is above 92%. The material of the conductive circuit 244 may be, but not limited to, indium tin oxide (ITO), nano-silver plasma, metal grids, or nano-tubes. The advantages of Silver include good reflection and low light absorption. Nano-scaled silver lines in grid shape have advantages of low resistance and high penetration of light. In addition, gold-doped nano-silver lines may enhance the adherence between the pads of the LED chips 202, 204 and the sliver lines (conductive circuits).

Please refer to FIG. 6A again. The circuit film 240 may be made by firstly forming conductive circuits 244 on a thin film 242, and then forming slots 246 on the thin film 242 with the conductive circuits 244.

Please refer to FIG. 6A. The conductive circuits 244 do not cover the whole surface of the thin film 242. Consequently, light emitted from the LED chips 202, 204 can pass through the circuit film 240 at least from the portion of the thin film 242 where the conductive circuits 244 do not occupy. In the second embodiment, the circuit film 240 is used to electrically connect with adjacent LED chips 202, 204 and the conductive electrodes 210, 212. The circuit film 240 has the advantages of wider conductive lines, better deflection, and better toughness (less possibility of being broken) than the conductive wires 140 in the first embodiments.

Regarding the electrical connection among the circuit film 240, LED chips 202, 204, and the conductive electrodes 210, 212, conductive glues may be applied on the surfaces of the LED chips 202, 204 and the conductive electrodes 210, 212 where the conductive circuits 244 are going to electrically connect. The conductive glues may be, but not limited to, silver paste, solder paste (tin paste), or conductive glues doped with conductive particles. Then, dispose the circuit film 240 on the LED chips 202, 204 and the conductive electrodes 210, 212 with adequate alignment and cure the circuit film 240 and the conductive glues by heat or UV.

Figure 9A:
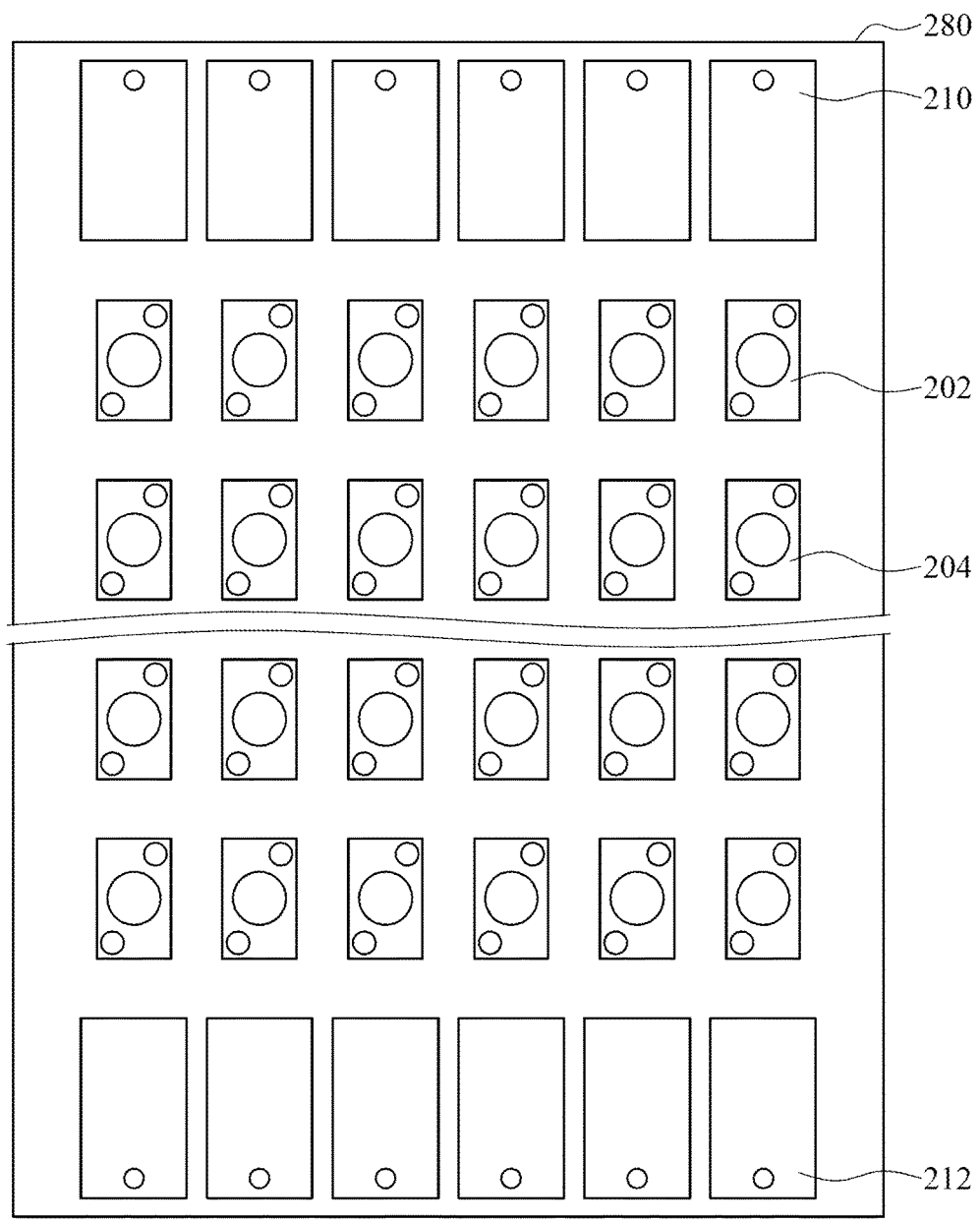
FIGS. 9A to 9E illustrate a manufacturing method of an LED filament according to a first embodiment of the present disclosure.
Figure 9B:
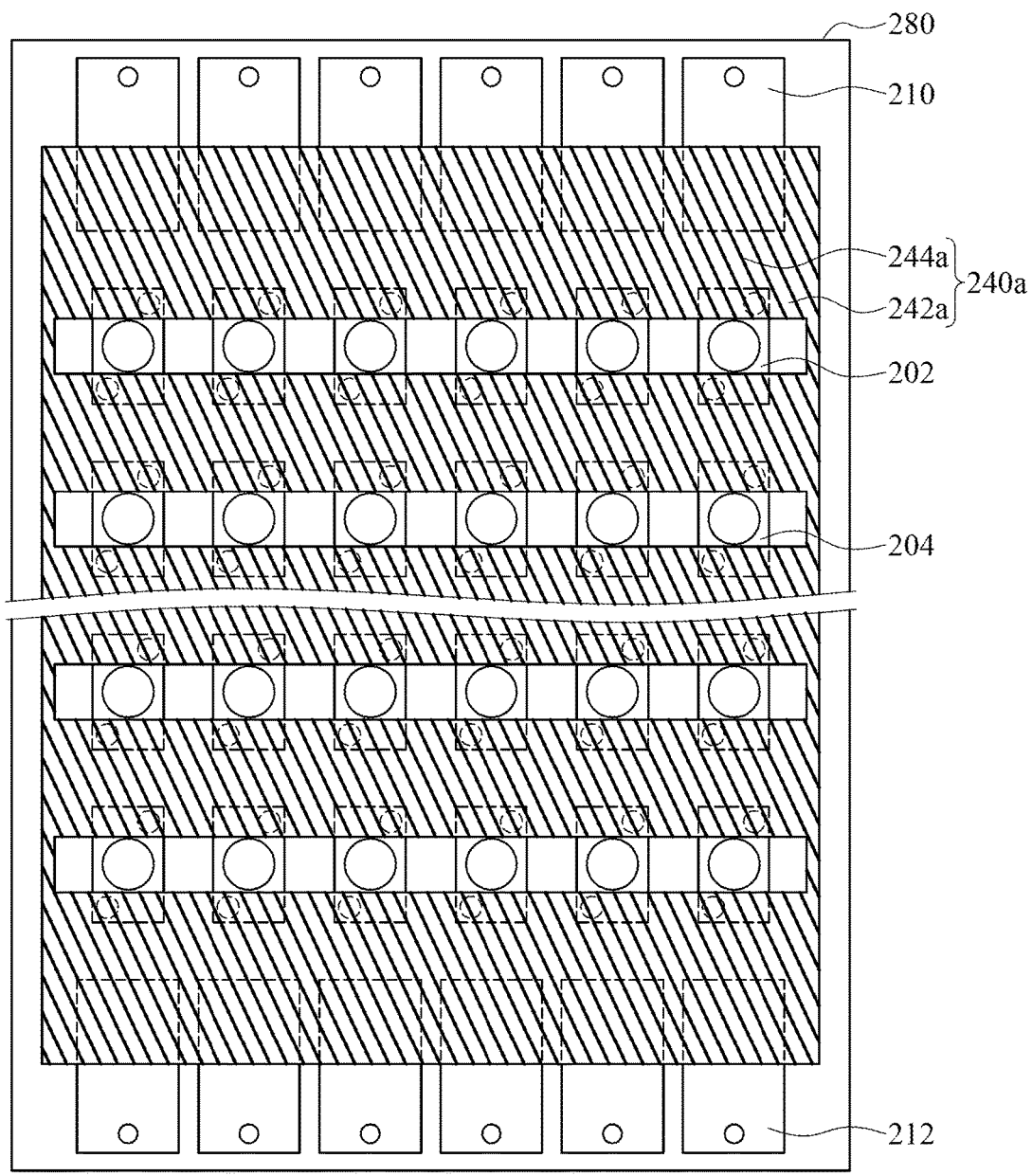

Please refer to FIGS. 9A to 9E which illustrate a manufacturing method of an LED filament according to a first embodiment. The manufacturing method of the LED filament 200 comprises:

S20: dispose LED chips 202, 204 and at least two conductive electrodes 210, 210 on a carrier 280, referring to FIG. 9A;

S22: electrically connect the LED chips 202, 204 with the conductive electrodes 210, 212, referring to FIG. 9B; and S24: dispose a light conversion coating 220 on the LED chips 202, 204 and the conductive electrodes 210, 212. The light conversion coating 220 coats on at least two sides of the LED chips 202, 204 and the conductive electrodes 210, 212. The light conversion coating 220 exposes a portion of at least two of the conductive electrodes 210, 212. The light conversion coating 220 comprises adhesive 222 and a plurality of phosphors 224, referring to FIG. 9C to 9E.

In S20, the plurality of LED chips 202, 204 are disposed in a rectangular array. Each column of the LED chips 202, 204, at the end of the manufacturing process, may be cut into a single LED filament 200. During disposition of the LED chips 202, 204, the anodes and cathodes of the LED chips 202, 204 should be properly orientated for later connected in series or parallel. The carrier 280 may be, but not limited to, glass substrate or metal substrate. The carrier 280 may be, but not limited to, a plate like that shown in FIG. 9A, or a plate with a groove like the carrier 180 shown in FIG. 10. The groove is for being disposed with the base layer 120b.

Figure 7A:
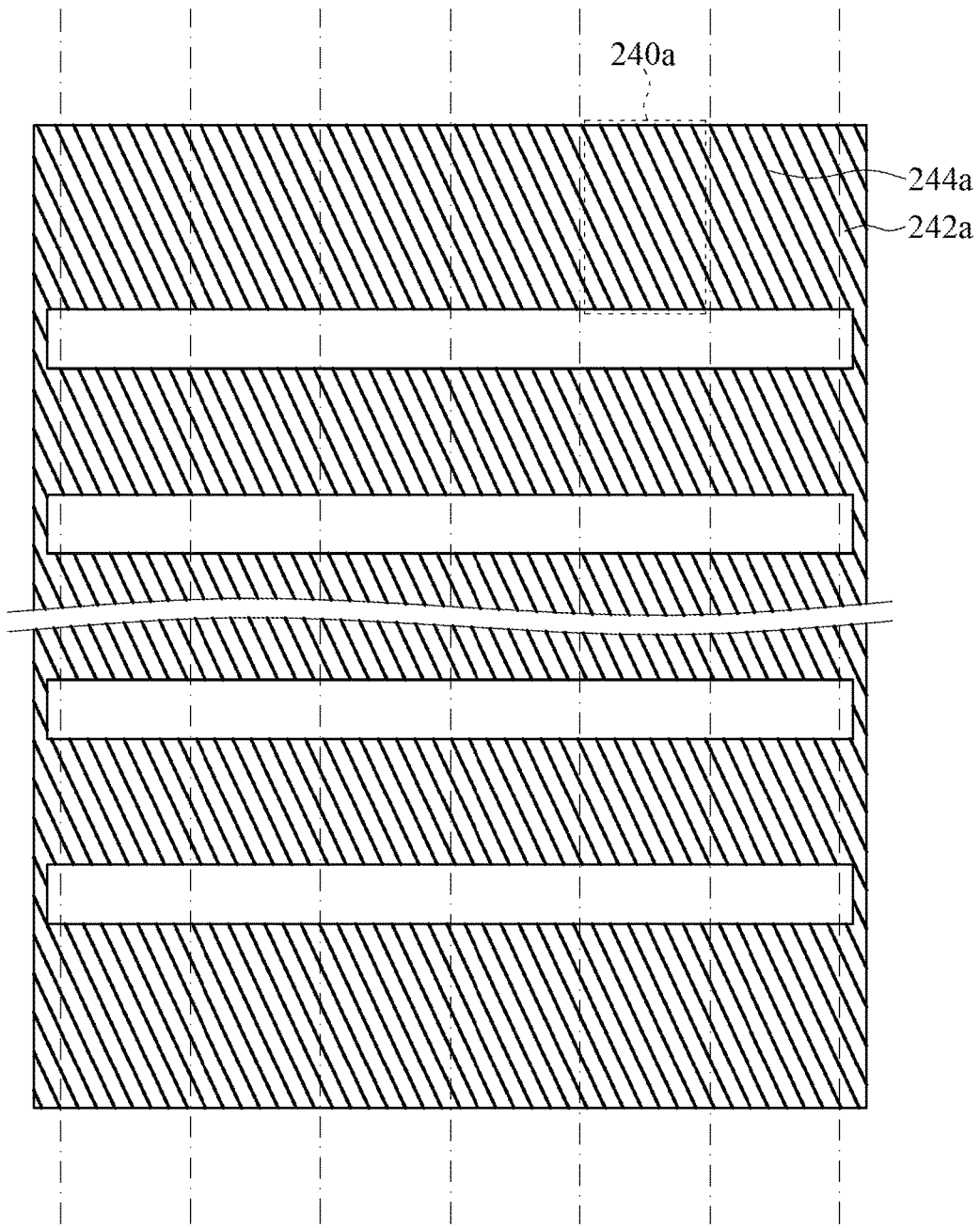
FIG. 7A illustrates a second embodiment of the uncut circuit film according to the second embodiment of the LED filament.
Figure 7B:
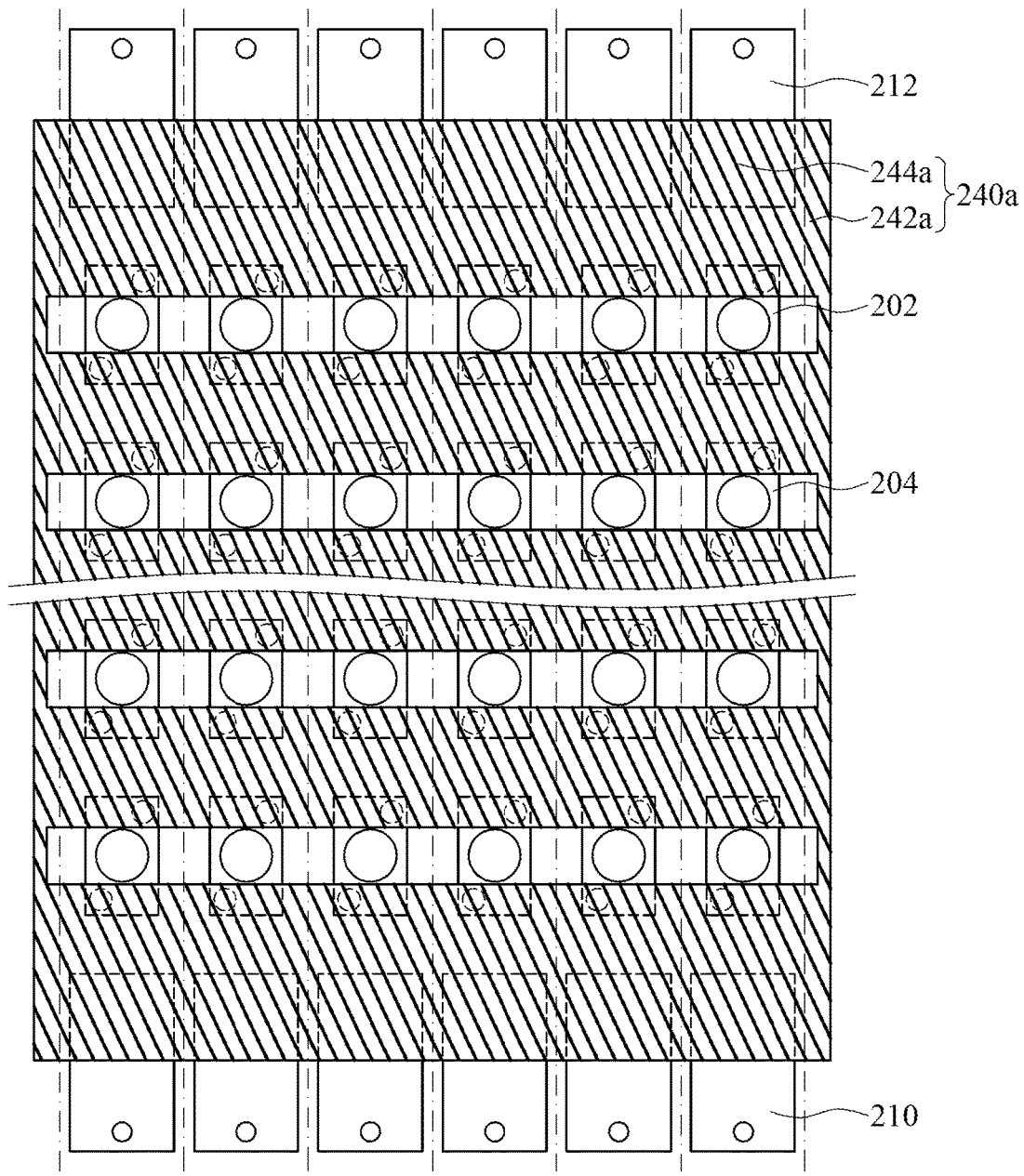
FIG. 7B illustrates the alignment between the LED chips and the second embodiment of the uncut circuit film of FIG. 7A.

In S22, the uncut circuit film 240a is similar to the circuit film 240a shown in FIG. 7A. The LED chips 202, 204 and the conductive circuit 210, 212 are electrically connected by the parallel conductive lines. Alternatively, the circuit film 240, 240b shown, respectively, in FIG. 6A or 8A may be used in S22. The conductive wires 140 shown in FIG. 2 can be used in S22, too.

In S24, the light conversion coating 220 may be coated on the LED chips 202, 204 and the conductive electrodes 210, 212 by different method. Firstly, taking FIG. 9C to 9E as an example, the manufacturing method of S24 comprises:

S240: coat a light conversion sub-layer (top layer 220a) on a surface of the LED chips 202, 204 and the conductive electrodes 210, 212 which is not contact with the carrier 280;

S242: flip over the LED chips 202, 204 and the conductive electrodes 210, 212 disposed with the top layer 220a; and S244: coat a light conversion sub-layer (base layer 220b) on a surface of the LED chips 202, 204 and the conductive electrodes 210, 212 which are not coated with the top layer 220a.

In order to distinguish the light conversion sub-layers in S240 and in S244, the light conversion sub-layer in S240 is referred to top layer 220a and the light conversion sub-layer in S244 is referred to base layer 220b hereinafter.

In S240, after the LED chips 202, 204 and the conductive electrodes 210, 212 are coated with the top layer 220a, the adhesive 222 and the phosphors 224 will fill out the gaps among the LED chips 202, 204 and the conductive electrodes 210, 212. Then, proceed with a curing process to harden the top layer which encapsulates the upper part of the LED chips 202, 204 and the conductive electrodes 210, 212 and exposes a portion of at least two of the conductive electrodes 210, 212. The curing process may be done by heat or UV.

In S242, the flip-over of the semi-finished piece may be done by two different ways in accordance with different situations. Concerning the first flip-over way, the LED chips 202, 204 and the conductive electrodes 210, 212 are disposed on the carrier 280 without any adherences with the carrier 280. S242 can be done by flip the cured semi-finished piece over directly. Then, place the flipped-over semi-finished piece on the carrier 280 again. (The semi-finished piece is the cured the LED chips 202, 204 and the conductive electrodes 210, 212 covered with the top layer 220a.)

As for the second way, glues are applied on the carrier 280. The glues are, for instance, photoresist in semiconductor process, or die bond glues. The glues (photoresist or die bond glues) is for temporarily fixing the LED chips 202, 204 and the conductive electrodes 210, 212 on the carrier 280. The glue may be removed by acetone or solvent and the semi-finished piece is separated from the carrier 280. If necessary, the remained glues may be removed by an additional cleaning process.

Figure 9C:
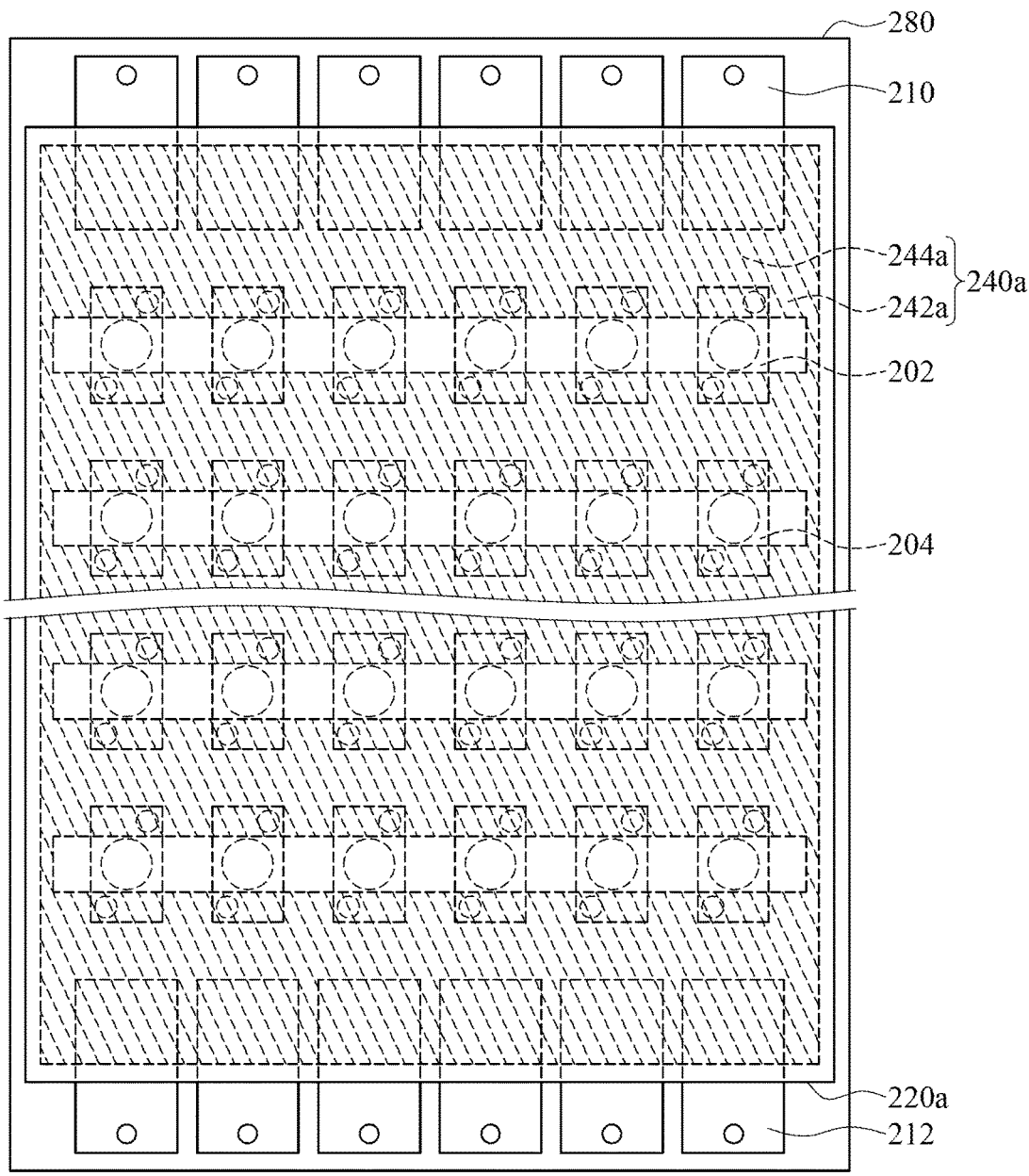
Figure 9D:
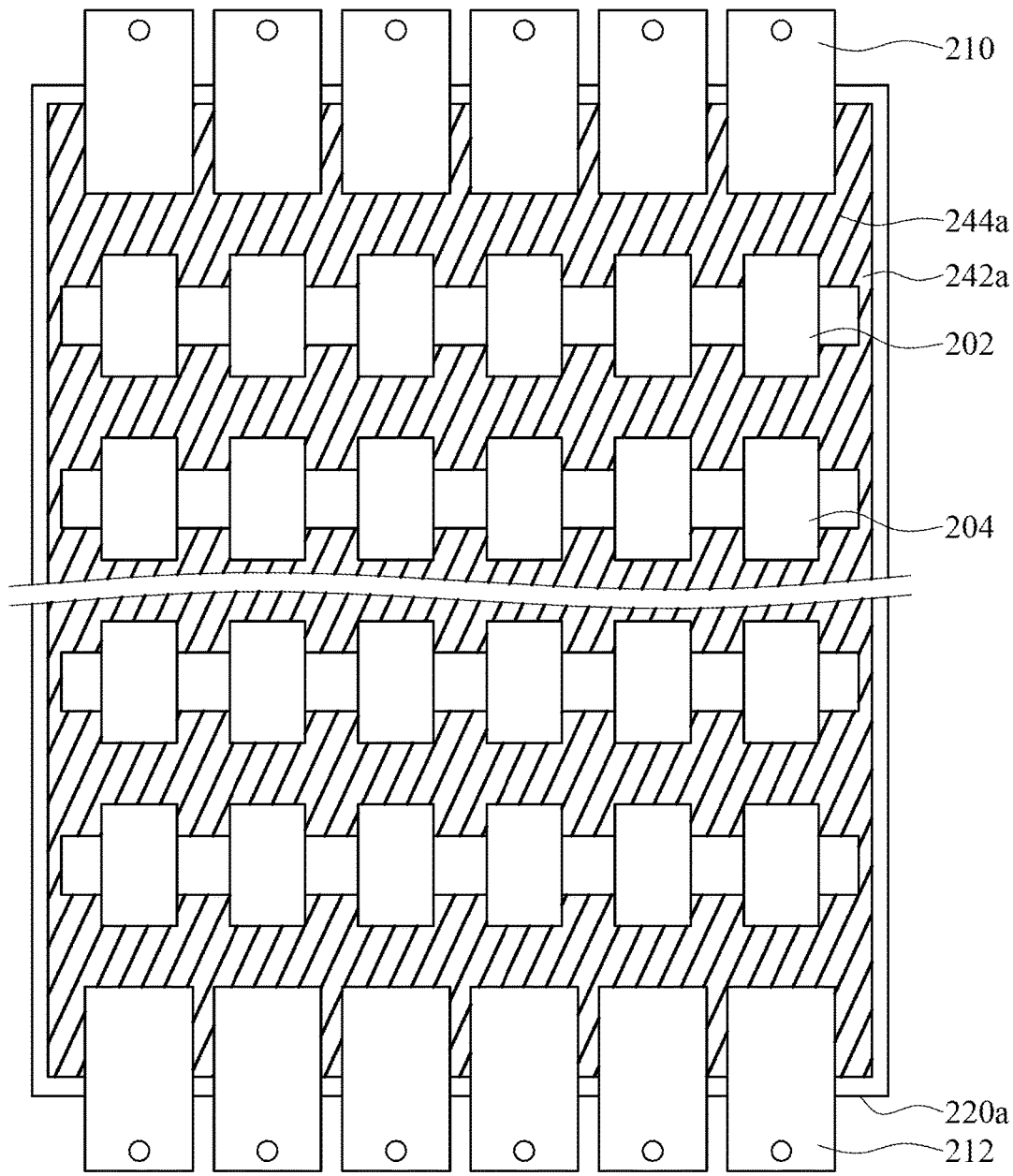
Figure 9E:
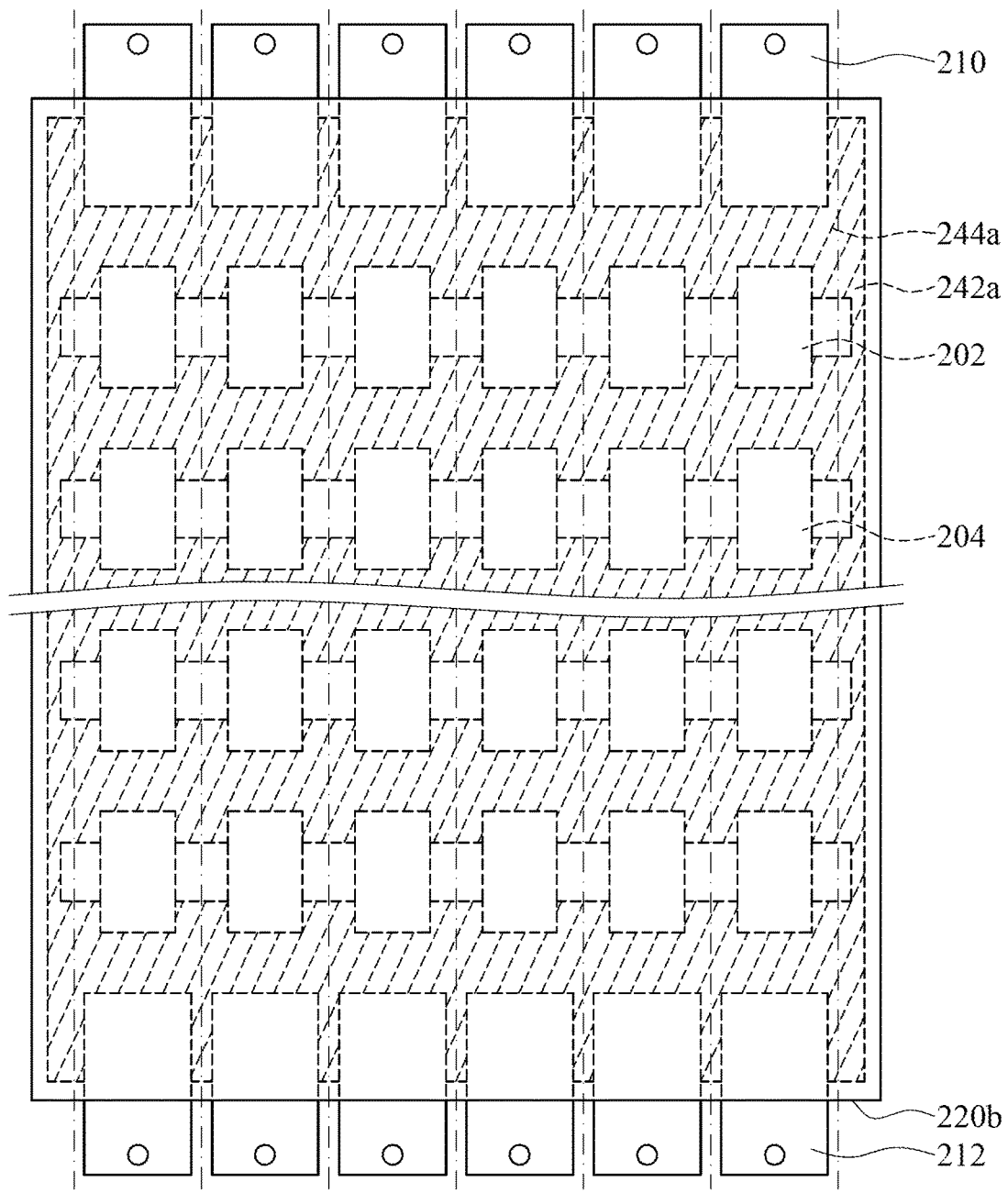

In S244, referring to FIG. 9E, cure the base layer 220b after the base layer 220b is coated on the surface of the LED chips 202, 204 and the conductive electrodes 210, 212.

Referring to FIG. 9C, the top layer 220a is slightly greater than the uncut circuit film 240a. However, it is not a requirement. The sizes of the top layer 220a may be the same as or lesser than that of the uncut circuit film 240a. Referring to FIG. 9E, the area of the top layer 220a is substantially the same as that of the base layer 220b. It is not a requirement, either. In implementation, the area of the top layer 220a may be greater or lesser than the area of the base layer 220b. FIG. 9E illustrates a semi-finished LED filament where a plurality of LED filaments 200 are integrated into one piece.

After S24, the method may further comprise S26: cut the semi-finished LED filament along the dot-and-dash lines shown in FIG. 9E. Each cut portion is an LED filament 200. The semi-finished LED may be cut every other two dot-and-dash lines.

Figure 6B:
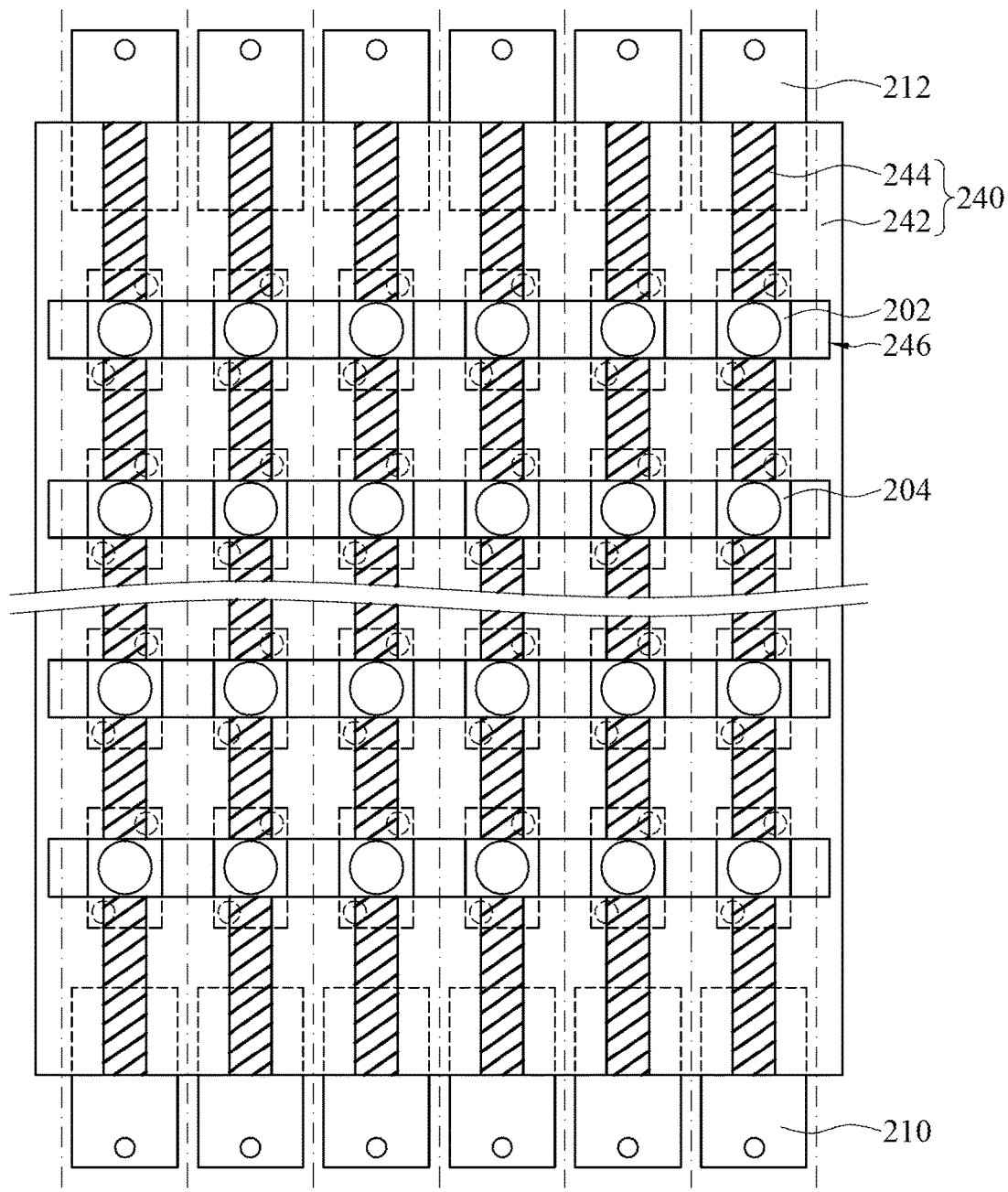
FIG. 6B illustrates the alignment between the LED chips and the first embodiment of the uncut circuit film of FIG. 6A.
Figure 8A:
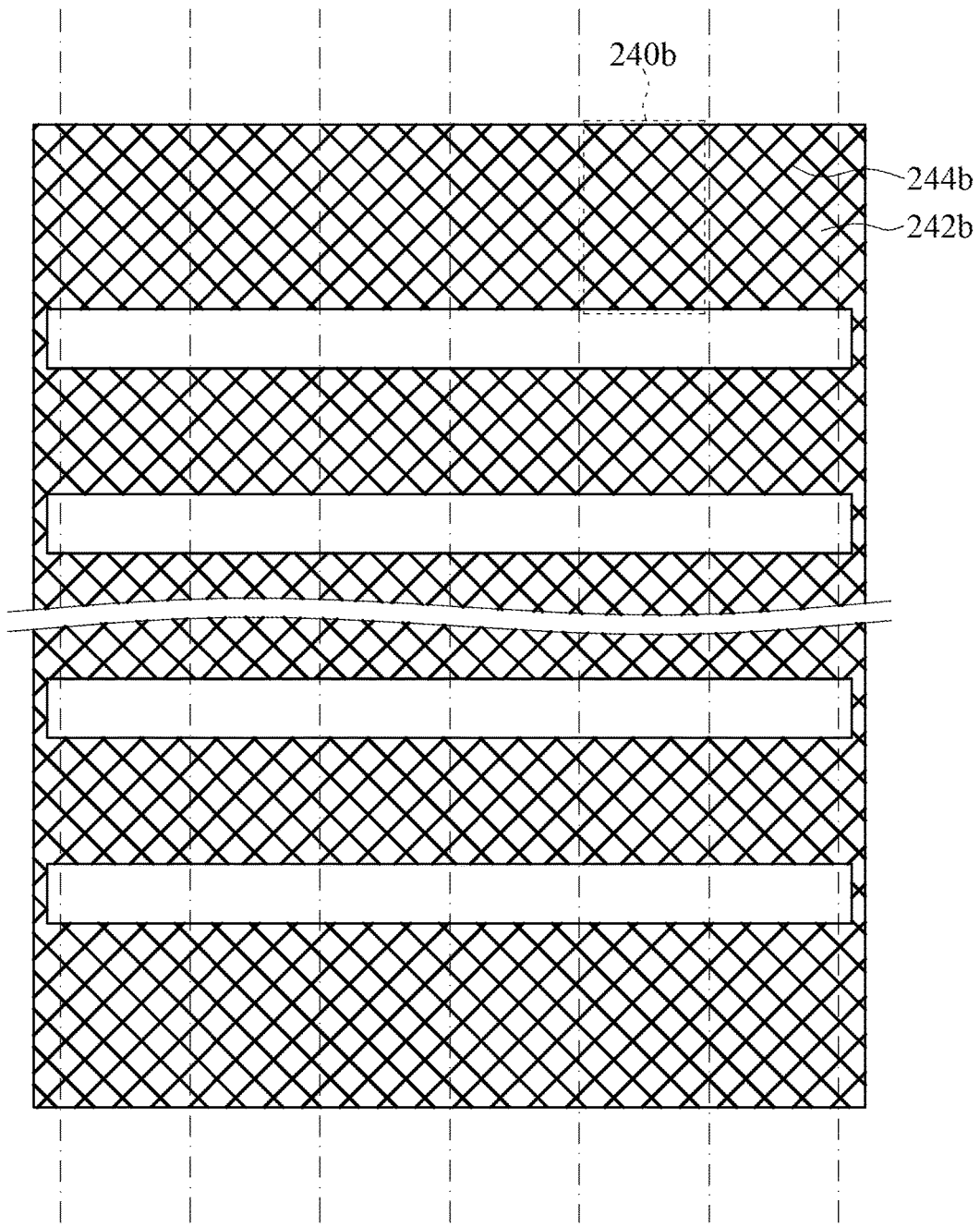
FIG. 8A illustrates a third embodiment of the uncut circuit film according to the second embodiment of the LED filament.
Figure 8B:
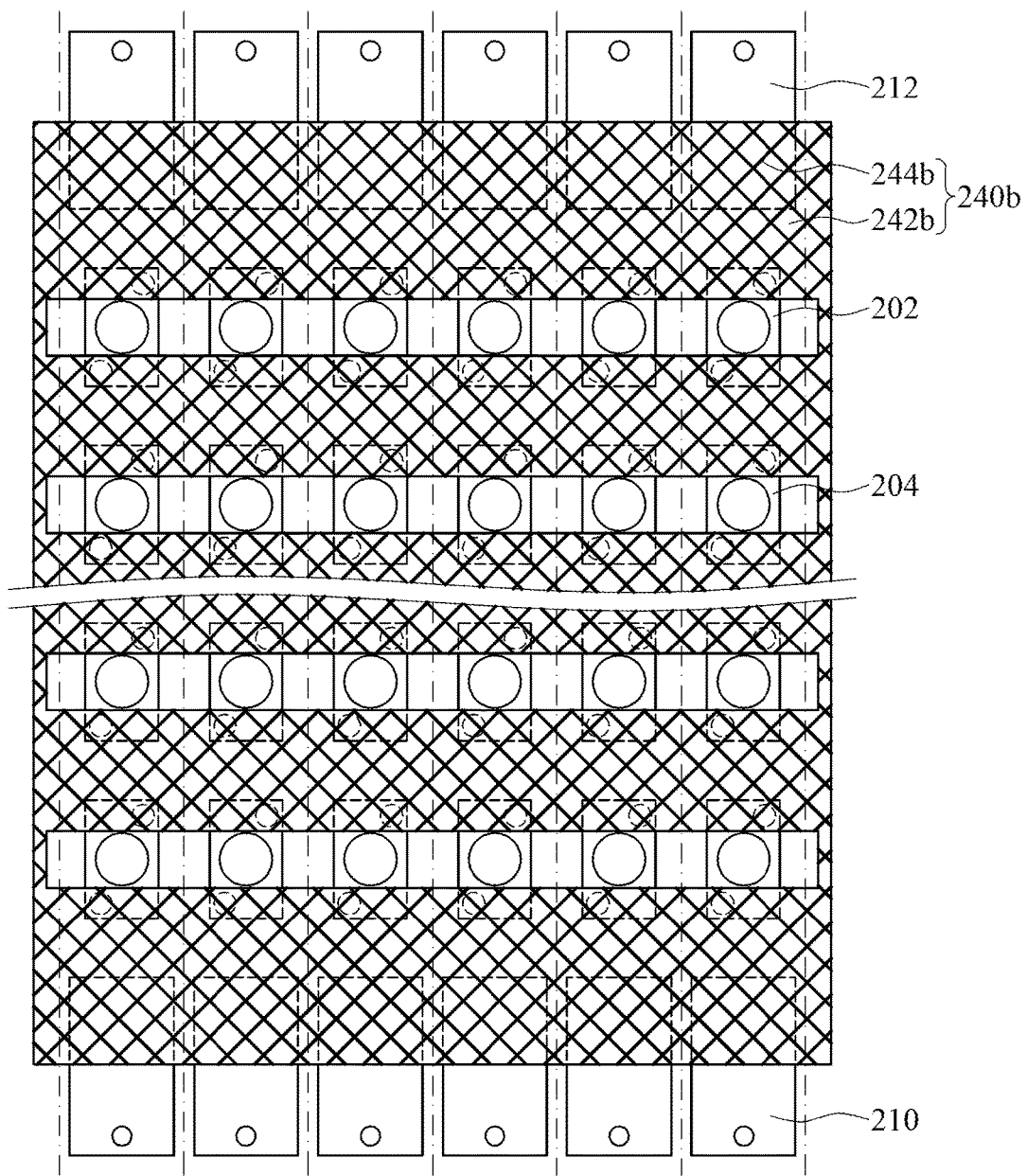
FIG. 8B illustrates the alignment between the LED chips and the third embodiment of the uncut circuit film of FIG. 8A.

FIGS. 6B, 7B and 8B illustrate uncut circuit films 240, 240a, 240b of FIGS. 6A, 7A and 8A covering the LED chips 202, 204 and the conductive electrodes 210, 212 with proper alignment.

The method of FIGS. 9A to 9E illustrates each LED filament are disposed in a rectangular array manner. Alternatively, the disposition of S20 may be a single column of LED chips 202, 204. In the consequence, S26 may be omitted.

Figure 10:
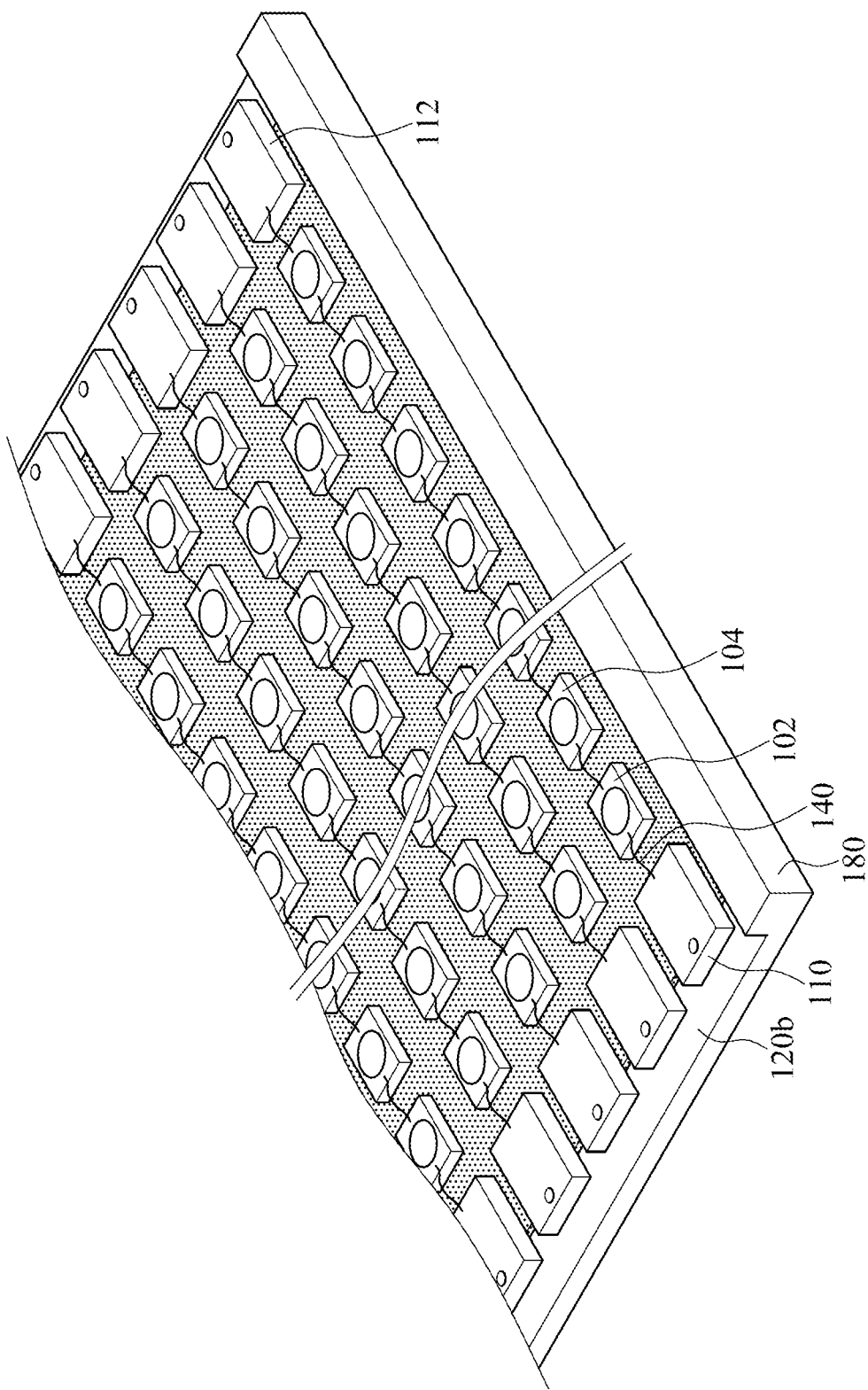
FIG. 10 illustrates a manufacturing method of an LED filament according to a second embodiment of the present disclosure.

Please refer to FIG. 10 for the second embodiment of the manufacturing method for the LED filament 200. The method comprises:

S20A: coat a light conversion sub-layer (a base layer 120b) on a carrier 180;

S20B: dispose LED chips 102, 104 and conductive electrodes 110, 112 on the base layer 120b;

S22: electrically connect the LED chips 102, 104 with the conductive electrodes 110, 112; and S24: coat a light conversion sub-layer (top layer 120a) on the LED chips 102, 104 and the conductive electrodes 110, 112. The top layer 120a coats on the LED chips 102, 104 and the conductive electrodes 110, 112. The top layer 120a and the base layer 120b expose a portion of at least two of the conductive electrodes 110, 112. The light conversion coating 120 (top layer 120a and the base layer 120b) comprises adhesive 122 and a plurality of phosphors 124.

As shown in FIG. 10, the base layer 120b is a part of the light conversion coating 120 and comprises an adhesive 122 and phosphors 124. In the embodiment of FIG. 10, the base layer 120b is, but not limited to, coated on the carrier 180 with a groove. Alternatively, the carrier 180 can be omitted. In other words, the base layer 120b may be place on a work table without any carrier 180. The LED chips 102, 104 and the conductive electrodes 110, 112 are disposed on the base layer 120b.

The thickness of the base layer 120b may be 50 to 100 um. The composition ratio of phosphors 124 to the adhesive 122 can be adjusted and the thickness of the base layer 120b may be around 60 to 80 um. After S20, a pre-curing process may be used to slightly cure the base layer 120b so that the LED chips 102, 104 and the conductive electrodes 110, 112 can be fixed on the base layer 120b. Besides, the LED chips 102, 104 and the conductive electrodes 110, 112 may be fixed on the base layer 120b by die bond glues.

After the electrical connection of S22, the top layer 120a is coated on the LED chips 102, 104 and the conductive electrodes 110, 112 and then a curing process is proceeded with to cure the top layer 120a. Consequently, the flip-over of S242 and glue-removing process are omitted.

According to the embodiment of FIG. 10, after S24, the process of S26 may be proceeded with.

The base layer 120b is used for carrying the LED chips 102, 104 and the conductive electrodes 110, 112 and its thickness may be 0.5 to 3 millimeters (mm) or 1 to 2 mm.

The composition ratio of phosphors 124 to the adhesive 122 may be adjusted accordingly to make the base layer 120b hard enough to sufficiently carry the LED chips 102, 104 and the conductive electrodes 110, 112 and for the following process like wire bond. The Shore D Hardness of the base layer 120b may be at least 60 HD. Hence, the overall LED filament 10a will have enough hardness, rigidity and deflection. The electrical conductivity of the connection among the LED chips 102, 104 and the conductive electrodes 110, 112 can be maintained even though the LED filament 10a is bent.

In accordance with the embodiment of FIG. 10, the hardness of the cured base layer 120b is better to be sufficient to carry the LED chips 102, 104 and the conductive electrodes 110, 112 and to support for the wire bonding process. However, the top layer 120a is not required to have the same hardness as the base layer 120b. Accordingly, the adjustment of ratio of the phosphors 124 to the adhesive 122 is more flexible. Alternatively, the light conversion coating 120 may comprise inorganic oxide nanoparticles 224 (not shown in FIG. 10).

Figure 11A:
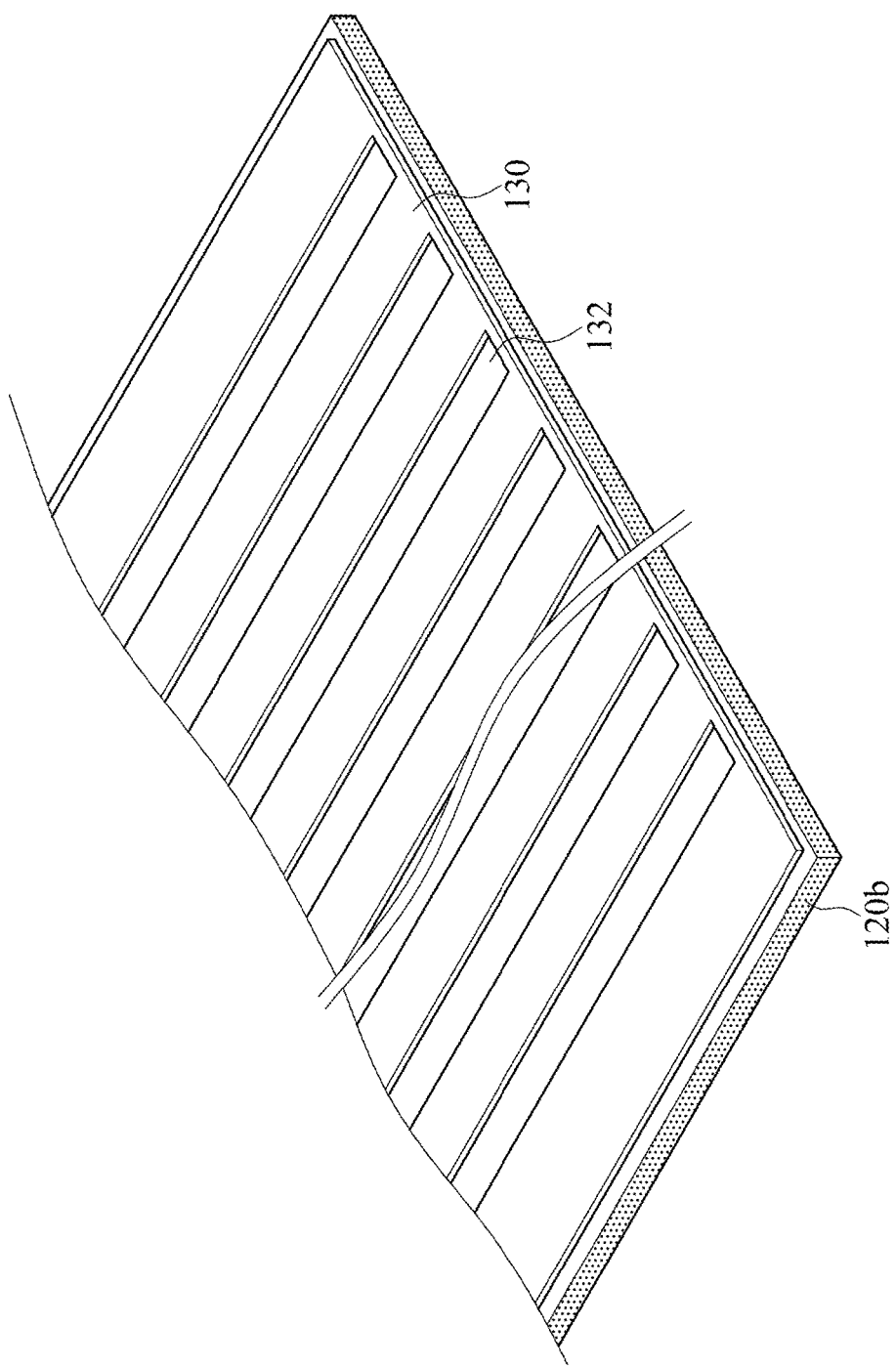
FIGS. 11A to 11E illustrate a manufacturing method of an LED filament according to a third embodiment of the present disclosure.
Figure 11B:
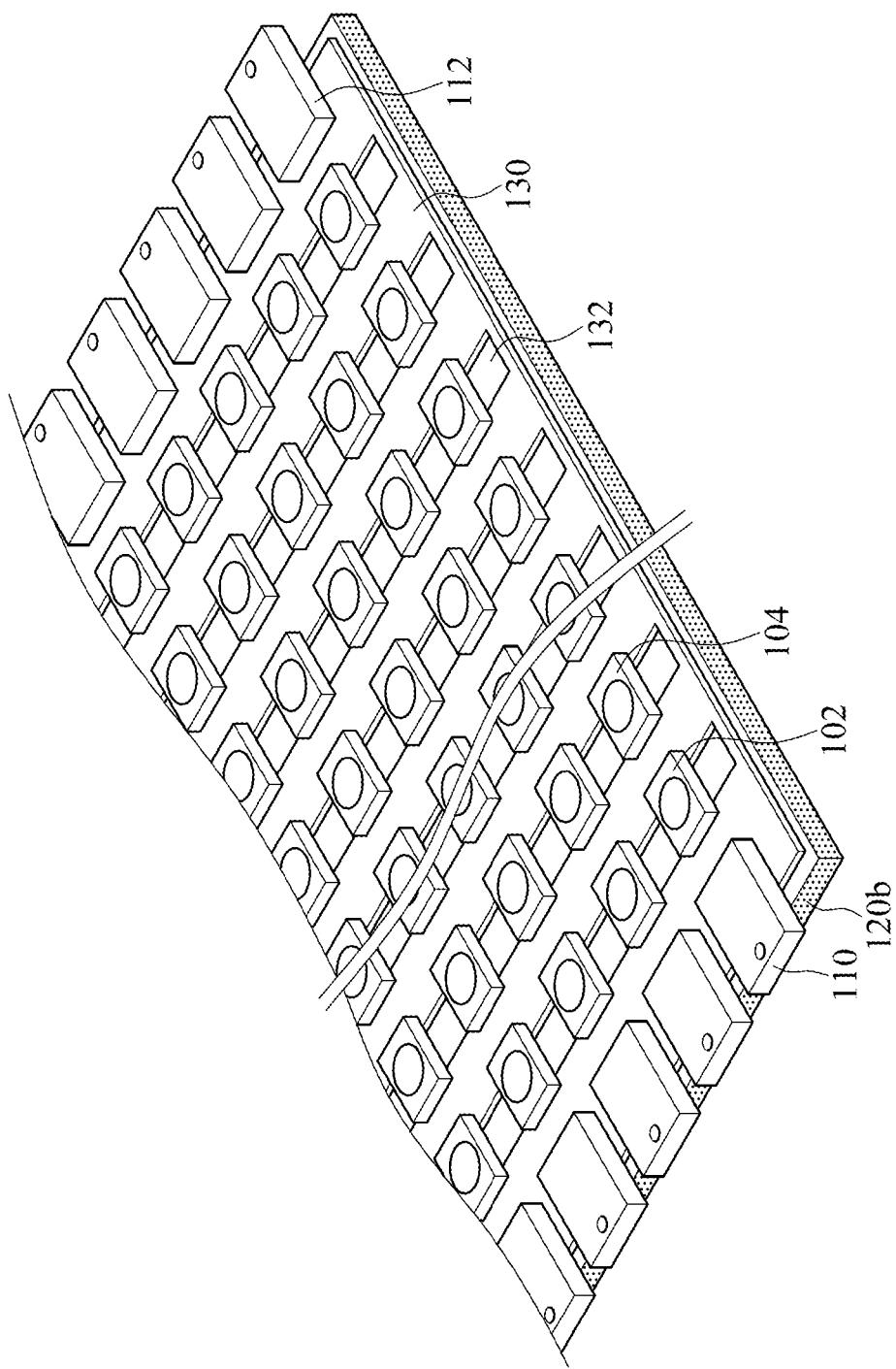
Figure 11C:
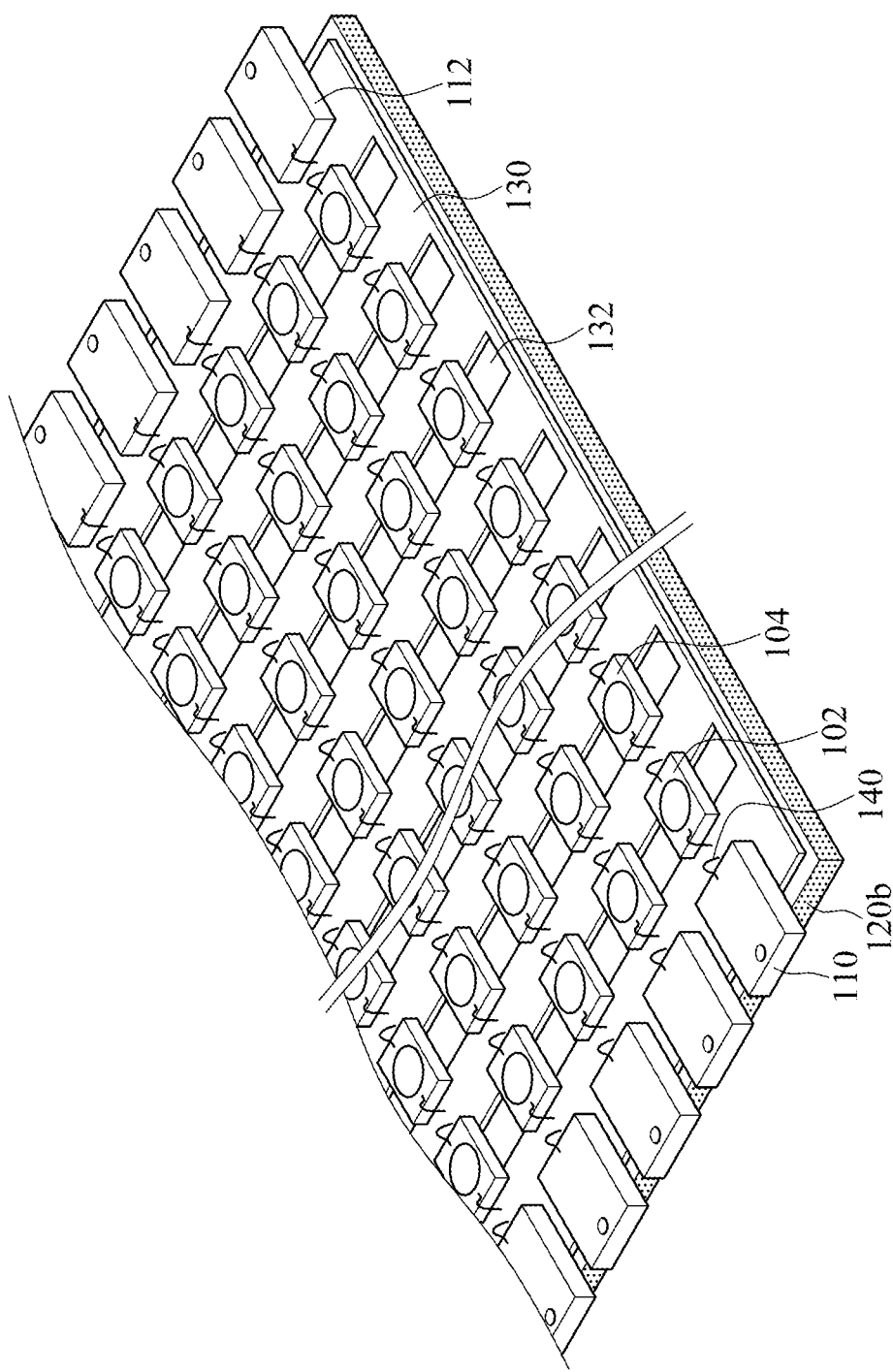

Next, please refer to FIGS. 11A to 11E which illustrate a manufacturing method of an LED filament according to a third embodiment. The manufacturing method for an Led filament 10a comprises:

S202: dispose conductive foil 130 on a light conversion sub-layer (base layer 120b), referring to FIG. 11A;

S204: dispose a plurality of LED chips 102, 104 and a plurality of conductive electrodes 110,112 on the conductive foil 130, referring to FIG. 11B;

S22: electrically connect the LED chips 102, 104 with the conductive electrodes 110, 112, referring to FIG. 11C; and S24: coat a light conversion sub-layer (top layer 120a) on the surfaces of the LED chips 102, 104 and the conductive electrode 110, 112 where may be not in contact with the conductive foil 130. The light conversion coating 120 (including the base layer 120b and the top layer 120a) coats on at least two sides of the LED chips 102, 104 and the conductive electrodes 110, 112. The light conversion coating 120 exposes a portion of at least two of the plurality of conductive electrodes 110, 112. The light conversion coating 120 comprises adhesive 122 and phosphors 124.

Please refer to FIG. 11A, the light conversion coating of S202 is called as the base layer 120b. The conductive foil 130 may have a plurality of openings 132. The width of each of the openings 132 may be lesser than the length of the LED chips 102, 104 and each of the openings 132 is aligned with the portion of the LED chips 102, 104 which emits light. Therefore, light emitted from LED may pass through the openings 132 without any shielding or blocking.

The conductive foil 130 may be, but not limited to, a copper foil coated with silver. The openings 132 may be formed by punching or stamping on a copper foil.

Before S202, the method may comprise a pre-step: dispose the base layer 120b on a carrier (like 180 of FIG. 10) or on a work table.

In S204, please refer to FIG. 11B. The LED chips 102, 104 and the conductive electrodes 110, 112 are disposed on the conductive foil 130. As above-mentioned, the light emitting portions of the LED chips 102, 104 are better to align with the openings 132.

Please refer to FIG. 11C. The electrical connection of S22 may be accomplished by wire bonding process like that shown in FIG. 1. As shown in FIG. 11C, the LED chips 102, 104 and the conductive electrodes 110, 112 are electrically connected together in series.

Figure 11D:
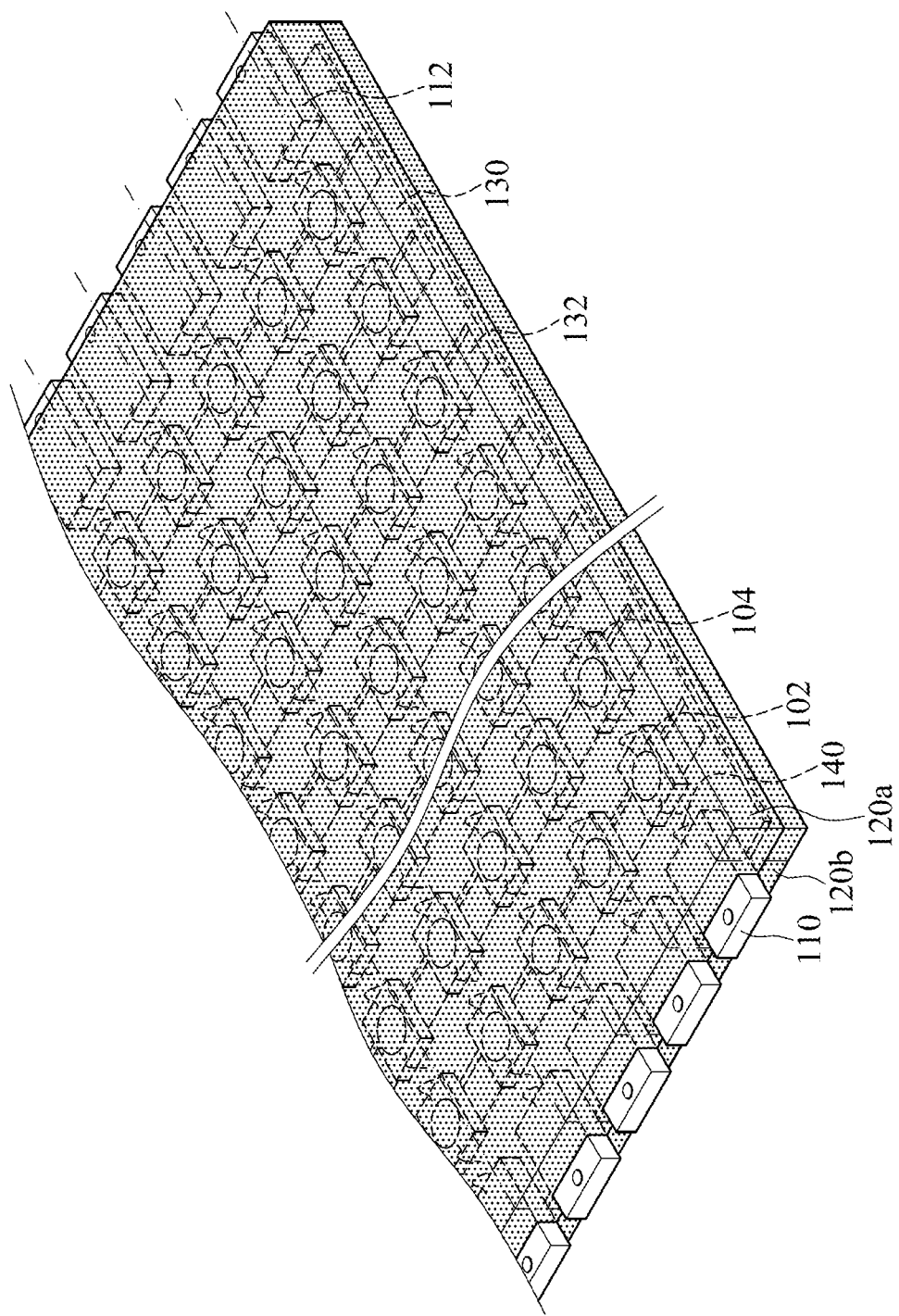

Next, please refer to FIG. 11D. Like the embodiment of FIG. 10, the light conversion sub-layer may be referred to top layer 120a. The top layer 120a fills out the gaps among the LED chips 102, 104 and the conductive electrodes 110, 112 including the gaps under the LED chips 102, 104 and the openings 132.

Regarding the disposition of the top layer 120a, there are a few method to proceed with. The first one is to coat a mixture of the adhesive 122 and the phosphors 124 on the LED chips 102, 104 and the conductive electrodes 110, 112. The second one is to firstly coat a layer of phosphors 124 on the LED chips 102, 104 and the conductive electrodes 110, 112, and secondly coat a layer of adhesive 122 thereon (two disposition steps). Thereafter, cure the layer of adhesive 122 and the layer of phosphors 124. The third one is to repeat the above two disposition steps until a required thickness is reached. Thereafter, a curing process is proceeded with. In comparison with the three methods, the uniformity of the light conversion coating 120 done by the third method might be better. Additionally, the disposition (coat) of the adhesive 122 or the phosphors 124 may be done by spraying.

Figure 11E:
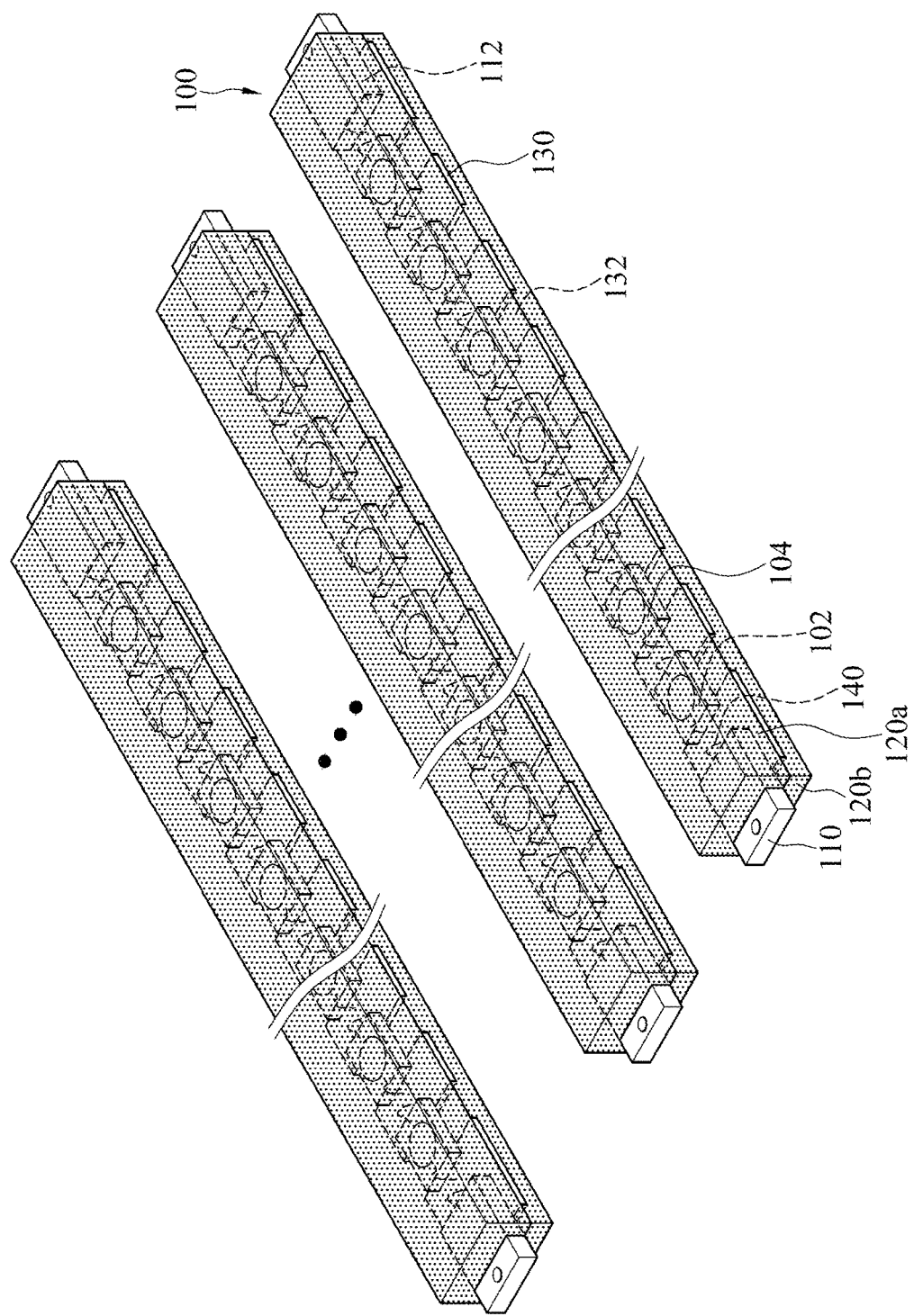

After S24, a cut process may be proceeded with, referring to FIG. 11E. Cut LED filaments 100 are manufactured as shown in FIG. 11E.

In accordance with the embodiment of FIG. 11A to 11E, the LED chips 102, 104 and the conductive electrodes 110, 112 are electrically connected together through conductive foil 130 and conductive wire 140. The flexibility of the electrical connections is enhanced. Accordingly, when the LED filament 100 is bent, the electrical connections would not be easily broken.

Figure 12B:
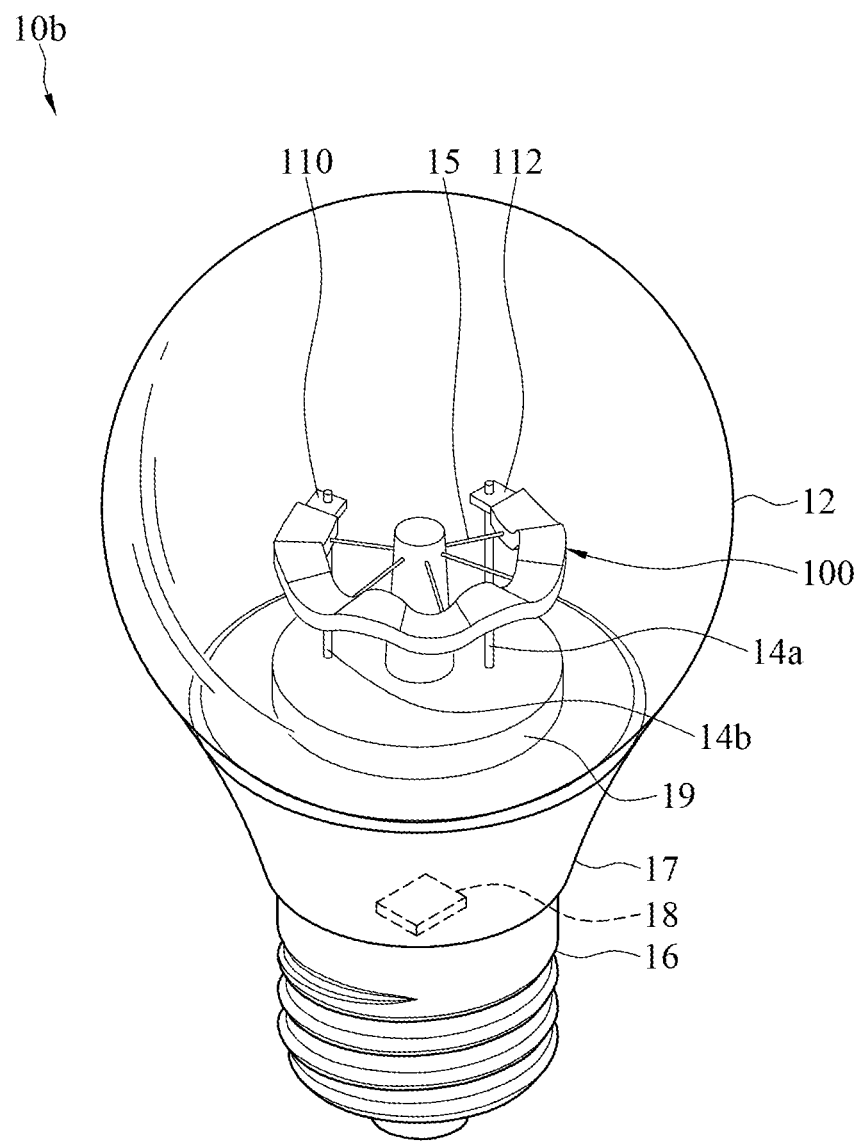

Please refer to FIGS. 12A and 12B which illustrate a perspective view of LED light bulb applying the LED filaments according to a first and a second embodiments. The LED light bulb 10a, 10b comprises a bulb shell 12, a bulb base 16 connected with the bulb shell 12, at least two conductive supports 14a, 14b disposed in the bulb shell 12, a driving circuit 18 electrically connected with both the conductive supports 14a, 14b and the bulb base 16, and a single LED filament 100 disposed in the bulb shell 12.

The conductive supports 14a, 14b are used for electrically connecting with the conductive electrodes 110, 112 and for supporting the weight of the LED filament 100. The bulb base 16 is used to receive electrical power. The driving circuit 18 receives the power from the bulb base 16 and drives the LED filament 100 to emit light. Due that the LED filament 100 emits light like the way a point light source does, the LED bulb 10a, 10b may emit omnidirectional light. In this embodiment, the driving circuit 18 is disposed inside the LED light bulb. However, in some embodiments, the driving circuit 18 may be disposed outside the LED bulb.

The definition of the omnidirectional light depends upon the area the bulb is used and varies over time. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (1 m), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb.

In the embodiment of FIG. 12A, the LED light bulb 10a comprises two conductive supports 14a, 14b. In an embodiment, the LED light bulb may comprise more than two conductive supports 14a, 14b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 10a, 10b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen ($H_2$). The volume ratio of Hydrogen to the overall volume of the bulb shell 12 is from 5% to 50%. The air pressure inside the bulb shell may be 0.4 to 1.0 atm (atmosphere).

According to the embodiments of FIGS. 12A and 12B, each of the LED light bulbs 10a, 10b comprises a stem 19 in the bulb shell 12 and a heat dissipating element 17 between the bulb shell 12 and the bulb base 16. In the embodiment, the bulb base 16 is indirectly connected with the bulb shell 12 via the heat dissipating element 17. Alternatively, the bulb base 16 can be directly connected with the bulb shell 12 without the heat dissipating element 17. The LED filament 100 is connected with the stem 19 through the conductive supports 14a, 14b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 18. The exterior of the heat dissipating element 17 contacts outside gas for thermal conduction. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Referring to FIG. 12A, the height of the heat dissipating element 17 is L1 and the height from the bottom of the heat dissipating element 17 to the top of the bulb shell 12 is L2. The ratio of L1 to L2 is from 1/30 to 1/3. The lower the ratio, the higher the cutoff angle of illumination of the light bulb. In other words, the lower ratio increases the higher light-emission angle and the light from the bulb is closer to omnidirectional light.

Please referring to FIG. 12B, the LED filament 100 is bent to form a portion of a contour and to form a wave shape having wave crests and wave troughs. In the embodiment, the outline of the LED filament 100 is a circle when being observed in a top view and the LED filament 100 has the wave shape when being observed in a side view. Alternatively, the outline of the LED filament 100 can be a wave shape or a petal shape when being observed in a top view and the LED filament 100 can have the wave shape or a line shape when being observed in a side view. In order to appropriately support the LED filament 100, the LED light bulb 10b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 10b may comprise two LED filaments 100 or more. For example, one LED light bulb 10b may comprise two LED filaments 100 and each of the LED filaments 100 is bent to form approximately 180 degrees arc (semicircle). Two semicircle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Figure 13A:
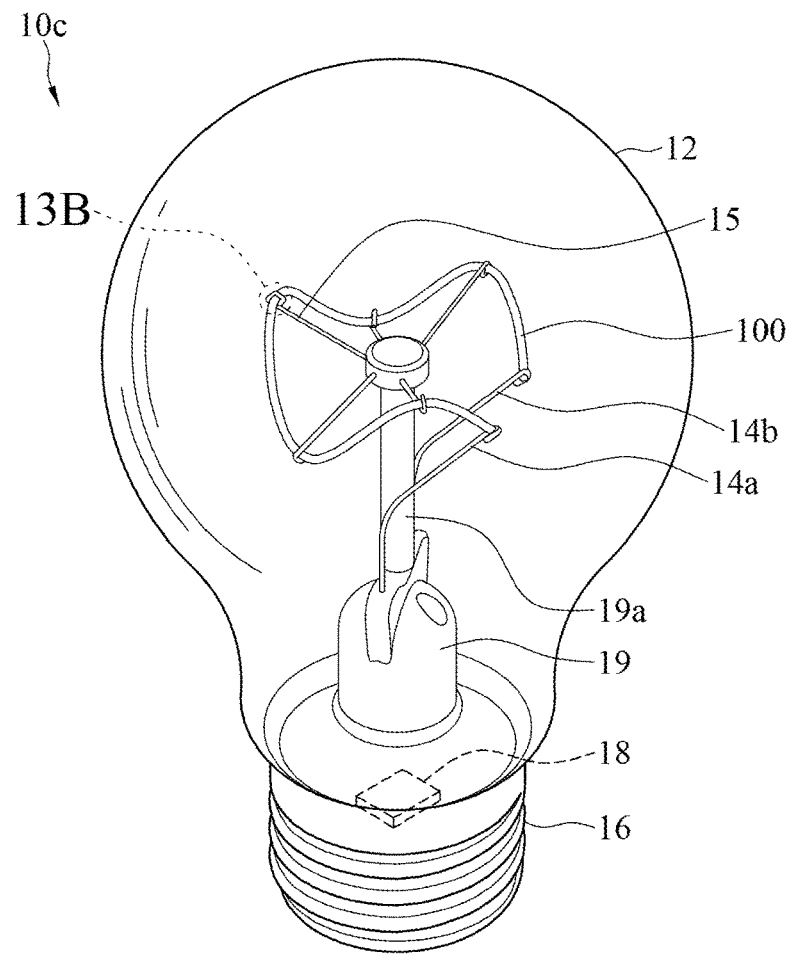
FIG. 13A illustrates a perspective view of an LED light bulb according to a third embodiment of the present disclosure.
Figure 14A:
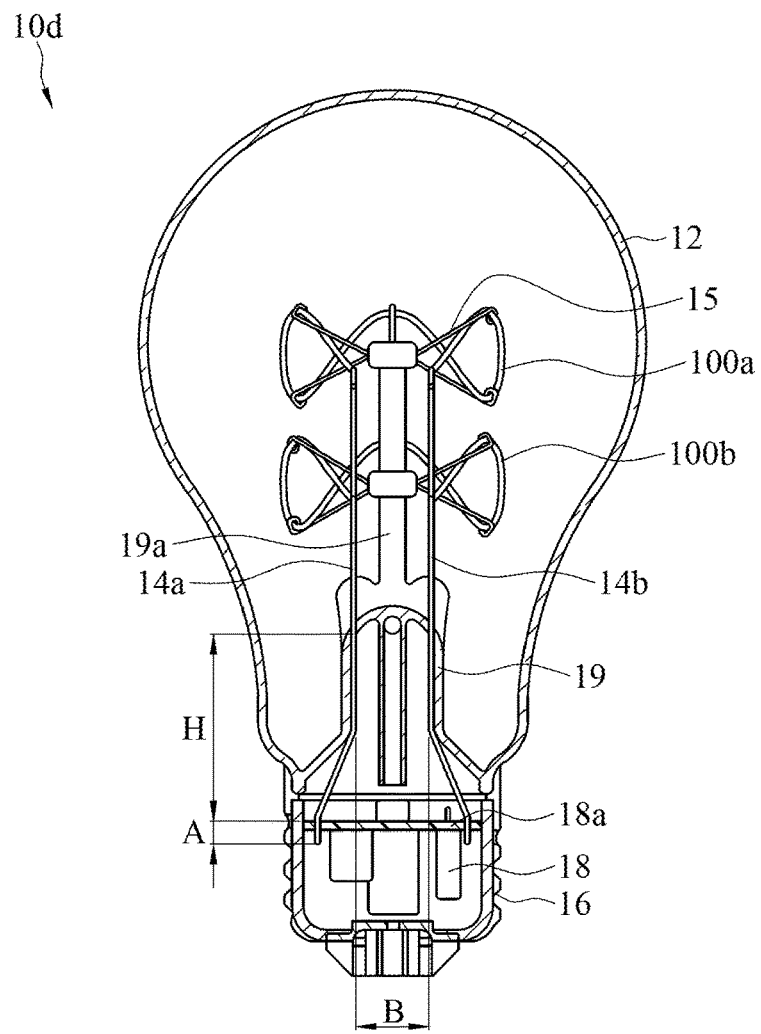
FIG. 14A illustrates a cross-sectional view of an LED light bulb according to a fourth embodiment of the present disclosure.

Please refer to FIG. 13A and FIG. 14A. FIG. 13A illustrates a perspective view of an LED light bulb according to a third embodiment of the present disclosure. FIG. 14A illustrates a cross-sectional view of an LED light bulb according to a fourth embodiment of the present disclosure. According to the third embodiment, the LED light bulb 10c comprises a bulb shell 12, a bulb base 16 connected with the bulb shell 12, two conductive supports 14a, 14b disposed in the bulb shell 12, a driving circuit 18 electrically connected with both the conductive supports 14a, 14b and the bulb base 16, a stem 19, supporting arms 15 and a single LED filament 100. The LED light bulb 10d of the fourth embodiment is similar to the third embodiment illustrated in FIG. 13A and comprises two LED filaments 100a, 100b arranged at the different vertical level in FIG. 14A. The LED filaments 100a, 100b are bent to form a contour from the top view of FIG. 14A.

The cross-sectional size of the LED filaments 100, 100a, 100b is small than that in the embodiments of FIGS. 12A and 12B. The conductive electrodes 110, 112 of the LED filaments 100, 100a, 100b are electrically connected with the conductive supports 14a, 14b to receive the electrical power from the driving circuit 18. The connection between the conductive supports 14a, 14b and the conductive electrodes 110, 112 may be a mechanical pressed connection or soldering connection. The mechanical connection may be formed by firstly passing the conductive supports 14a, 14b through the through holes 111, 113 (shown in FIG. 1 and secondly bending the free end of the conductive supports 14a, 14b to grip the conductive electrodes 110, 112. The soldering connection may be done by a soldering process with a silver-based alloy, a silver solder, a tin solder.

Similar to the first and second embodiments shown in FIGS. 12A and 12B, each of the LED filaments 100, 100a, 100b is bent to form a contour from the top view of FIGS. 13A and 14A. In the embodiments of FIGS. 13A, 14A, each of the LED filaments 100, 100a, 100b is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100, 100a, 100b. Please refer to FIG. 13B which illustrates an enlarged cross-sectional view of the dashed-line circle of FIG. 13A. The second end of each of the supporting arms 15 has a clamping portion 15a which clamps the body of the LED filament 100, 100a, 100b. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100, 100a, 100b. The dimension of the inner shape (through hole) of the clamping portion 15a may be a little bit smaller than the outer shape of the cross-section of the LED filament 100, 100a, 100b. During manufacturing process, the LED filament 100, 100a, 100b may be passed through the inner shape of the clamping portion 15a to form a tight fit. Alternatively, the clamping portion 15a may be formed by a bending process. Specifically, the LED filament 100, 100a, 100b may be placed on the second end of the supporting arm 15 and a clamping tooling is used to bend the second end into the clamping portion to clamp the LED filament 100, 100a, 100b.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 10c are close to that of the traditional light bulb including illumination brightness. The illumination uniformity of LED light bulb 10c is better. In the embodiment, at least a half of the LED filaments 100 is around a center axle of the LED light bulb 10c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100, 100a, 100b such that the supporting arms 15 are not used as connections for electrical power transmission. In an embodiment where the stem 19 is made of glass, the stem 19 would not be cracked or exploded because of the thermal expansion of the supporting arms 15 of the LED light bulb 10c.

Figure 13B:
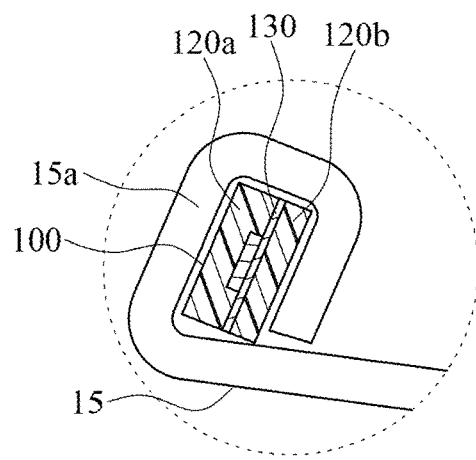
FIG. 13B illustrates an enlarged cross-sectional view of the dashed-line circle of FIG. 13A.

Since the inner shape (shape of through hole) of the clamping portion 15a fits the outer shape of the cross-section of the LED filament 100, the orientation of the cross-section of the LED filament 100, if necessary, may be properly adjusted. As shown in FIG. 13B, the top layer 120a is fixed to face around ten o'clock direction such that illumination surfaces of the LED filament 100 are facing substantially the same direction.

Figure 14B:
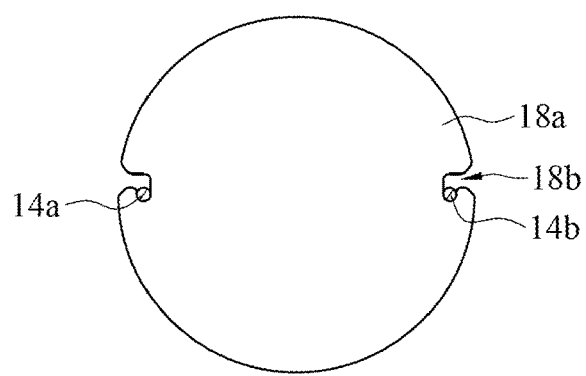
FIG. 14B illustrates the circuit board of the driving circuit of the LED light bulb according to the fourth embodiment of the present disclosure.

Please refer to FIG. 14B which illustrates the circuit board of the driving circuit of the LED light bulb from the top view of FIG. 14A according to the fourth embodiment of the present disclosure. The driving circuit 18 comprises a circuit board 18a which is fixed to the bulb base 16. The conductive supports 14a, 14b are electrically connected with the circuit board 18a and passes through the stand 19a to be electrically connected with the conductive electrodes 110, 112 of the LED filament 100a, 100b. The circuit board 18a comprises notches 18b. The notches 18b are of hook shape. The size of the tip of the notches 18b is slightly smaller than that of the cross-section of the conductive supports 14a, 14b for fixing the conductive supports 14a, 14b. The tip of the notches 18b is beneficial to the soldering between the circuit board 18a and the conductive supports 14a, 14b.

In the embodiments of FIGS. 13A and 14A, the length of the conductive supports 14a, 14b is better to meet the below equation to prevent two conductive supports 14a, 14b from short circuit or to prevent the conductive supports 14a, 14b from unable to reach the circuit board 18a.

$$L = A + \sqrt{((B-3.2)^2 + H^2)}$$

Wherein, referring to FIG. 14A, 3.2 is the electricity safety spacing; L is the calculated length of the conductive supports 14a, 14b and its unit is mini-meter; A is the sum of the thickness of the circuit board 18a and the height of the portion of the conductive supports 14a, 14b exposed from the surface of the circuit board 18a; B is the horizontal distance between the two conductive supports 14a, 14b; and H is the height from the circuit board 18a to the point the conductive supports 14a, 14b enters the stem 19. The actual length of the conductive supports 14a, 14b may be, but not limited to, between 0.5L and 2L, and more particularly between 0.75L and 1.5L.

In the embodiment of FIG. 14A, the LED light bulb 10d has two LED filaments 100a, 100b disposed on different vertical levels. The conductive supports 14a, 14b for the upper LED filaments 100a has a length Z=L+Y. Y is the distance between the upper LED filament 100a and the lower LED filament 100b.

Figure 15A:
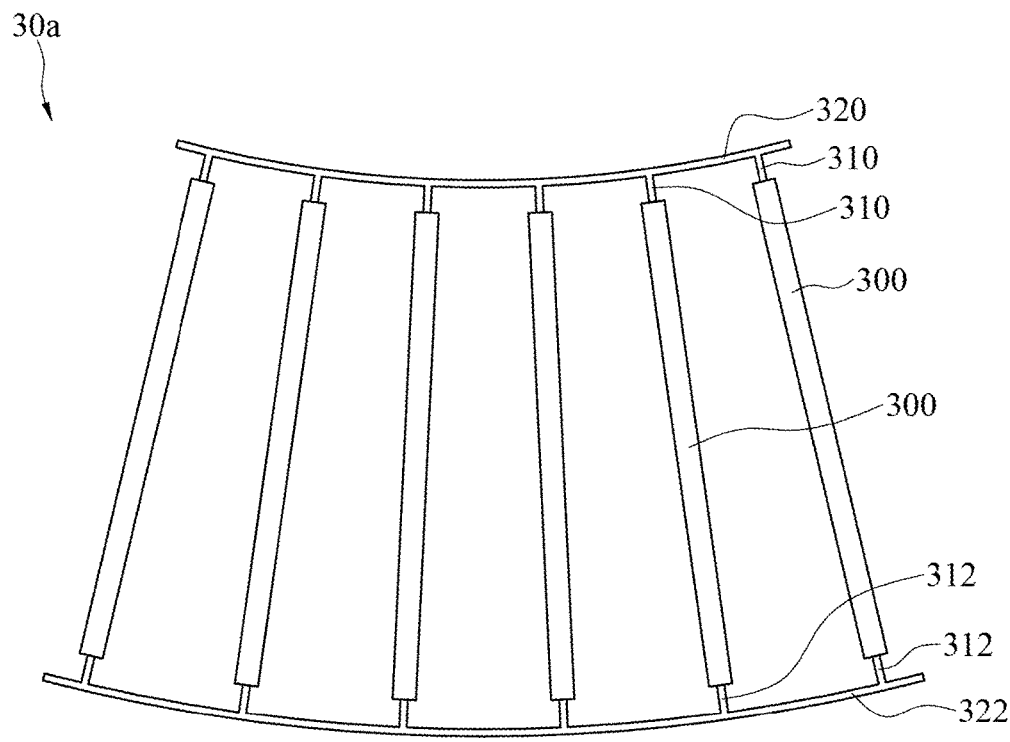
FIGS. 15A to 15D illustrate top views of LED filament modules according to embodiments of the present disclosure.

Please refer to FIG. 15A. FIG. 15A illustrates a top view of an LED filament module 30a according to an embodiment of the present disclosure. Specifically, the LED filament module 30a shown in FIG. 15A is not shaped yet and is going to be shaped by a jig. A shaping process of the LED filament module 30a is described later. As shown in FIG. 15A, the LED filament module 30a comprises a plurality of LED filaments 300, a first connecting portion 320, and a second connecting portion 322. Two conductive electrodes 310, 312 of each of the LED filaments 300 are respectively connected to the first connecting portion 320 and the second connecting portion 322. In the embodiment, the LED filament 300 can be referred to, but not limited to, the aforementioned description of the LED filaments 100, 200 regarding structures, materials, and manufacturing processes. In other embodiments, the LED filament 300 can be different from the LED filaments 100, 200. For example, the LED filament 300 can comprise a substrate such as glass and therefore is harder than the LED filaments 100, 200.

In the embodiment, a difference between the LED filament 300 and the LED filaments 100, 200 is that all of the conductive electrodes 310 of the LED filaments 300 are connected to the first connecting portion 320, and all of the conductive electrodes 312 of the LED filaments 300 are connected to the second connecting portion 322. In the embodiment, the LED filaments 300, the first connecting portion 320, and the second connecting portion 322 are formed in a manufacturing process. In the embodiment, the first step of a manufacturing process of the LED filament module 30a is that the conductive electrodes 310 are formed with the first connecting portion 320, and the conductive electrodes 312 are formed with the second connecting portion 322. For example, the conductive electrodes 310 and the first connecting portion 320 are formed in a molding process, and the conductive electrodes 312 and the second connecting portion 322 are formed in another molding process. Alternatively, the conductive electrodes 310 are respectively soldered to the first connecting portion 320 in a soldering process, and the conductive electrodes 312 are respectively soldered to the second connecting portion 322 in another soldering process. The molding process is efficiency since the molded elements (e.g., the conductive electrodes 310 and the first connecting portion 320) can be formed in single procedure. The soldering process is easily practiced since the soldered elements can be soldered along two dimension directions but not three dimension directions.

The second step of the manufacturing process of the LED filament module 30a is that the LED filaments 300 are formed and are respectively connected to the conductive electrodes 310 and the conductive electrodes 312. A manufacturing process of the LED filaments 300 can be referred to, but not limited to, that of the LED filaments 100, 200 described above. The LED filaments 300, the first connecting portion 320, and the second connecting portion 322 are formed on a two-dimension plane into a two dimensional form in the beginning, which is benefit to productivity and is of convenience regarding manufacturing, and are going to be shaped into three-dimension pose in a later process.

The first connecting portion 320 and the second connecting portion 322 are made by materials with conductibility. That is to say, currents can flow between the first connecting portion 320, the LED filaments 300, and the second connecting portion 322. For example, the first connecting portion 320 can be anode of the LED filament module 30a, and the second connecting portion 322 can be cathode of the LED filament module 30a. Under the circumstances, the LED filaments 300 are connected in parallel. One power line of a power source are connected to the first connecting portion 320, and the other one power line of the power source are connected to the second connecting portion 322. Positive charges flow into the LED filaments 300 via the first connecting portion 320 and the conductive electrodes 310, and positive charges leave the LED filaments 300 via the conductive electrodes 312 and the second connecting portion 322.

In the embodiment, the LED filament module 30a being not shaped yet has a sector outline in the top view. The first connecting portion 320 and the second connecting portion 322 respectively have arc shapes. The arc length of the first connecting portion 320 is less than that of the second connecting portion 322.

Figure 15B:
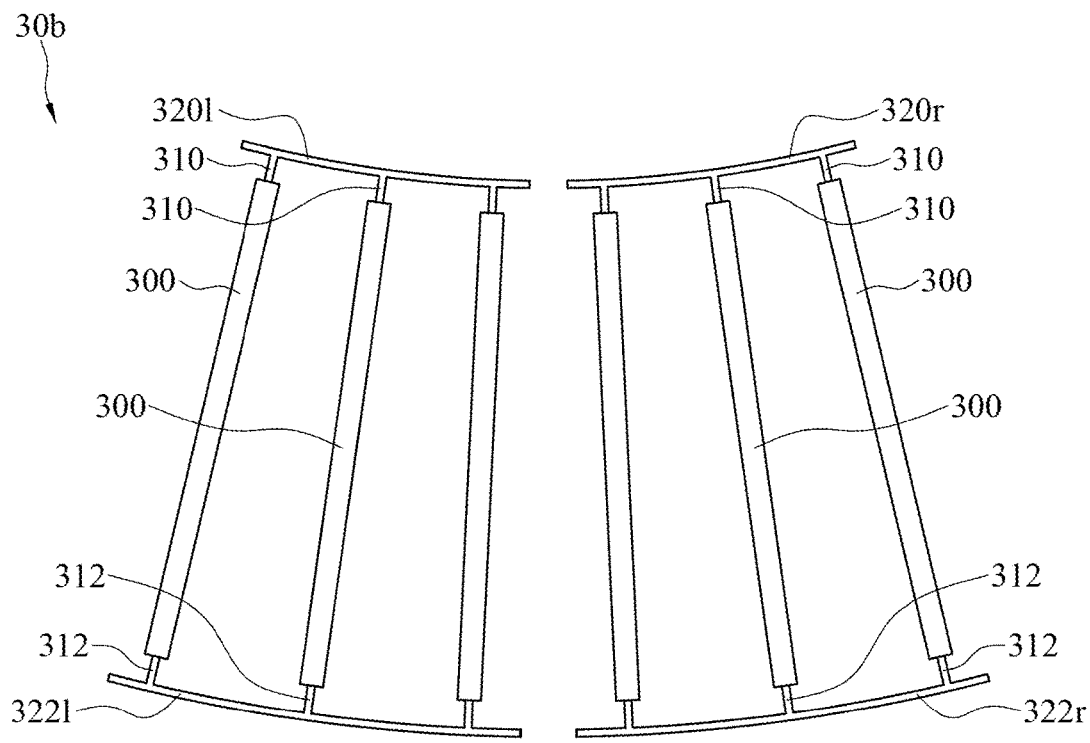

Please refer to FIG. 15B. FIG. 15B illustrates a top view of an LED filament module 30b according to an embodiment of the present disclosure. The LED filament module 30b is analogous to and can be referred to the LED filament module 30a. A difference between the LED filament modules 30a and 30b is that the LED filament module 30b is separated into two parts. The first connecting portion 320 of the LED filament module 30a is separated into first connecting portions 320l and 320r of the LED filament module 30b. The second connecting portion 322 of the LED filament module 30a is separated into second connecting portions 322l and 322r of the LED filament module 30b. A number of the all LED filaments 300, e.g., three of the six LED filaments 300, are connected with the first connecting portions 320l and the second connecting portions 322l. The others of the all LED filaments 300, e.g., the other three of the six LED filaments 300, are connected with the first connecting portions 320r and the second connecting portions 322r. The separated LED filament module 30b is benefit to manufacture and transportation and may be easier to be shaped and to be assembled to an LED light bulb.

Figure 15C:
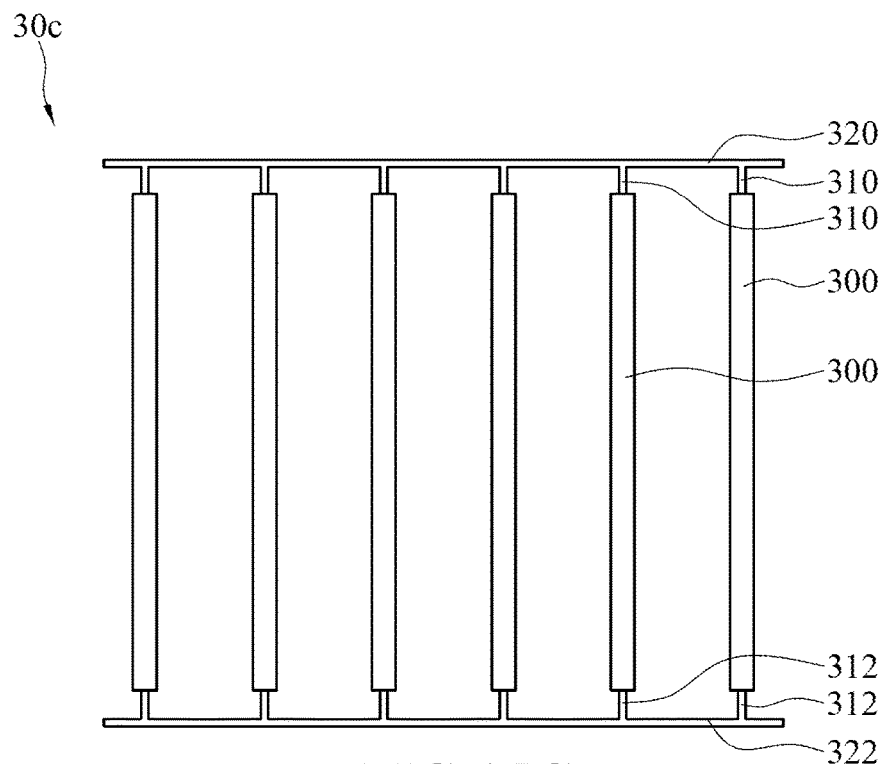

Please refer to FIG. 15C. FIG. 15C illustrates a top view of an LED filament module 30c according to an embodiment of the present disclosure. The LED filament module 30c is analogous to and can be referred to the LED filament module 30a. A difference between the LED filament module 30c and the LED filament module 30a is that the LED filament module 30c being not shaped yet has a rectangular outline in the top view. The first connecting portion 320 and the second connecting portion 322 of the LED filament module 30c respectively have straight shapes. The straight length of the first connecting portion 320 is substantially equal to that of the second connecting portion 322.

Figure 15D:
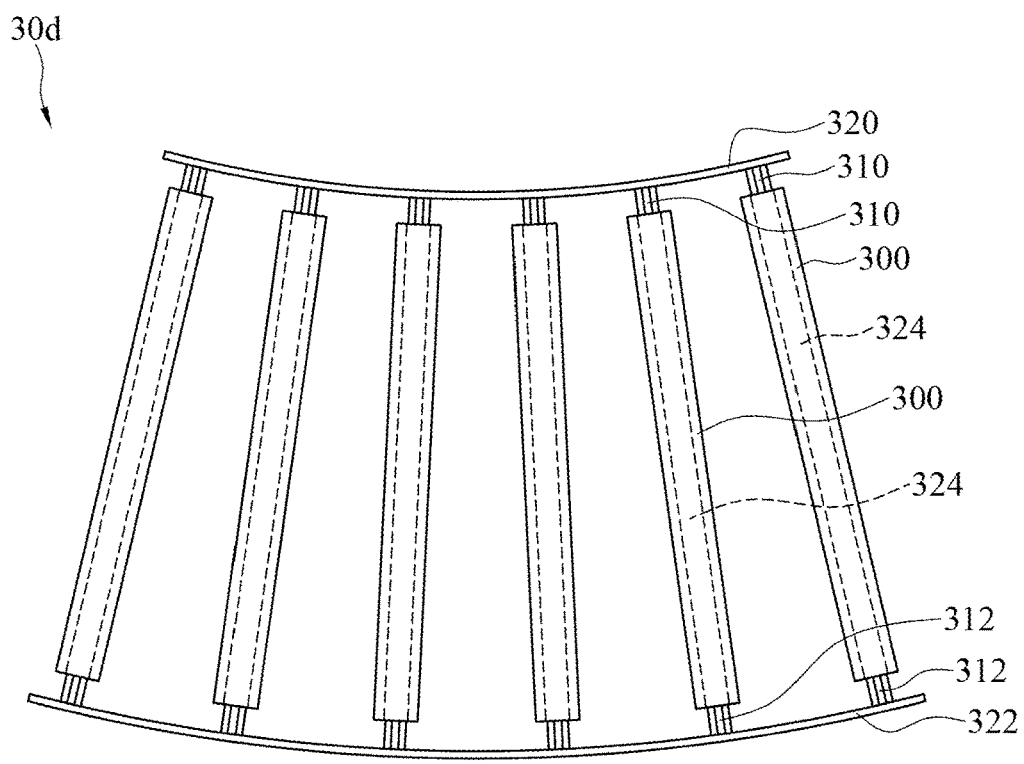

Please refer to FIG. 15D. FIG. 15D illustrates a top view of an LED filament module 30d according to an embodiment of the present disclosure. The LED filament module 30d is analogous to and can be referred to the LED filament module 30a. A difference between the LED filament module 30d and the LED filament module 30a is that the LED filament module 30d further comprises a plurality of filament brackets 324. The filament brackets 324 are connected between the first connecting portion 320 and the second connecting portion 322. Each of the LED filaments 300 is respectively attached to each of the filament brackets 324. Each of the filament brackets 324 respectively extends along an axial direction (longitudinal direction) of the respective one of the LED filaments 300 from the first connecting portion 320 to the second connecting portion 322. The conductive electrodes 310, 312 of each of the LED filaments 300 are respectively connected to the first connecting portion 320 and the second connecting portion 322. The LED filament module 30d is stronger than the LED filament module 30 since the filament brackets 324 can hold and support the LED filaments 300. In the embodiment, the first connecting portion 320, the filament brackets 324 and the second connecting portion 322 may be made into a one-piece component. In a case that the one-piece component of the first connecting portion 320, the filament brackets 324 and the second connecting portion 322 is made by insulation materials, the LED filaments 300 of the LED filament module 30d can be individually connected to an outer power source via power lines respectively connected to the conductive electrodes 310, 312. In a case that the one-piece component of the first connecting portion 320, the filament brackets 324 and the second connecting portion 322 is made by conductive materials, the first connecting portion 320 and the second connecting portion 322 can be respectively anode and cathode of the LED filament module 30d, and currents can flow through each of the LED filaments 300 in one direction to avoid short circuit in a circuit-arrangement manner (e.g., diodes can be added in the circuit) or a mechanic-arrangement manner. The circuit-arrangement manner can be, for example, diodes can be added in the circuit to restrain the direction of the currents. The mechanic-arrangement manner is described as following examples.

Figure 15E:
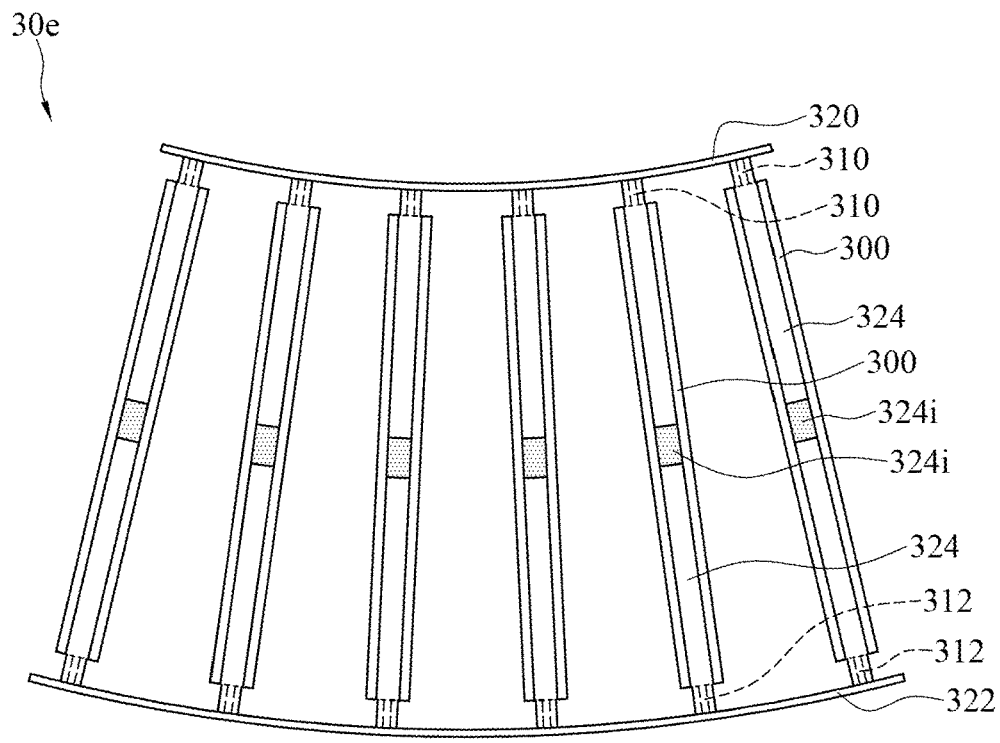
FIGS. 15E and 15F illustrate bottom views of LED filament modules according to embodiments of the present disclosure.

Please refer to FIG. 15E. FIG. 15E illustrates a bottom view of an LED filament module 30e according to an embodiment of the present disclosure. The LED filament module 30e is analogous to and can be referred to the LED filament module 30d. The viewing angle of FIG. 15E is opposite to that of FIG. 15D; therefore, the LED filaments 300 and the conductive electrodes 310, 312 are in rear of the filament brackets 324 in FIG. 15E. A difference between the LED filament module 30e and the LED filament module 30d is that each of the filament brackets 324 of the LED filament module 30e comprises an insulation portion 324i. Specifically, the first connecting portion 320, the second connecting portion 322, and the filament brackets 324 are made by conductive materials except the insulation portions 324i of the filament brackets 324. The insulation portions 324i are made by insulation materials. The design of the insulation portions 324i of the filament brackets 324 can be considered as forming a circuit loop in a mechanic-arrangement manner, which allows currents to flow through each of the LED filaments 300 in one direction and inhibits the currents from flowing through the filament brackets 324 due to the insulation portions 324i to avoid short circuit. The first connecting portion 320, the second connecting portion 322, the filament brackets 324, and the insulation portions 324i can be formed into a one-piece component by a double-molding process, metal injection molding process, or the like.

Figure 15F:
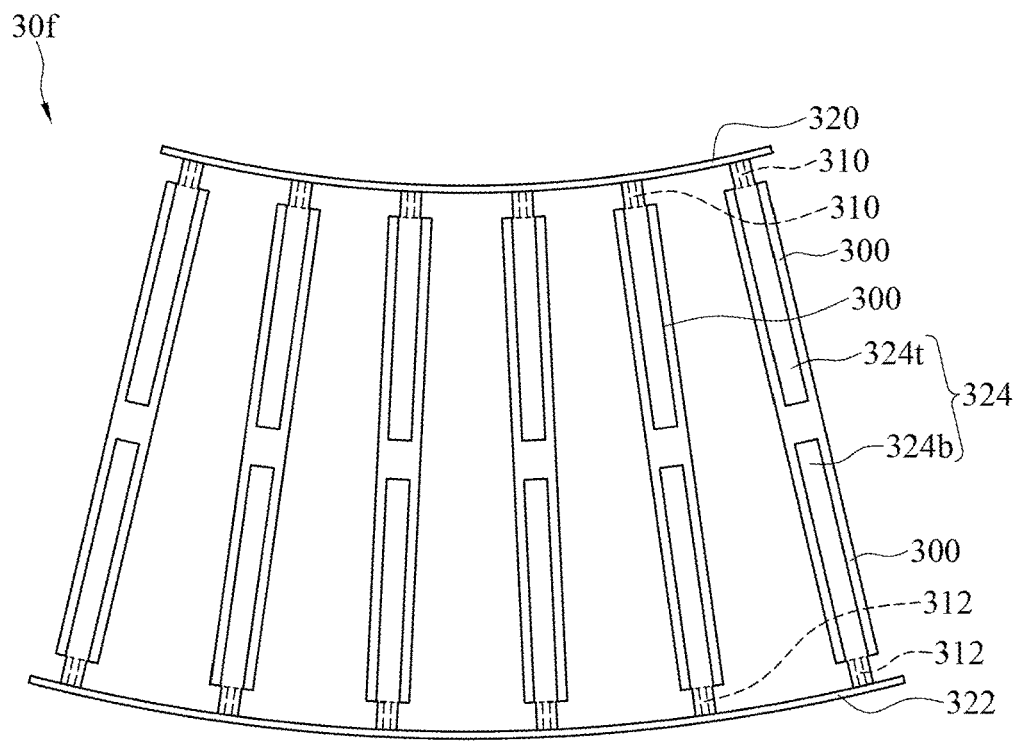

Please refer to FIG. 15F. FIG. 15F illustrates a bottom view of an LED filament module 30f according to an embodiment of the present disclosure. The LED filament module 30f is analogous to and can be referred to the LED filament module 30e. A difference between the LED filament module 30f and the LED filament module 30e is that each of the filament brackets 324 of the LED filament module 30f is separated into two parts, i.e., a top filament bracket 324t and a bottom filament bracket 324b. The top filament brackets 324t are connected with the first connecting portion 320 and extend along the axial direction of the respective one of the LED filaments 300, but the length of the top filament bracket 324t is less than a half of the length of the LED filament 300. The bottom filament brackets 324b are connected with the second connecting portion 322 and extend along the axial direction of the respective one of the LED filaments 300, but the length of the top filament bracket 324b is less than a half of the length of the LED filament 300. The top filament brackets 324t and the bottom filament brackets 324b are physically separated; therefore, currents do not flow through the filament brackets 324. The design of the top filament bracket 324t and the bottom filament bracket 324b of the filament brackets 324 can be considered as forming a circuit loop in a mechanic-arrangement manner, which allows the currents to flow through each of the LED filaments 300 in one direction.

Figure 15G:
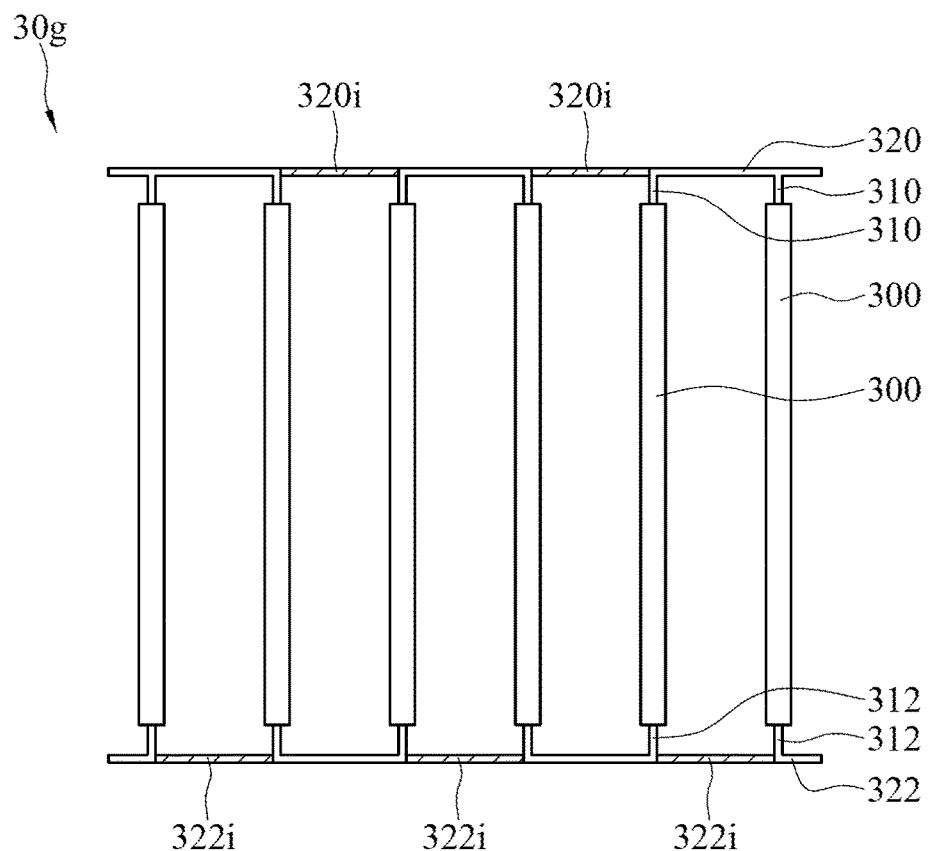
FIG. 15G illustrates a top view of an LED filament module according to another embodiment of the present disclosure.

Please refer to FIG. 15G. FIG. 15G illustrates a top view of an LED filament module 30g according to another embodiment of the present disclosure. The LED filament module 30g is analogous to and can be referred to the LED filament module 30c. A difference between the LED filament module 30g and the LED filament module 30c is that the first connecting portion 320 further comprises insulation portions 320i, and the second connecting portion 320 further comprises insulation portions 322i. Specifically, the first connecting portion 320 and the second connecting portion 322 are made by conductive materials except the insulation portions 320i and 322i. The insulation portions 320i and 322i are made by insulation materials. The insulation portions 320i and 322i are arranged in a staggered manner, meaning that the first insulation portions 322i are between the first LED filament 300 (the leftmost one in FIG. 15G) and the second LED filament 300 (next to the leftmost one in FIG. 15G), the first insulation portions 320i are between the second and the third LED filaments 300, the second insulation portions 322i are between the third and the fourth LED filaments 300, and so on. The design of the insulation portions 320i and 322i of the first and the second connecting portions 320 and 322 can be considered as forming a circuit loop in a mechanic-arrangement manner, which allows currents to flow through each of the LED filaments 300 in one direction.

Figure 15H:
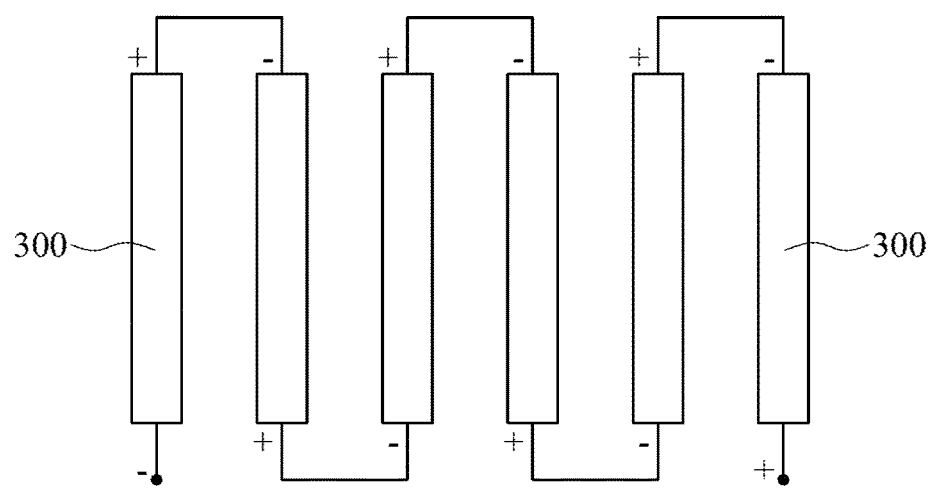
FIG. 15H illustrates a schematic circuit of the LED filament module of FIG. 15G.

Please refer to FIG. 15H. FIG. 15H illustrates a schematic circuit of the LED filament module 30g of FIG. 15G. Currents do not flow through the insulation portions 320i and 322i of the first and the second connecting portions 320 and 322; therefore, the LED filaments 300 are connected in series. The conductive electrode 312 of the leftmost LED filament 300 in FIG. 15G can be cathode, and the conductive electrode 312 of the rightmost LED filament 300 in FIG. 15G can be anode. Positive charges flow into the LED filaments 300 via the second connecting portion 322 and the conductive electrode 312 of the rightmost LED filament 300 in FIG. 15G, flow through the LED filaments 300 in sequence from the rightmost one to the leftmost one, and leave the LED filaments 300 via the conductive electrode 312 of the leftmost LED filament 300 in FIG. 15G and the second connecting portion 322.

Figure 15I:
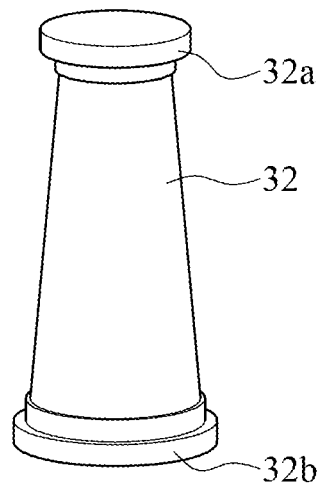
FIG. 15I illustrates a perspective view of a jig for shaping the LED filament module according to an embodiment of the present disclosure.

Please refer to FIG. 15I. FIG. 15I illustrates a perspective view of a jig 32 for shaping the LED filament module according to an embodiment of the present disclosure. The jig 32 comprises a first limiting portion 32a and a second limiting portion 32b. The first limiting portion 32a and the second limiting portion 32b are respectively connected to two opposite ends of the jig 32. The first limiting portion 32a and the second limiting portion 32b respectively form a cap shape with respect to the jig 32. In particular, the cross-sectional size of the first limiting portion 32a in the radial direction is greater than that of the end of the jig 32 to which the first limiting portion 32a is connected, and the cross-sectional size of the second limiting portion 32b in the radial direction is greater than that of the end of the jig 32 to which the second limiting portion 32b is connected. The jig 32 has a shape of frustum of a cone, meaning that the two opposite ends of the jig 32 have different cross-sectional sizes. The perimeter of jig 32 gradually increases from the end connected the first limiting portion 32a to the end connected to the second limiting portion 32b. The different perimeters of the two opposite ends of the jig 32 are corresponding to the different arc lengths of the first connecting portion 320 and the second connecting portion 322. The jig 32 is utilized for shaping the LED filament module into a predetermined shape, e.g., a column shape or a frustum shape.

Figure 15J:
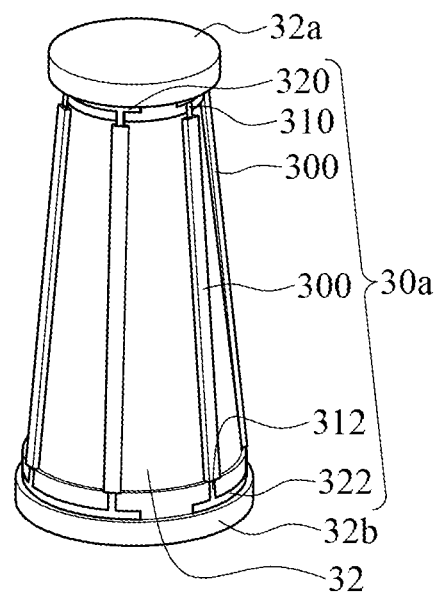
FIG. 15J illustrates a perspective view of the LED filament module of FIG. 15A being shaped by the jig.
Figure 15K:
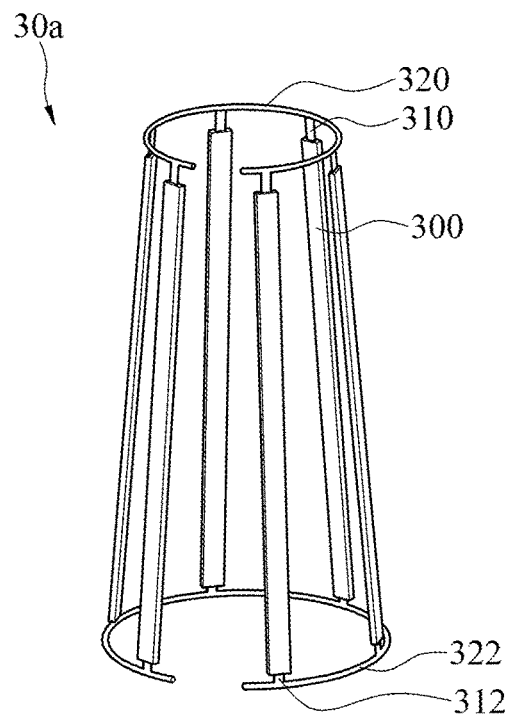
FIG. 15K illustrates a perspective view of the shaped LED filament module of FIG. 15A.

Please refer to FIG. 15J and FIG. 15K. FIG. 15J illustrates a perspective view of the LED filament module 30a being shaped by the jig 32 according to the embodiment of the present disclosure. FIG. 15K illustrates a perspective view of the shaped LED filament module 30a according to the embodiment of the present disclosure. The LED filament module 30a is forced to attach to and around the jig 32 and is shaped into a three dimensional form with a shape of frustum of a cone. The first connecting portion 320 and the second connecting portion 322 are bent to be turned from straight line shape into curve shape to fit the jig 32, and the LED filaments 300 are around the jig 32 along with the bended first connecting portion 320 and second connecting portion 322. During the shaping process of the LED filament module 30a, the first limiting portion 32a limits the first connecting portion 320, and the second limiting portion 32b limits the second connecting portion 322; therefore, the LED filament module 30a which is being shaped can be kept between the first limiting portion 32a and the second limiting portion 32b. After the shaped LED filament module 30a is detached from the jig 32, the shaped LED filament module 30a is turned from two dimensional form (as shown in FIG. 15A) into three dimensional form with the shape of frustum of a cone (as shown in FIG. 15K).

In some embodiment, the jig 32 can have a shape different from the shape shown in FIG. 15I. The jig 32 having a column shape can be utilized for shaping the LED filament module 30c which has a rectangular shape in the beginning into a column shape. For example, the LED filament module 30c shown in FIG. 15C can be shaped by the jig 32 having a column shape. The shaped LED filament module 30c will have a column shape, accordingly.

Figure 15L:
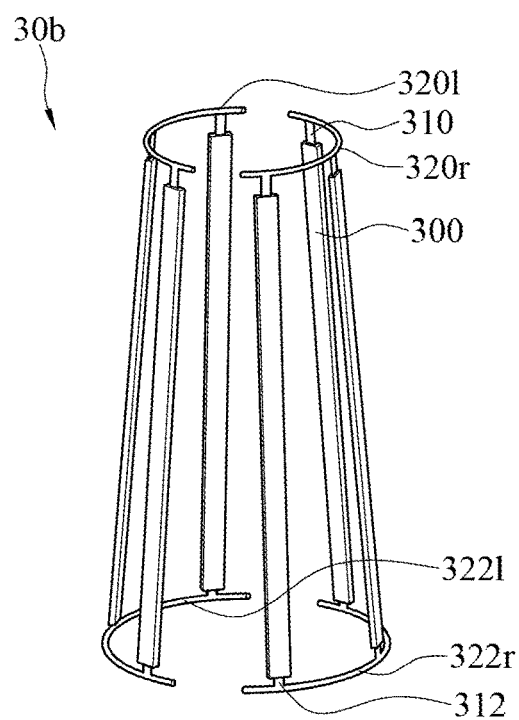
FIG. 15L illustrates a perspective view of the shaped LED filament module of FIG. 15B.

Please refer to FIG. 15L. FIG. 15L illustrates a perspective view of the shaped LED filament module 30b of FIG. 15B. The separated LED filament module 30b can also be shaped by the jig 32 of FIG. 15I. In some embodiments, the separated parts of the LED filament module 30b can be shaped in one shaping process. In other embodiments, the separated parts of the LED filament module 30b can be shaped one by one or be shaped by different jigs 32.

According to above description, the LED filament module 30a-30g may have a first type and a second type. The LED filaments 300, the first connecting portion 320, and the second connecting portion 322 of the first type are in a three dimensional form, as shown in FIGS. 15K and 15L. The LED filaments 300, the first connecting portion 320, and the second connecting portion 322 of the second type are in a two dimensional form, as shown in FIGS. 15A to 15G. In the embodiments, the LED filaments 300, the first connecting portion 320, and the second connecting portion 322 of the second type may be formed in advance in the beginning and, optionally, be formed in one piece. Next, the shaping process is performed to have the LED filaments 300, the first connecting portion 320, and the second connecting portion 322 of the second type in the two dimensional form shaped into the LED filaments 300, the first connecting portion 320, and the second connecting portion 322 of the first type in the three dimensional form by the jig 32. It is advantageous to the manufacture of the LED filaments 300, the first connecting portion 320, and the second connecting portion 322 of the second type on the two-dimension plane. Nevertheless, in some embodiments, the LED filaments 300, the first connecting portion 320, and the second connecting portion 322 of the first type may be formed directly in the beginning and, optionally, be formed in one piece. In other words, the LED filament module 30a-30g may have the first type only and have no need of the shaping process for shaping the second type into the first type.

In some embodiments, in the first type of the LED filament module, at least one (preferably both) of the first connecting portion and the second connecting portion is substantially a torus surrounding a center axle (e.g. the center axle of the bulb shell). The term "torus" means a shape surrounding a center and is not limited to a circle shape but can be any geometric shape (e.g. triangle shape, or rectangular shape, or polygonal shape, etc), In some embodiments, at least one of the first connecting portion and the second connecting portion has an opening for the purpose of arranging the direction of current or avoiding a short circuit.

Figure 16A:
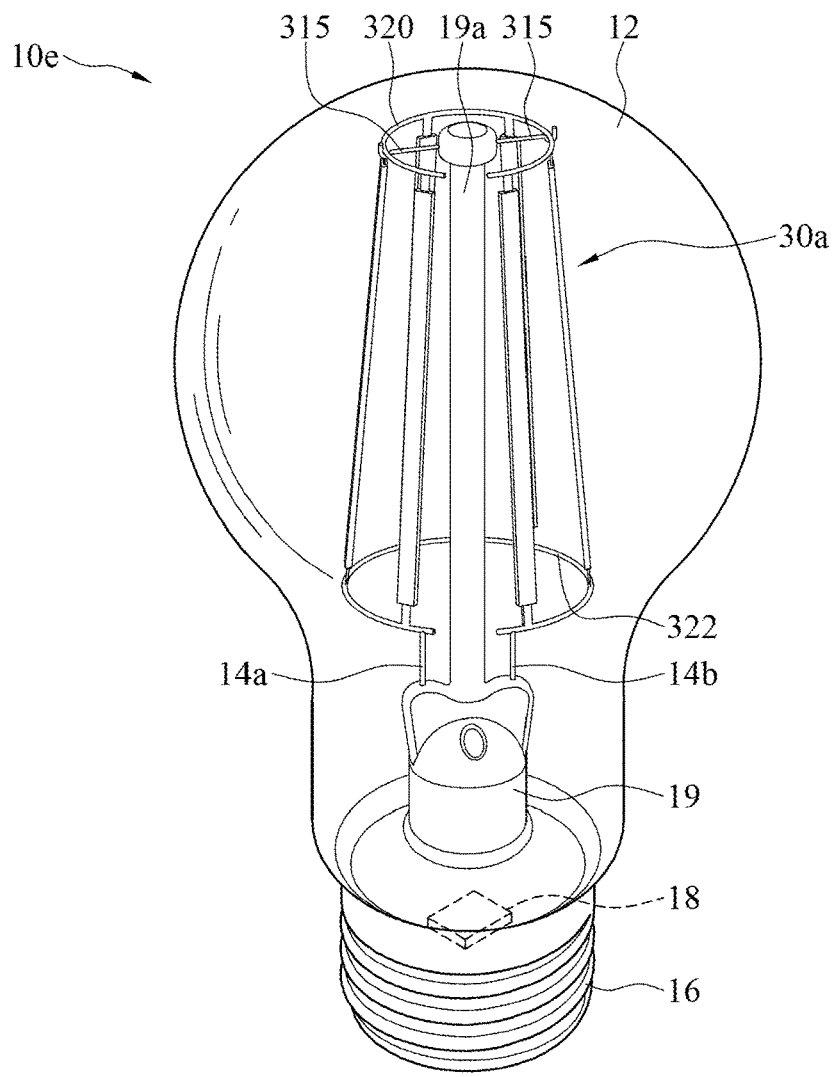
FIG. 16A illustrates a perspective view of an LED light bulb according to another embodiment of the present disclosure.

Please refer to FIG. 16A. Please FIG. 16A illustrates a perspective view of an LED light bulb 10e according to another embodiment of the present disclosure. The LED light bulb 10e is analogous to and can be referred to the LED light bulb 10c shown in FIG. 13A. Differences between the LED light bulb 10e and the LED light bulb 10c are that the LED light bulb 10e utilizes the LED filament module 30a and non-conductive supporting arms 315. The LED light bulb 10e comprises a bulb shell 12, a bulb base 16 connected with the bulb shell 12, two conductive supports 14a, 14b disposed in the bulb shell 12, a driving circuit 18 electrically connected with both the conductive supports 14a, 14b and the bulb base 16, a stem 19, the supporting arms 315, and the LED filament module 30a. The stem 19 in the bulb shell 12 has a stand 19a extending to the center of the bulb shell 12. The supporting arms 315 are fixed to the stand 19a of the stem 19. The shaped LED filament module 30a is assembled to the supporting arms 315. The first connecting portion 320 is supported by the supporting arms 315. In the embodiment, the first connecting portion 320 is hung on the supporting arms 315. The shaped LED filament module 30a is around the stand 19a. The LED filament module 30a is electrically connected with the conductive supports 14a, 14b to receive the electrical power from the driving circuit 18. The second connecting portion 322 larger than the first connecting portion 320 (i.e., the arc length of the second connecting portion 322 is larger than that of the first connecting portion 320) is closer to the bulb base 16 than the first connecting portion 320, which helps the stability of the configuration of the LED filament module 30a of which the first connecting portion 320 is hung on the supporting arms 315.

Figure 16B:
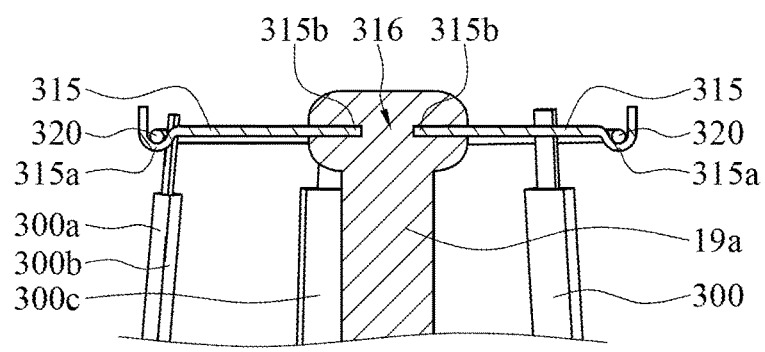
FIG. 16B illustrates a partial cross-sectional view of FIG. 16A.

Please refer to FIG. 16B. FIG. 16B illustrates a partial cross-sectional view of FIG. 16A. The supporting arm 315 comprises a hook end 315a and a fixed end 315b. In the embodiment, the number of the supporting arm 315 is, but not limited to, two. The fixed ends 315b of the supporting arms 315 are embedded into the stand 19a but not connected with each other. There is a gap 316 between the fixed ends 315b in the stand 19a to keep the supporting arms 315 being not electrically connected with each other, i.e., the supporting arms 315 are insulated from each other. The hook ends 315a of the supporting arms 315 extend radially from the stand 19a. The hook end 315a forms a hook structure such that the first connecting portion 320 can be hung on the hook structures of the hook ends 315a of the supporting arms 315. In some embodiments, a greater curvature of the hook structure of the hook ends 315a can be adopted to allow the first connecting portion 320 to be tightly fitted in the hook structure so as to meet the requirement of fixation between the supporting arms 315 and the first connecting portion 320.

In the embodiment, the current loop comprises the LED filament module 30a, the conductive supports 14a, 14b, the driving circuit 18, and an outer power source. Currents do not flow through the supporting arms 315 since the supporting arms 315 are not electrically connected with each other, and the stem 19 and the stand 19a are made by insulation materials. As a result, the risk of electrocorrosion regarding the supporting arms 315 can be avoided.

As shown in FIG. 16A, the second connecting portion 322 is connected with the conductive supports 14a, 14b. In some embodiments, the conductive support 14a is connected to one end of the second connecting portion 322 while the conductive support 14b is connected to another end of the second connecting portion 322. The LED filament module 30a can form a circuit loop with an outer power source in a circuit-arrangement manner. Each of the LED filaments 300 can comprise a diode allowing current to flow through the LED filaments 300 in one direction. Accordingly, the LED filaments 300 are connected in series. For example, positive charges flow into the LED filament module 30a via the conductive support 14a, and then flow through, in sequence, the second connecting portion 322, the first one of the LED filaments 300, the first connecting portion 320, the second one of the LED filaments 300, the second connecting portion 322, the third one of the LED filaments 300, and so on. Finally, positive charges flow through the last one of the LED filaments 300 and leave the LED filament module 30a via the conductive support 14b. Alternatively, the LED filament module 30a can form a circuit loop with an outer power source in a mechanic-arrangement manner. The distance between the second connecting portion 322 and the stem 19 is shorter than that between the first connecting portion 320 and the stem 19; therefore, the conductive supports 14a, 14b both connected to the second connecting portion 322 have relative shorter lengths and a better supporting effect to keep the LED filament module 30a steady and avoid swaying. In other embodiments, the conductive supports 14a, 14b can be connected to the first connecting portion 320. In other embodiments, the conductive supports 14a, 14b can be respectively connected to the first connecting portion 320 and the second connecting portion 322. Under the circumstances, the LED filaments 300 may be connected in parallel.

As shown in FIG. 16B, each of the LED filaments 300 comprises a main illuminating face 300a and secondary illuminating faces 300b, 300c. A front side of each of the LED chips 102, 104 (referring to the LED filament 100 of FIG. 1) faces the main illuminating face 300a. The front side is the side the most emitted light passes through. A rear side of each of the LED chips 102, 104 (referring to the LED filament 100 of FIG. 1) faces the secondary illuminating face 300c. The secondary illuminating face 300b are between the main illuminating face 300a and the secondary illuminating face 300c. As shown in FIG. 16B, the main illuminating faces 300a of all of the LED filaments 300 face toward outside of the LED light bulb 10e. Depending on the needs, the main illuminating faces 300a of a part of the LED filaments 300 face toward outside of the LED light bulb 10e, and the secondary illuminating faces 300b or 300c of another part of the LED filaments 300 face toward outside of the LED light bulb 10e. Alternatively, the main illuminating faces 300a of all of the LED filaments 300 face toward inside of the LED light bulb 10e (face toward the stand 19a).

In some embodiments, the LED filament 300 may comprise through holes (not shown). The through holes penetrate through the light conversion coating 120 (referring to the LED filament 100 of FIG. 1) and are corresponding to the LED chips 102, 104. Light emitted from the LED chips 102, 104 can directly pass through the through holes.

In the embodiments, all of the LED filaments 300 of the LED filament module 30a are equally spaced. In some embodiments, the LED filaments 300 of the LED filament module 30a may be not equally spaced, i.e., unequally spaced. For example, a part of the LED filaments 300 are crowded together, and another part of the LED filaments 300 are scattered. An interval between each two of the crowded LED filaments 300 is less than that between each two of the scattered LED filaments 300. Finally, an omnidirectional light circumstance with a partial emphasized illumination can be achieved because the part that the LED filaments 300 crowded together has better brightness.

In some embodiments, the LED filament module can be separated parts, as shown in FIG. 15L. It is benefit to a manufacturing procedure of the LED filament module 30. For example, the LED filament module 30a of the LED light bulb 10e shown in FIG. 16A can be replaced by the separated LED filament module 30b shown in FIG. 15L. Each of the separated parts includes a part of the first connecting portion 320 (e.g., 320l, 320r), a part of the second connecting portion 322 (e.g., 322l, 322r), and a number of the LED filaments 300. The separated parts can be assembled to each other by, for example, soldering the first connecting portion 320 and the second connecting portion 322. Alternatively, the separated parts can be assembled to the stand 19a by the supporting arms 315.

Figure 16C:
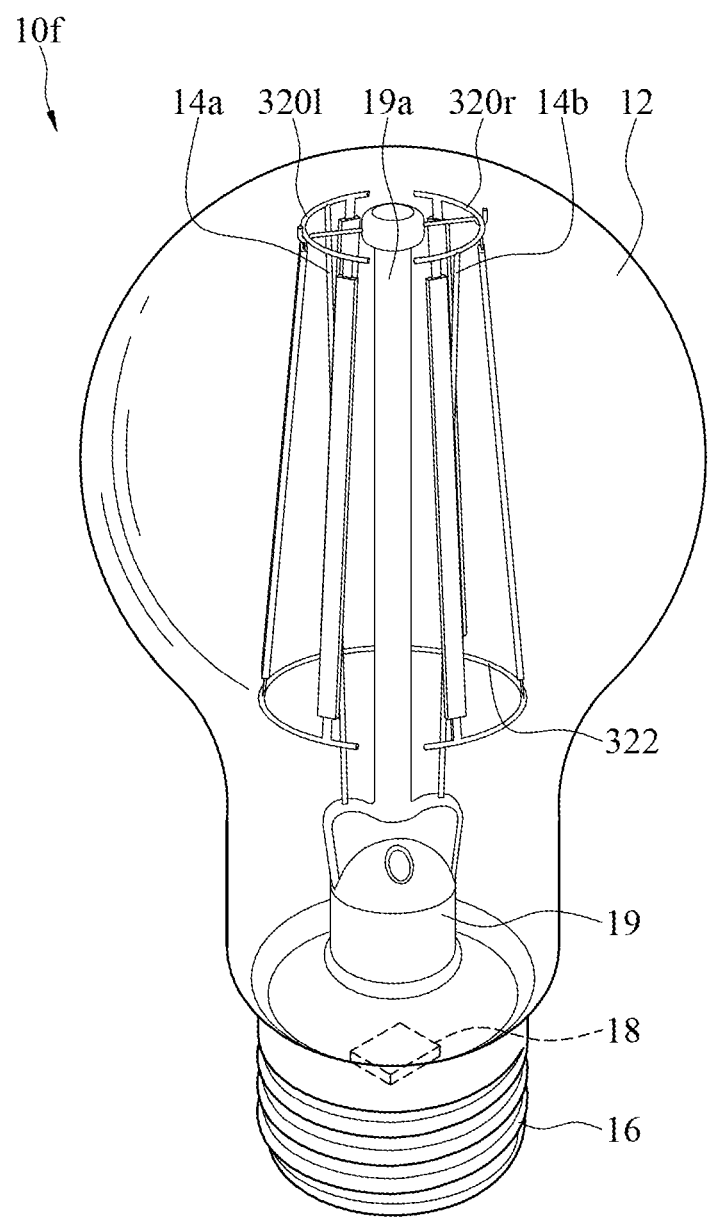
FIGS. 16C and 16D illustrate perspective views of LED light bulbs according to other embodiments of the present disclosure.

Please refer to FIG. 16C. FIG. 16C illustrates a perspective view of an LED light bulb 10f according to another embodiment of the present disclosure. The LED light bulb 10f is analogous to and can be referred to the LED light bulb 10e. Differences between the LED light bulb 10f and 10e are that the first connecting portion of the LED filament module of the LED light bulb 10f is separated into two parts, i.e., a first connecting portion 320l and a first connecting portion 320r, and the conductive supports 14a, 14b are respectively connected to the first connecting portion 320l and the first connecting portion 320r. The LED filament module can form a circuit loop in a circuit-arrangement manner (e.g., diodes can be added in the circuit) or a mechanic-arrangement manner (e.g., a parts of the first connecting portions 320l, 320r and the second connecting portion 322 can be insulated, and other parts of the first connecting portions 320l, 320r and the second connecting portion 322 can be conductive) so that currents can flow through each of the LED filaments 300 in one direction to avoid short circuit.

Figure 16D:
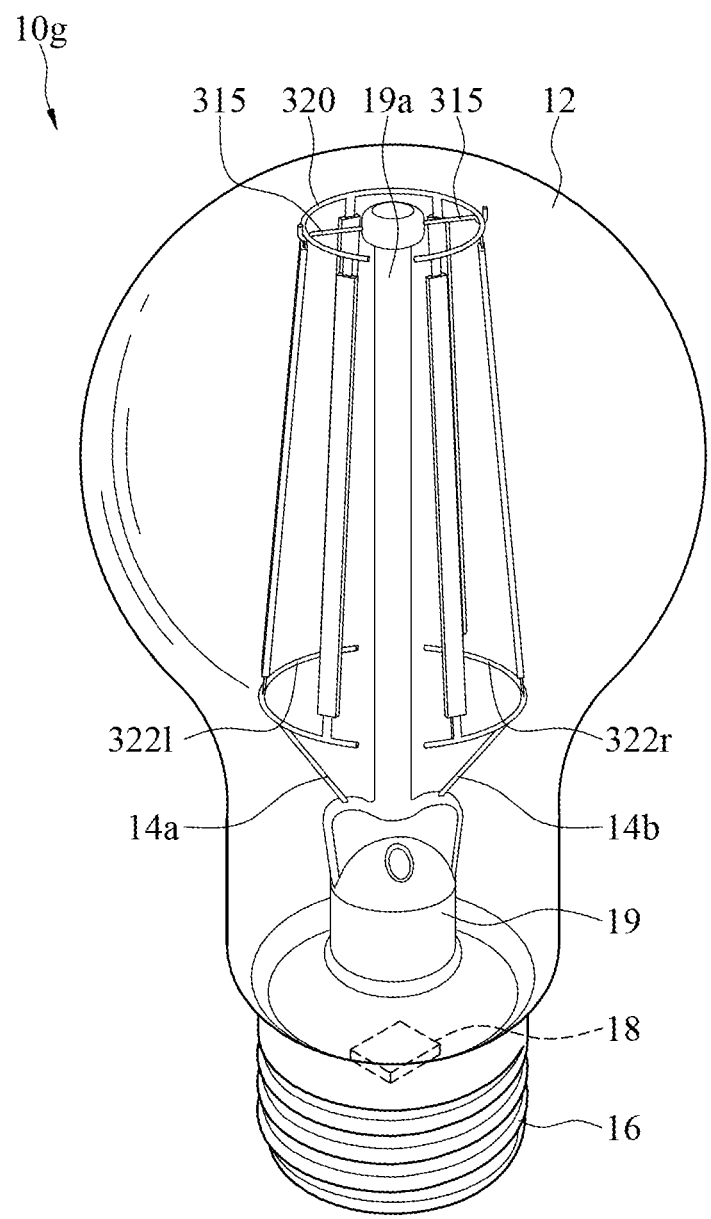

Please refer to FIG. 16D. FIG. 16D illustrates a perspective view of an LED light bulb 10g according to another embodiment of the present disclosure. The LED light bulb 10g is analogous to and can be referred to the LED light bulb 10e. Differences between the LED light bulb 10g and 10e are that the second connecting portion of the LED filament module of the LED light bulb 10g is separated into two parts, i.e., a second connecting portion 322l and a second connecting portion 322r, and the conductive supports 14a, 14b are respectively connected to the second connecting portion 322l and the second connecting portion 322r. Under the circumstances, the second connecting portion 322l can be anode, and the second connecting portion 322r can be cathode. The LED filament module can form a circuit loop in a circuit-arrangement manner (e.g., diodes can be added in the circuit) or a mechanic-arrangement manner (e.g., a parts of the first connecting portion 320 and the second connecting portions 322l, 322r can be insulated, and other parts of the first connecting portion 320 and the second connecting portions 322l, 322r can be conductive) so that currents can flow through each of the LED filaments 300 in one direction to avoid short circuit.

Figure 17A:
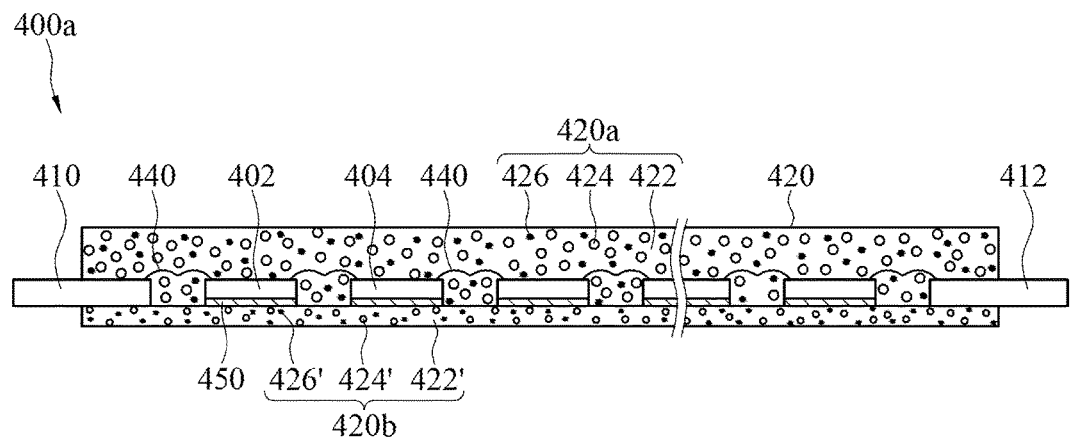
FIGS. 17A to 17G and FIG. 22 illustrate cross-sectional views of LED filaments according to embodiments of the present disclosure.

Please refer to FIG. 17A. FIG. 17A illustrates a cross-sectional view of an LED filament 400a according to an embodiment of the present disclosure. The LED filament 400a is analogous to and can be referred to the LED filament 100 with the top layer 120a and the base layer 120b. The LED filament 400a comprises LED chips 402, 404, conductive electrodes 410, 412, conductive wires 440 for electrically connecting the adjacent LED chips 402, 404 and conductive electrodes 410, 412, and light conversion coating 420 coating on at least two sides of the LED chips 402, 404 and the conductive electrodes 410, 412. The light conversion coating 420 exposes a portion of two of the conductive electrodes 410, 412. The light conversion coating 420 comprises a top layer 420a and a base layer 420b. The base layer 420b coats on one side of the LED chips 402, 404 and the conductive electrodes 410, 412. The top layer 420a coats on another sides of the LED chips 402, 404 and the conductive electrodes 410, 412.

The top layer 420a and the base layer 420b may be distinct by a manufacturing procedure of the LED filament 400a. During a manufacturing procedure, the base layer 420b can be formed in advance. Next, the LED chips 402, 404 and the conductive electrodes 410, 412 can be disposed on the base layer 420b. The LED chips 402, 404 are connected to the base layer 420b via die bond glues 450. The conductive wires 440 can be formed between the adjacent LED chips 402, 404 and conductive electrodes 410, 412. Finally, the top layer 420a can be coated on the LED chips 402, 404 and the conductive electrodes 410, 412.

Both of the top layer 420a and the base layer 420b can comprise at least one of phosphor glue layer(s), phosphor film layer(s), and transparent layer(s). If the top layer 420a or the base layer 420b comprises a transparent layer, it may comprise the other phosphor glue/film player(s). In some embodiments, the surface roughness Rz of the phosphor film layer may be 1 μm-2 mm, and the surface roughness Rz of the phosphor glue layer may be 1 1 nm-200 μm.

Each of the layers of the phosphor glue layer(s) and the phosphor film layer(s) of the top layer 420a and the base layer 420b can comprise an adhesive, phosphors, and may preferably further comprise inorganic oxide nanoparticles (optional). The transmittance of visible light of the transparent layer can be greater than 40%. The transparent layer can be formed by adhesive made of a silica gel, a silicone resin, a polyimide (PI) gel, the like or a combination thereof. The adhesive with the PI gel is harder than that formed by silicone resin only. The phosphors or the inorganic oxide nanoparticles in different phosphor glue layers or phosphor film layers can have different sizes or densities and can be made by varied materials depending on needs. Different phosphor glue layers or phosphor film layers can have varied thickness. According to the adhesive, the phosphors, the inorganic oxide nanoparticles, or other possible elements, the phosphor glue layer or phosphor film layer can have different hardness and wavelength conversion properties. The percent transmittance of the phosphor glue layer or the phosphor film layer of the top layer 420a or the base layer 420b can be varied depending on needs. For example, the percent transmittance of the phosphor glue layer or the phosphor film layer of the top layer 420a or the base layer 420b can be greater than 20%, 50%, or 70%. The layers of the top layer 420a or the base layer 420 can have different transmittance.

It should be understood that when the top layer 420a or the base layer 420b comprise continuous layers of same definition, at least one property of the continuous layers capable of being distinct from one layer to another layer should exist between the continuous layers. For example, when the two continuous layers are phosphor glue layers or phosphor film layers, the properties (e.g. particle size, wavelength conversion properties, ingredient proportion, thickness, hardness, etc.) of the continuous may be different. When the two continuous layers are transparent layers, the properties (e.g. adhesive type, thickness, ingredient proportion, optical properties like transmittance, refraction index, etc.) of the continuous transparent layers may be different.

In the embodiment, the top layer 420a is the phosphor glue layer, and the base layer 420b is the phosphor film layer. The phosphor glue layer comprises an adhesive 422, a plurality of phosphors 424, and a plurality of inorganic oxide nanoparticles 426. The adhesive 422 may be silica gel or silicone resin. The plurality of the inorganic oxide nanoparticles 426 may be, but not limited to, aluminium oxides ($Al_2O_3$). The phosphor film layer comprises an adhesive 422', a plurality of phosphors 424', and a plurality of inorganic oxide nanoparticles 426'. The compositions of the adhesives 422 and adhesive 422' may be different. The adhesive 422' may be harder than the adhesive 422 to facilitate the disposition of the LED chips 402, 404 and the conductive wires 440. For example, the adhesive 422 may be silicone resin, and the adhesive 422' may be a combination of silicone resin and PI gel. The mass ratio of the PI gel of the adhesive 422' can be equal to or less than 10%. The PI gel can strengthen the hardness of the adhesive 422'. The plurality of the inorganic oxide nanoparticles 426 may be, but not limited to, aluminium oxides ($Al_2O_3$). The size of the phosphors 424' may be smaller than that of the phosphors 424. The size of the inorganic oxide nanoparticles 426' may be smaller than that of the inorganic oxide nanoparticles 426. The size of inorganic oxide nanoparticles may be around 100 to 600 nanometers (nm). The inorganic oxide nanoparticles are beneficial of heat dissipating.

The Shore Hardness of the phosphor glue layer may be D40-70. The Shore Hardness of the phosphor film layer may be D20-70. The thickness of the phosphor film layer is substantially between 0.1 mm and 0.5 mm. The index of refraction of the phosphor film layer is substantially equal to or greater than 1.4. The percent transmittance of the phosphor film layer is substantially equal to or greater than 95%. The adhesive may be mixed with polyimide (PI) gel (WT % of the PI gel is substantially equal to or less than 10%) to form the light conversion coating 420 to improve the toughness of the light conversion coating 420 and to reduce possibility of cracking or embrittlement. The PI gel is highly electrically insulated and is insensitive to temperature. In some embodiments, the solid content of the PI gel in terms of WT % is substantially between 5% and 40%. The rotation viscosity of the PI gel may be substantially between 5 Pa·s and 20 Pa·s.

Figure 17B:
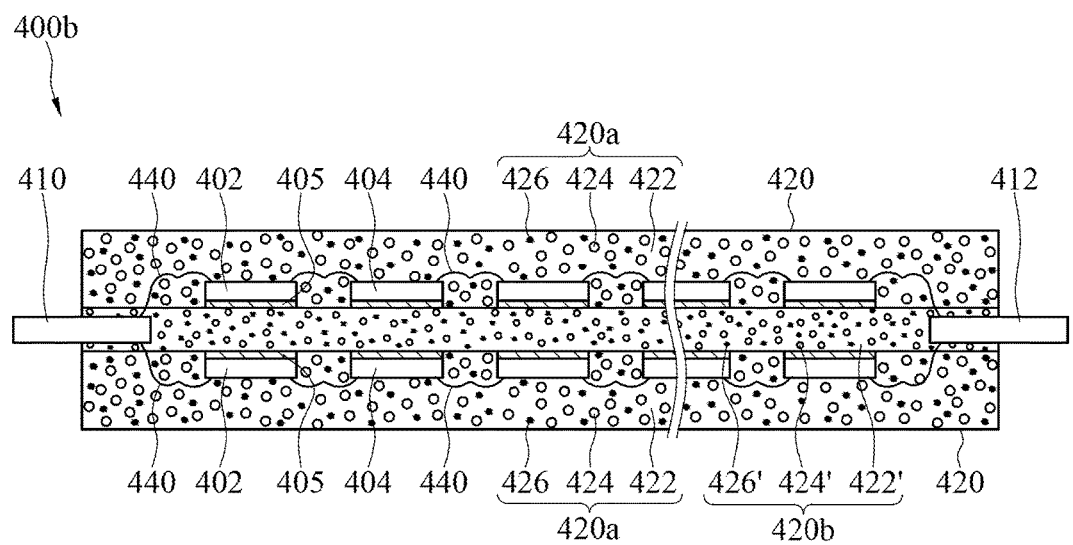

Please refer to FIG. 17B. FIG. 17B illustrates a cross-sectional view of an LED filament 400b according to an embodiment of the present disclosure. The LED filament 400b is analogous to and can be referred to the LED filament 400a. In the embodiment, the LED chips 402, 404, the conductive wires 440, and the top layer 420a are disposed on two opposite sides of the base layer 420b. In other words, the base layer 420b is between the two top layers 420a. The conductive electrodes 410, 412 are at two opposite ends of the base layer 420b. The LED chips 402 of both of the two top layers 420a can be connected to the same conductive electrodes 410, 412 via the conductive wires 440.

Figure 17C:
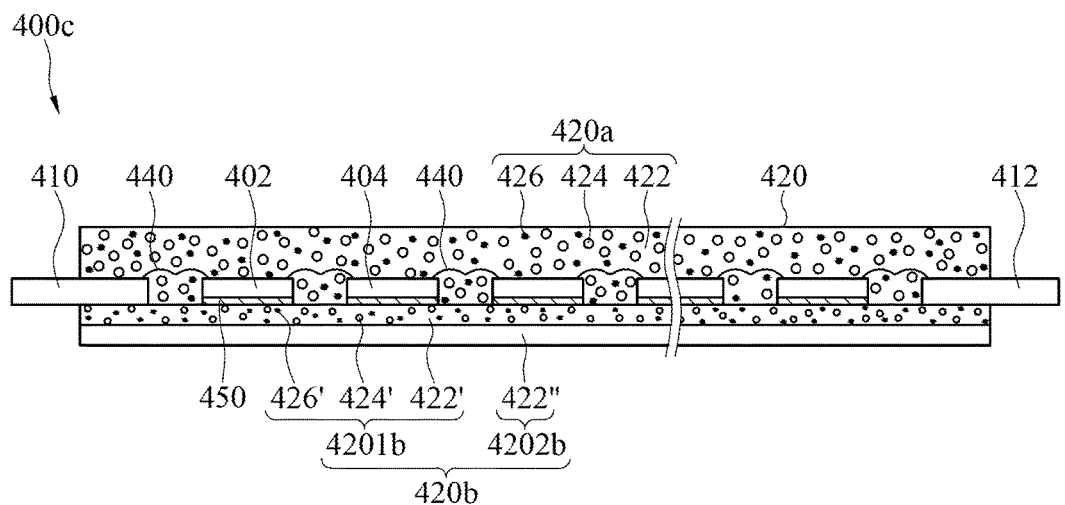

Please refer to FIG. 17C. FIG. 17C illustrates a cross-sectional view of an LED filament 400c according to an embodiment of the present disclosure. The LED filament 400c is analogous to and can be referred to the LED filament 400a. In the embodiments, the base layer 420b of the LED filament 400c is further divided into a phosphor film layer 4201b and a transparent layer 4202b with different hardness. The phosphor film layer 4201b may be harder than the transparent layer 4202b. The harder layer (i.e., the phosphor film layer 4201b) of the base layer 420b is between the softer layer (i.e., the transparent layer 4202b) of the base layer 420b and the top layer 420a. The harder layer is a layer on which the LED chips 402, 404 and the conductive electrodes 410, 412 are directly disposed. Due to the greater hardness of the harder layer, the disposition of the LED chips 402, 404, the conductive electrodes 410, 412, and the conductive wires 440 is easier. Due to the greater flexibility of the softer layer, the light conversion coating 420 is still of toughness. In the embodiment, the phosphor film layer 4201b comprises the adhesive 422' mixed with the PI gel. The transparent layer 4202b comprises an adhesive 422" only. The adhesive 422" may be silicone resin. The transparent layer 4202b may be of highest transmittance than other layers.

In some embodiment, the transparent layers can function as one or more refraction-altering layers, which can alter the index of refraction so that the angle of emergence of light rays emitted from the LED chips 402, 404, the phosphor film layer 4201b and penetrating through the transparent layer(s) is adjustable. For example, the thickness of the transparent 4202b may be ¼ wavelength of optical thickness and may be different according to the wavelength of light; therefore, interference phenomenon may occur due to multiple reflection of interfaces (e.g. interfaces between LED chip 402, 404 and the phosphor film layer 4201b, the phosphor film layer 4201b and the transparent layer 4202b, and the transparent layer 4202b and the atmosphere), and thus the reflected light may be reduced. In some embodiments, the number of transparent layers may be more than one. For example, when there are two or three transparent layers, the reflectivity may be lower. For example, when there are three transparent layers respectively with ¼, ½, and ¼ wavelength of thickness, it can bring the effect of wideband low reflection. In some embodiments, the thickness of transparent layer may be regulated according to different wavelengths of LED chips, the phosphor glue layers, the phosphor film layers within a range of the ratio to reduce the interference phenomenon. For example, the thickness of the transparent layer may be ±20% of ½-¼ wavelength. The thickness of the transparent layer may be regulated according to the inner layer thereof (e.g. LED chip, the phosphor glue layer, or the phosphor film layer). It refers to mainly regulate the waveband of emergent light that the luminous intensity is greater than 60% (preferably 80%) of the luminous intensity of total wavelength. The material of the transparent layer may be selected from materials with the index of refraction within ±20% of square root of the index of refraction of the inner layer. For example, when the index of refraction of the phosphor film layer 4201b (i.e. the inner layer of the transparent layer 4202b) is 2, the index of refraction of the transparent layer 4202b will be 1.414±20% ° Hence, loss of light reflection can be reduced efficiently.

In some embodiments, the shore hardness of the phosphor film layer 4201b equals to 40 plus the shore hardness of the transparent layer 4202b. The shore hardness of the transparent layer 4202b is D20-40.

In some embodiment, the base layer 420b may be further divided into two layers with different thickness.

Figure 17D:
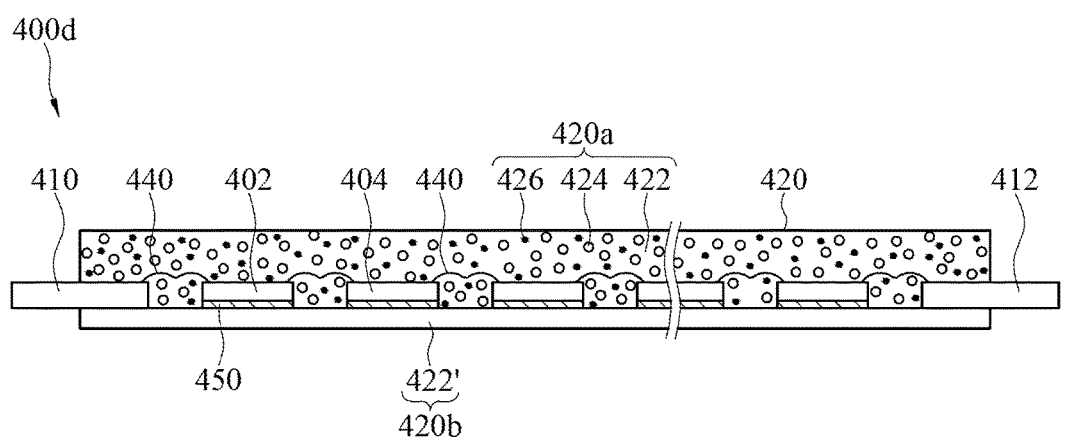

Please refer to FIG. 17D. FIG. 17D illustrates a cross-sectional view of an LED filament 400d according to an embodiment of the present disclosure. The LED filament 400d is analogous to and can be referred to the LED filament 400a. A difference between the LED filament 400d and 400a is that the base layer 420b of the LED filament 400d comprises an adhesive 422' only. The adhesive 422' may be silicone resin mixed with PI gel to increase the hardness of the base layer 420b so as to facilitate the deposition of the LED chips 402, 404, the conductive electrodes 410, 412, and the conductive wires 440. The base layer 420b may be of highest transmittance than other layers.

Figure 17E:
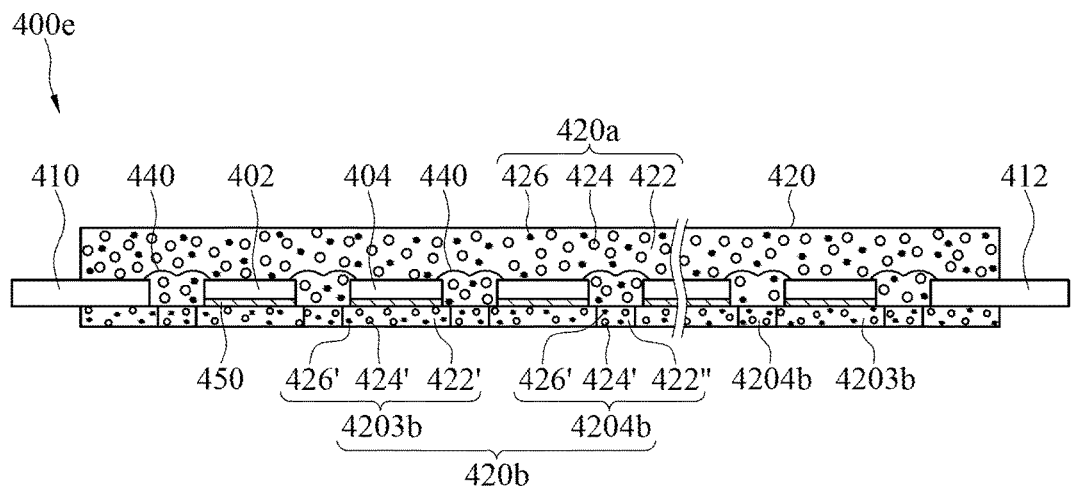

Please refer to FIG. 17E. FIG. 17E illustrates a cross-sectional view of an LED filament 400e according to an embodiment of the present disclosure. The LED filament 400e is analogous to and can be referred to the LED filament 400a. A difference between the LED filament 400e and 400a is that the base layer 420b of the LED filament 400e is divided into different portions (not layers). The base layer 420b of the LED filament 400e is divided into hard portions 4203b and soft portions 4204b. The hard portions 4203b and the soft portions 4204b are arranged in a staggered manner. The hard portions 4203b comprise an adhesive 422', phosphors 424', and inorganic oxide nanoparticles 426'. The soft portions 4204b comprise an adhesive 422", phosphors 424', and inorganic oxide nanoparticles 426'. The adhesive 422' can be PI gel or silicone resin mixed with PI gel, and the adhesive 422" can be silicone resin without PI gel; therefore, the hard portions 4203b is harder than the soft portion 4204b. The hard portions 4203b are aligned with the LED chips 402, 404 and the conductive electrodes 410, 412, which facilitates the disposition of the LED chips 402, 404 and the conductive electrodes 410, 412. The soft portions 4204b can improve the flexibility of the base layer 420b. In some embodiments (not shown), a flexible LED filament installed in an LED light bulb can be defined as, for example, three parts according to their positions related to a bulb base or a stem of the LED light bulb. A part of the flexible LED filament the closest to the bulb base or the stem is defined as a bottom segment. A part of the flexible LED filament the farthest to the bulb base or the stem is defined as a top segment. A part of the flexible LED filament between the bottom segment and the top segment is defined as a middle segment. The curvatures of shapes of each of the top segment, the middle segment, and the bottom segment being bent can be defined as, for example, three degrees, which are the highest one, the lowest one, and an average one. As needed, the bottom segment, the top segment, or the middle segment can be formed with different ingredient/proportion and thus have the different curvature.

Figure 17F:
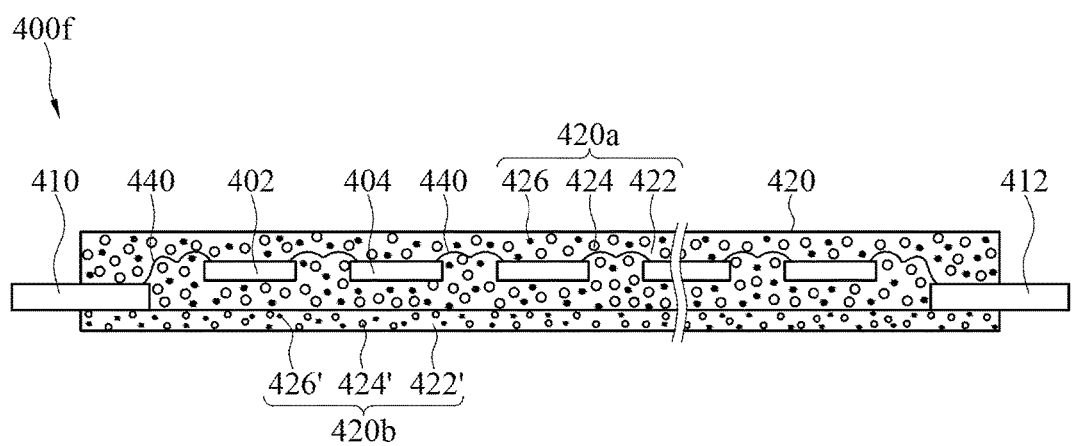

Please refer to FIG. 17F. FIG. 17F illustrates a cross-sectional view of an LED filament 400f according to an embodiment of the present disclosure. The LED filament 400f is analogous to and can be referred to the LED filament 400a. A difference between the LED filament 400f and 400a is that the LED chips 402, 404 are enclosed by the top layer 420a. The top layer 420a directly contacts each side of the LED chips 402, 404. The base layer 420b does not contact the LED chips 402, 404. During a manufacturing procedure, the base layer 420b can be formed in advance, and then the LED chips 402, 404 and the top layer 420a can be formed.

Figure 17G:
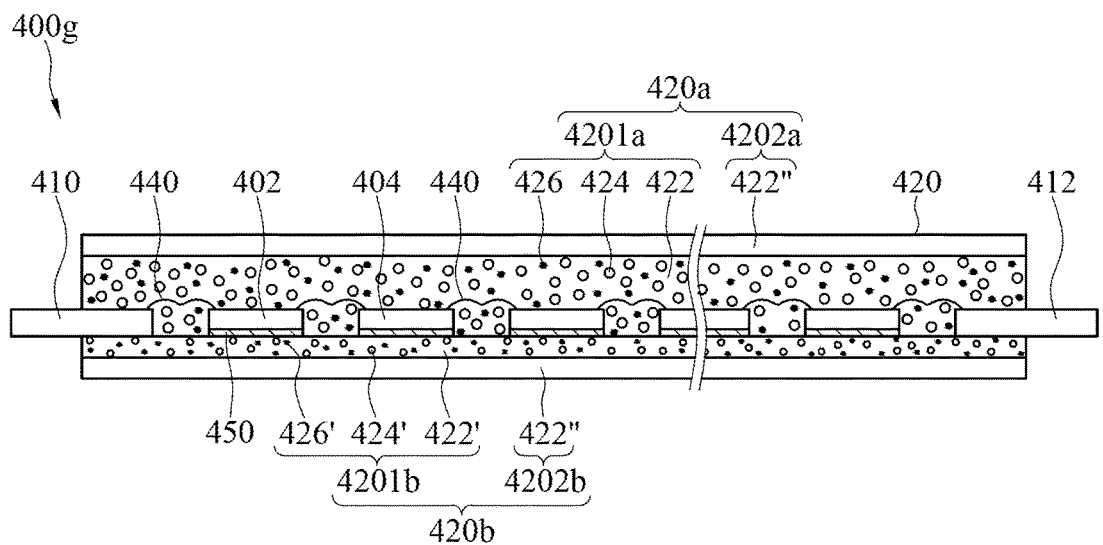

Please refer to FIG. 17G. FIG. 17G illustrates a cross-sectional view of an LED filament 400g according to an embodiment of the present disclosure. The LED filament 400g is analogous to and can be referred to the LED filament 400c. A difference between the LED filament 400g and 400c is that the top layer 420a of the LED filament 400g is further divided into two layers, a phosphor glue layer 4201a and a transparent layer 4202a. The phosphor glue layer 4201a comprises an adhesive 422, phosphors 424, and inorganic oxide nanoparticles 426. The transparent layer 4202a comprises an adhesive 422" only. The transparent layer 4202a may be of highest transmittance than other layers and can protect the phosphor glue layer 4201a. In some embodiments (not shown), the transparent layer 4202a encloses the phosphor glue layer 4201a, i.e., all sides of the phosphor glue layer 4201a except the one adjacent to the phosphor film layer 4201b are covered by the transparent layer 4202a. Additionally, the transparent layer 4202b encloses the phosphor film layer 4201b, i.e., all sides of the phosphor film layer 4201b except the one adjacent to the phosphor glue layer 4201a are covered by the transparent layer 4202b. The transparent layers 4202a, 4202b not only protect the phosphor glue layer 4201a and the phosphor film layer 4201b but also strengthen the whole structure of the LED filament. Preferably, the transparent layer 4202a, 4202b may be thermal shrink film with high transmittance.

Figure 18:
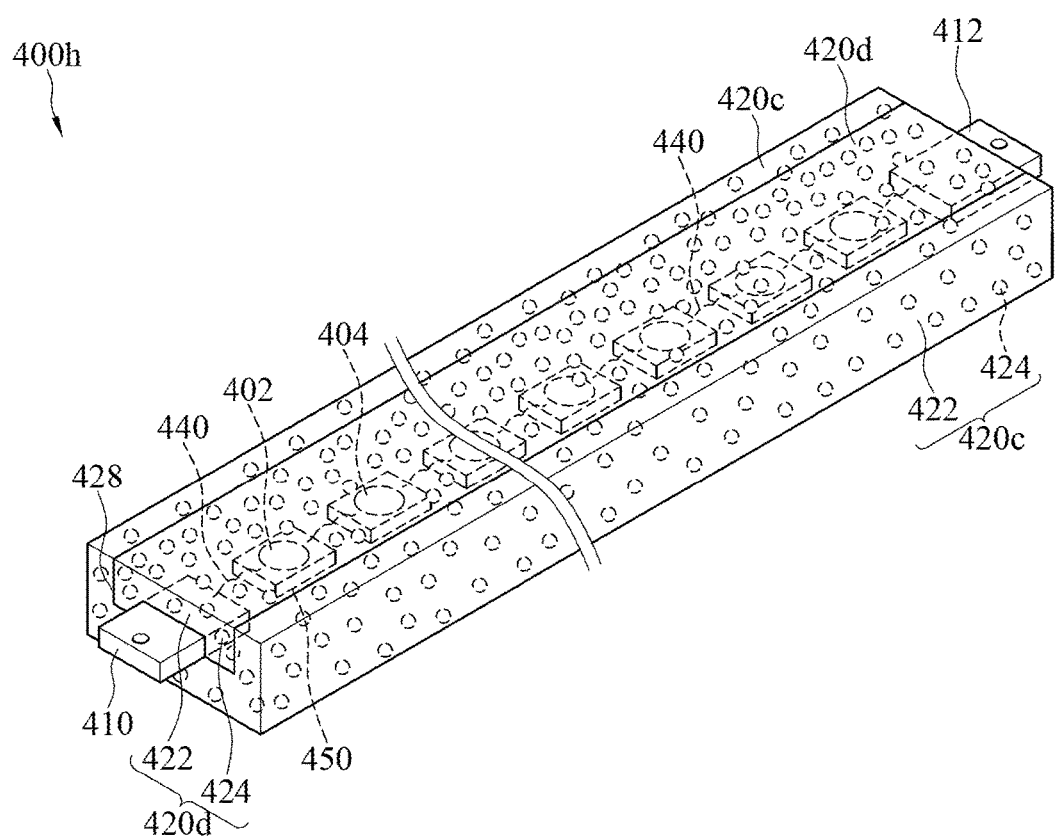
FIG. 18 illustrates a perspective view of an LED filament according to another embodiment of the present disclosure.

Please refer to FIG. 18. FIG. 18 illustrates a perspective view of an LED filament 400h according to another embodiment of the present disclosure. The LED filament 400h comprises LED chips 402, 404, conductive electrodes 410, 412, conductive wires 440 for electrically connecting the adjacent LED chips 402, 404 and conductive electrodes 410, 412, and light conversion coating 420 coating on at least two sides of the LED chips 402, 404 and the conductive electrodes 410, 412. The light conversion coating 420 exposes a portion of two of the conductive electrodes 410, 412. The light conversion coating 420 comprises a base layer 420c and a top layer 420d. The base layer 420c coats on one side of the LED chips 402, 404 and the conductive electrodes 410, 412. Furthermore, the base layer 420c is formed with a trough 428. The LED chips 402, 404 and portions of the conductive electrodes 410, 412 are disposed in the trough 428. The LED chips 402, 404 are connected to the base layer 420c via die bond glues 450. The top layer 420d is filled in the troughs 428 and coats on the other side of the LED chips 402, 404 and the conductive electrodes 410, 412. The top layer 420d comprises an adhesive 422 and a plurality of phosphors 424. The base layer 420c comprises an adhesive 422 and a plurality of phosphors 424. The mass ration of the phosphors 424 of the base layer 420c is less than that of the phosphors 424 of the top layer 420d since the base layer 420c requires a better flexibility, and the top layer 420d requires a better illuminating effect. The mass ration of the phosphors 424 of the top layer 420d is substantially between 60% and 85%. The mass ration of the phosphors 424 of the base layer 420c is substantially between 40% and 65%. In some embodiments, the conversion efficiency of the phosphors 424 of the top layer 420d is greater than that of the phosphors 424' of the base layer 420c. Under the circumstances, the top layer 420d has a better illuminating effect.

Figure 19:
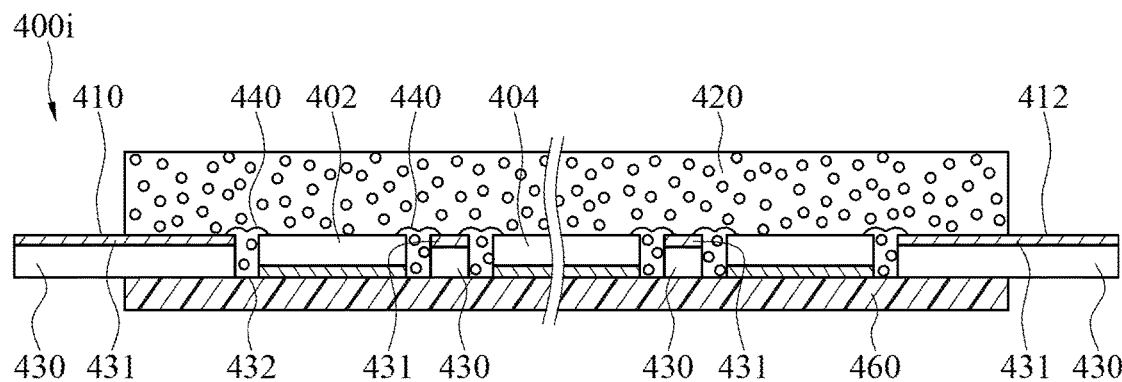
FIGS. 19 to 21 illustrate cross-sectional views of LED filament according to embodiments of the present disclosure.

Please refer to FIG. 19. FIG. 19 illustrates a cross-sectional view of an LED filament 400i according to an embodiment of the present disclosure. The LED filament 400i comprises LED chips 402, 404, conductive electrodes 410, 412 formed by two ends of a layer of conductive foil 430, conductive wires 440 for electrically connecting the adjacent LED chips 402, 404 and conductive electrodes 410, 412, light conversion coating 420 coating on at least one side of the LED chips 402, 404 and the conductive electrodes 410, 412, and an insulation substrate 460 on which the LED chips 402, 404 and conductive electrodes 410, 412 are disposed. In particular, the conductive foil 430 has a plurality of openings 432. The width of each of the openings 432 is greater than that of each of the LED chips 402, 404. The LED chips 402, 404 are individually received in the openings 432. The LED chips 402, 404 and the conductive electrodes 410, 412 are electrically connected together through conductive foil 430 and conductive wire 440. The conductive foil 430 may be, but not limited to, a copper foil coated with a silver layer 431 to increase the reflection of light.

Figure 20:
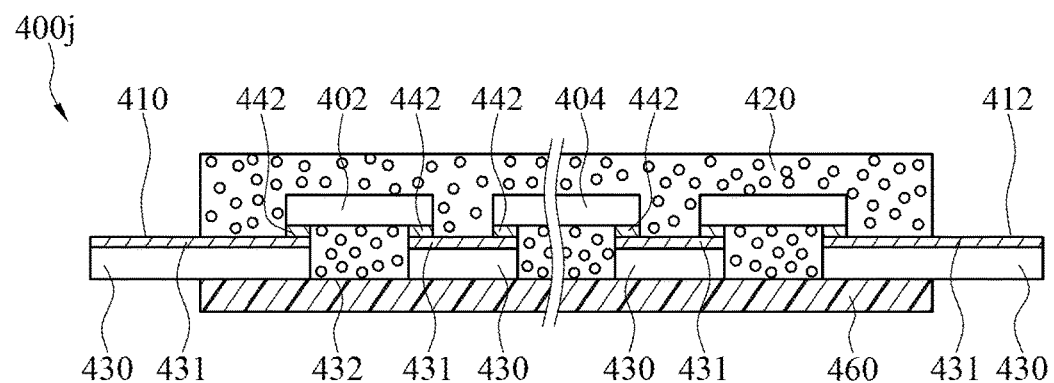

Please refer to FIG. 20. FIG. 20 illustrates a cross-sectional view of an LED filament 400j according to an embodiment of the present disclosure. The LED filament 400j can be referred to the LED filament 400i. Differences between the LED filament 400j and the LED filament 400i are that the LED chips 402, 404 of the LED filament 400j are flip chips, and the width of each of the opening 432 is less than that of each of the LED chips 402, 404. Each of the LED chips 402, 404 comprises soldering bumps 442. The LED chips 402, 404 are disposed on the conductive foil 430 respectively corresponding to the openings 432. The soldering bumps 442 of each of the LED chips 402, 404 are respectively soldered on two sides of the conductive foil 430 divided by each of the openings 432. The LED chips 402, 404 and the conductive electrodes 410, 412 are electrically connected together through conductive foil 430 without the conductive wires 440.

Figure 21:
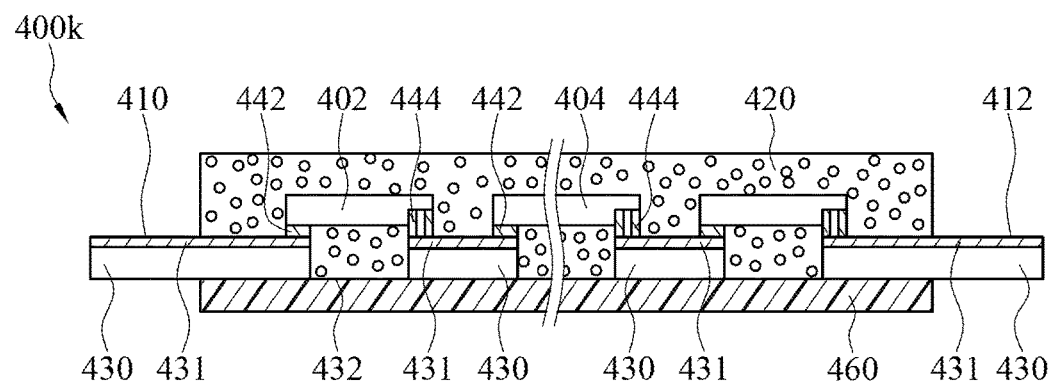

Please refer to FIG. 21. FIG. 21 illustrates a cross-sectional view of an LED filament 400k according to an embodiment of the present disclosure. The LED filament 400k can be referred to the LED filament 400j. A difference between the LED filament 400k and the LED filament 400j is that the LED chips 402, 404 of the LED filament 400k are not flip chips. Each of the LED chips 402, 404 of the LED filament 400k comprises a soldering bump 442 and an extended bump 444. The soldering bump 442 and the extended bump 444 of each of the LED chips 402, 404 reach the same elevation, meaning that the thickness of the LED chips 402, 404 in the cross-sectional view from a side with the soldering bump 442 to another side with the extended bump 444 is identical. Each of the LED chips 402, 404 of the LED filament 400k can be aligned in a upside-down position and electrically connected to the conductive foil 430 via the soldering bump 442 and the extended bump 444. The soldering bump 442 and the extended bump 444 of each of the LED chips 402, 404 are respectively soldered on two sides of the conductive foil 430 divided by each of the openings 432. The LED chips 402, 404 and the conductive electrodes 410, 412 are electrically connected together through conductive foil 430 without the conductive wires 440.

Figure 22:
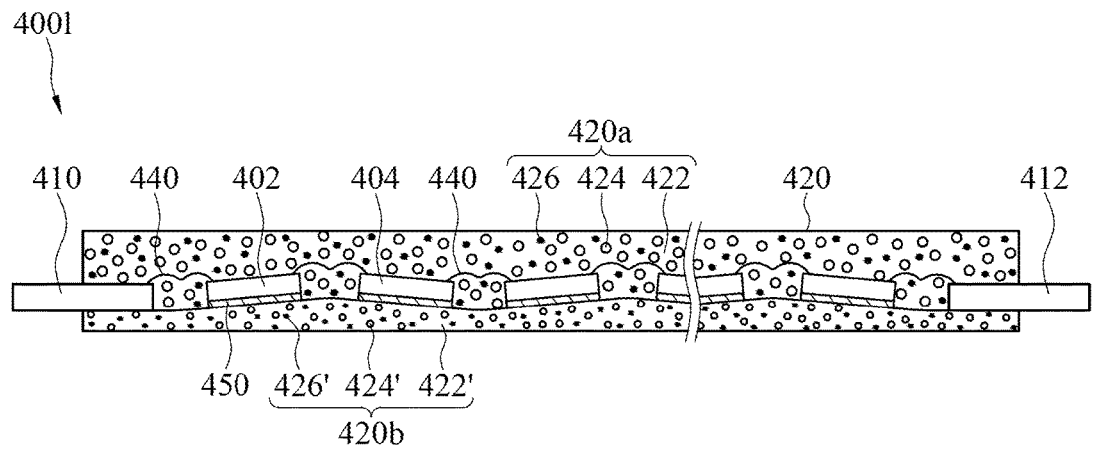

Please refer to FIG. 22. FIG. 22 illustrates a cross-sectional view of an LED filament 400l according to an embodiment of the present disclosure. The LED filament 400l can be referred to the LED filament 400a. A difference between the LED filament 400l and the LED filament 400a is regarding the alignment of the LED chips 402, 404. The LED chips 402, 404 of the LED filament 400a are aligned along a direction from the conductive electrode 410 to the conductive electrode 412 and parallel with a horizontal plane on which the base layer 420b of the LED filament 400a is laid (referring to FIG. 17A). In contrast, the LED chips 402, 404 of the LED filament 400l are not aligned along a direction from the conductive electrode 410 to the conductive electrode 412 and not parallel with a horizontal plane on which the base layer 420b of the LED filament 400l is laid (referring to FIG. 22). The LED chips 402, 404 of the LED filament 400l may respectively have different angles related to the horizontal plane. Correspondingly, the illuminating directions of the LED chips 402, 404 may be different from one another. Under the circumstances, a side of the base layer 420b of the LED filament 400l carrying the LED chips 402, 404 (or the die bond glues 450) may be not a flat plane but may be a successively concave-convex plane so that each of the LED chips 402, 404 disposed on different positions of the successively concave-convex plane have different angles, accordingly. In some embodiments, all of the LED chips 402, 404 of the LED filament 400l have angles related to the horizontal plane different from one another. Alternatively, a part of the LED chips 402, 404 of the LED filament 400l have a first angle related to the horizontal plane, and another part of LED chips 402, 404 of the LED filament 400*l* have a second angle related to the horizontal plane. In some embodiments, the first angle equals to 180 degrees minus the second angle. Additionally, the LED chips 402, 404 of the LED filament 400*l* may have different heights related to the horizontal plane. As a result, the LED filament 400*l* with the LED chips 402, 404 having different illuminating directions (different angles related to the horizontal plane) and/or different heights may generate a more even illumination, such as an omni-directional illumination.

Figure 23:
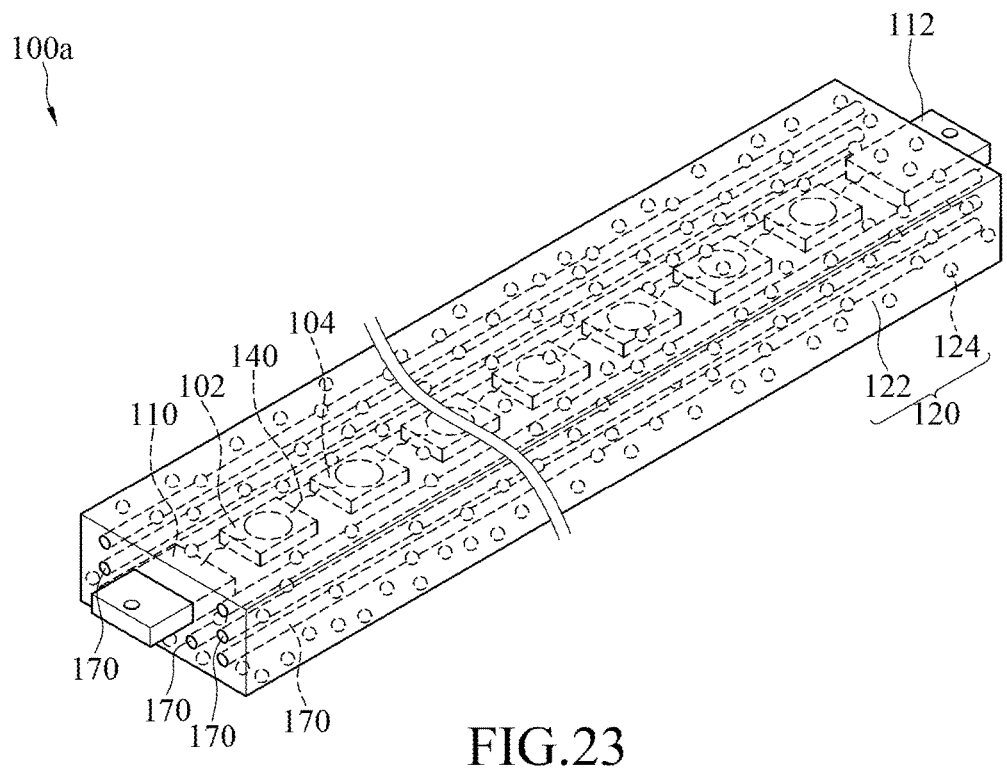
FIG. 23 illustrates a perspective view of an LED filament according to another embodiment of the present disclosure.

Please refer to FIG. 23. FIG. 23 illustrates a perspective view of an LED filament 100*a* according to another embodiment of the present disclosure. The LED filament 100*a* can be referred to the LED filament 100. A difference between the LED filament 100*a* and the LED filament 100 is that the LED filament 100*a* further comprises a plurality of copper wires 170. The copper wires 170 are enclosed by the light conversion coating 120. The copper wires 170 extend from a side of the LED filament 100*a* with conductive electrode 110 to another side of the LED filament 100*a* with conductive electrode 112. The copper wires 170 may be around the LED chips 102, 104. The copper wires 170 improve the toughness of the light conversion coating 120 and reduce possibility of damage of the conductive wires 140. In some embodiments, the copper wires could be replaced by material such as glass fiber, carbon nanotube, or the like. In some embodiments, the light conversion coating 120 comprises a top layer and a base layer. The top layer comprises phosphor glue layer(s) or phosphor film layer(s). The base layer comprises a flexible tempered glass of which a thickness is substantially 0.1-0.5 mm, a hardness is substantially 1H, and a percent transmittance is substantially equal to or greater than 90%.

While the instant disclosure related to an LED filament and LED light bulb has been described by way of examples and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims. Moreover, if any terms in this application conflict with terms used in any application(s) from which this application claims priority, or terms incorporated by reference into this application or the application(s) from which this application claims priority, a construction based on the terms as used or defined in this application should be applied.

What is claimed is:

1. A LED filament module, comprising
   a plurality of LED filaments spaced from each other, wherein each of the LED filaments comprises a first conductive electrode and a second conductive electrode opposite to the first conductive electrode;
   a first connecting portion connected with the first conductive electrodes;
   a second connecting portion connected with the second conductive electrodes;
   a plurality of filament brackets, wherein the filament brackets are connected between the first connecting portion and the second connecting portion, and each of the LED filaments is respectively attached to each of the filament brackets,
   wherein, the first connecting portion comprises insulation portions, the second connecting portion comprises insulation portions, the first connecting portion and the second connecting portion are made by conductive materials except the insulation portions, and the insulation portions of the first connecting portion and the second connecting portion are arranged in a staggered manner to allow currents to flow through each of the LED filaments in one direction.

2. The LED filament module of claim 1, wherein one or both of the first connecting portion and the second connection portion have a torus shape.

3. The LED filament module of claim 2, wherein at least one of the first connecting portion and the second connecting portion has an opening.

4. The LED filament module of claim 1, wherein while the LED filaments, the first connecting portion, and the second connecting portion are flatted, the LED filaments, the first connecting portion, and the second connecting portion form a sector outline.

5. The LED filament module of claim 4, wherein while the LED filaments, the first connecting portion, and the second connecting portion are flatted, the first connecting portion and the second connecting portion respectively have arc shapes.

6. The LED filament module of claim 5, wherein while the LED filaments, the first connecting portion, and the second connecting portion are flatted, the arc length of the arc shape of the first connecting portion is less than that of the second connecting portion.

7. The LED filament module of claim 6, wherein the LED filaments, the first connecting portion, and the second connecting portion form a shape of frustum of a cone.

8. The LED filament module of claim 1, wherein while the LED filaments, the first connecting portion, and the second connecting portion are flatted, the LED filaments, the first connecting portion, and the second connecting portion form a rectangular outline.

9. The LED filament module of claim 8, wherein while the LED filaments, the first connecting portion, and the second connecting portion are flatted, the first connecting portion and the second connecting portion respectively have straight shapes.

10. The LED filament module of claim 9, wherein while the LED filaments, the first connecting portion, and the second connecting portion are flatted, the straight length of the straight shape of the first connecting portion is substantially equal to that of the second connecting portion.

11. The LED filament module of claim 10, wherein the LED filaments, the first connecting portion, and the second connecting portion form a shape of column.

12. The LED filament module of claim 1, wherein the LED filaments, the first connecting portion, and the second connecting portion are formed in one piece.

13. The LED filament module of claim 1, wherein the LED filaments, the first connecting portion, and the second connecting portion are a jig-shaped member.

14. The LED filament module of claim 1, wherein each of the filament brackets respectively extends along an axial direction of the respective one of the LED filament.

15. The LED filament module of claim 14, wherein the filament brackets comprise materials with conductibility.

16. The LED filament module of claim 14, wherein each of the filament brackets respectively extends along the axial direction of the respective one of the LED filament from the first connecting portion to the second connecting portion.

17. The LED filament module of claim 14, wherein each of the filament brackets is separated into two parts comprising a top filament bracket and a bottom filament bracket, the top filament brackets are connected with the first connecting portion, the bottom filament brackets are connected with the second connecting portion, the length of the top filament bracket and the bottom filament bracket is less than a half of the length of the LED filament.

18. The LED filament module of claim 1, wherein the LED filaments are equally spaced or the LED filaments are unequally spaced.

19. The LED filament module of claim 14, wherein the first connecting portion and the second connecting portion are made by conductive materials, and each of the filament brackets comprises an insulation portion to prevent currents from flowing through the filament brackets.

20. The LED filament module of claim 14, wherein the first connecting portion and the second connecting portion are made by conductive materials, each of the filament brackets is separated into two parts comprising a top filament bracket and a bottom filament bracket, the top filament brackets are connected with the first connecting portion, the bottom filament brackets are connected with the second connecting portion, and the top filament bracket and the bottom filament bracket of each of the filament brackets are physically separated to prevent currents from flowing through the filament brackets.

21. The LED filament module of claim 1, wherein each of the LED filaments comprises:
   a plurality of LED chips, electrically connected together;
   two conductive electrodes, disposed corresponding to the plurality of LED chips, the conductive electrodes being electrically connected with the plurality of LED chips; and
   a flexible light conversion coating, coating on each side of the LED chips and a portion of the conductive electrodes, and exposing a portion of two of the conductive electrodes, and the light conversion coating comprising an adhesive and a plurality of particles, the plurality of particles at least comprises phosphors.

22. The LED filament module of claim 21, wherein a percentage of the particles in the flexible light conversion coating is greater than a percentage of the adhesive in the flexible light conversion coating.

23. The LED filament module of claim 22, wherein the flexible light conversion coating further comprises at least one thermal conduction path formed by at least a part of the particles which are adjacent to and contact one another, the at least one thermal conduction path has an internal end and an external end, the internal end of the at least one thermal conduction path contacts one of the LED chips, and the external end of the at least one thermal conduction path contacts the surface of the flexible light conversion coating away from the LED chips and is exposed from the surface of the flexible light conversion coating.

24. The LED filament module of claim 1, wherein each of the LED filaments comprises:
   a plurality of LED chips electrically connected together;
   two conductive electrodes disposed corresponding to the plurality of LED chips, the conductive electrodes being electrically connected with the plurality of LED chips; and
   a flexible light conversion coating comprising a top layer and a base layer, the flexible light conversion coating coating on each side of the LED chips and a portion of the conductive electrodes and exposing a portion of the conductive electrodes, the LED chips interposed between the base layer and the top layer,
   wherein the top layer comprises a first adhesive and a plurality of first particles and the base layer comprises a second adhesive and a plurality of second particles, the plurality of first particles at least comprises phosphors, and the plurality of second particles at least comprises phosphors.

25. The LED filament module of claim 24, wherein a percentage of the plurality of first particles in the top layer is greater than a percentage of the first adhesive in the top layer, and a percentage of the plurality of second particles in the base layer is greater than a percentage of the second adhesive in the base layer.

26. The LED filament module of claim 25, wherein the flexible light conversion coating further comprises at least two of the thermal conduction paths comprising a first thermal conduction path formed by at least a part of the first particles which are adjacent to and contact one another and a second thermal conduction path formed by at least a part of the second particles which are adjacent to and contact one another, the external end of the first thermal conduction path contacts a first surface of the flexible light conversion coating away from the LED chips and is exposed from the first surface of the flexible light conversion coating, the external end of the second thermal conduction path contacts a second surface of the flexible light conversion coating away from the LED chips and is exposed from the second surface of the flexible light conversion coating, the first surface and the second surface are opposite to each other, and one of first surface and the second surface is an illumination surface of the LED filament.

27. An LED light bulb, comprising:
   a bulb shell;
   a bulb base connected with the bulb shell;
   a driving circuit disposed in the bulb base;
   two conductive supports installed in the bulb shell and electrically connected to the driving circuit;
   an LED filament module installed in the bulb shell, comprising:
      a first connecting portion and a second connecting portion, the first and the second connecting portions electrically connecting to the two conductive supports both of the first connecting portion and the second connecting portion have a shape surrounding the center axle of the bulb base;
      a plurality of LED filaments, each of the LED filaments comprising a first conductive electrode and a second conductive electrode opposite to the first conductive electrode, the first conductive electrodes being connected to the first connecting portion, and the second conductive electrodes being connected to the second connecting portion; and
      a plurality of filament brackets, wherein the filament brackets are connected between the first connecting portion and the second connecting portion, and each of the LED filaments is respectively attached to each of the filament brackets,
      wherein, the first connecting portion comprises insulation portions, the second connecting portion comprises insulation portions, the first connecting portion and the second connecting portion are made by conductive materials except the insulation portions, and the insulation portions of the first connecting portion and the second connecting portion are arranged in a staggered manner to allow currents to flow through each of the LED filaments in one direction.

28. The LED light bulb of claim 27, further comprising a stand and at least one supporting arm, the supporting arms comprises a hook end and a fixed end, the hook end extends radially from the stand for connecting with one of the connecting portions, and the fixed end is embedded into the stand.

29. The LED light bulb of claim 28, further comprising at least two supporting arms and there is a gap between any two of the fixed ends of the supporting arms in the stand to keep the supporting arms being insulated from each other.

30. The LED light bulb of claim 28, wherein the hook end of the supporting arm forms a hook structure, and one of the connecting portions is hung on the hook structure of the hook end.

31. The LED light bulb of claim 30, wherein one of the connecting portions is tightly fitted in the hook structure.

32. The LED light bulb of claim 27, wherein both of the two conductive supports are connected to the second connecting portion or both of the two conductive supports are connected to the first connecting portion.

33. The LED light bulb of claim 27, wherein one of the two conductive supports is connected to the second connecting portion, and the other one of the two conductive supports is connected to the first connecting portion.

34. The LED light bulb of claim 27, wherein each of the LED filaments comprises a main illuminating face and secondary illuminating faces, the main illuminating faces of all of the LED filaments face toward outside of the LED light bulb or inside of the LED light bulb, or the main illuminating faces of a part of the LED filaments face toward outside of the LED light bulb.

35. The LED light bulb of claim 27, wherein the length of the first connecting portion is less than that of the second connecting portion.

36. The LED light bulb of claim 35, wherein the LED filament module has a shape of frustum of a cone.

37. The LED light bulb of claim 27, wherein the length of the first connecting portion is substantially equal to that of the second connecting portion.

38. The LED light bulb of claim 37, wherein the LED filament module has a shape of column.

39. The LED light bulb of claim 27, wherein each of the filament brackets respectively extends along an axial direction of the respective one of the LED filaments.

40. The LED light bulb of claim 39, wherein the filament brackets comprise materials with conductibility.

41. The LED light bulb of claim 39, wherein each of the filament brackets respectively extends along the axial direction of the respective one of the LED filaments from the first connecting portion to the second connecting portion.

42. The LED light bulb of claim 27, wherein the LED filaments are equally spaced or unequally spaced.

* * * * *